(12) United States Patent
Jannson et al.

(10) Patent No.: US 8,400,162 B1
(45) Date of Patent: Mar. 19, 2013

(54) POWER MANAGEMENT SYSTEM AND METHOD

(75) Inventors: Tomasz Jannson, Torrance, CA (US); Thomas Forrester, Hacienda Heights, CA (US); Kevin Duane Degrood, Lomita, CA (US); Kathy Mai Nguyen, Santa Ana, CA (US); Kang Lee, Woodland Hills, CA (US); Eric Gans, Los Angeles, CA (US); Kevin Carl Walter, Aliso Viejo, CA (US)

(73) Assignee: Physical Optics Corporation, Torrance, CA (US)

( * ) Notice: Subject to any disclaimer, the term of this patent is extended or adjusted under 35 U.S.C. 154(b) by 414 days.

(21) Appl. No.: 12/757,883

(22) Filed: Apr. 9, 2010

Related U.S. Application Data

(60) Provisional application No. 61/168,187, filed on Apr. 9, 2009.

(51) Int. Cl.
*G01N 27/416* (2006.01)

(52) U.S. Cl. ........................ 324/427; 320/132

(58) Field of Classification Search .............. 324/427
See application file for complete search history.

(56) References Cited

U.S. PATENT DOCUMENTS

| | | | |
|---|---|---|---|
| 5,920,179 A * | 7/1999 | Pedicini | 320/122 |
| 7,165,641 B2 * | 1/2007 | Kitamura | 180/206.2 |
| 8,005,586 B2 * | 8/2011 | Miki et al. | 701/22 |
| 2008/0074082 A1 * | 3/2008 | Tae et al. | 320/136 |
| 2009/0013311 A1 * | 1/2009 | Ooba et al. | 717/127 |
| 2009/0058367 A1 * | 3/2009 | Naik | 320/136 |

* cited by examiner

*Primary Examiner* — Arun Williams
(74) *Attorney, Agent, or Firm* — Sheppard Mullin Richter & Hampton LLP

(57) ABSTRACT

A method of monitoring battery capacity comprises determining a starting capacity of a battery; determining an activity coefficient for a device connected to the battery; determining a voltage and current profile for the battery using the starting capacity; determining a voltage and current operating point for the device using the activity value for the device; and determining an updated capacity of the battery using the voltage and current profile for the battery and the voltage and current operating point for the device.

15 Claims, 42 Drawing Sheets

Table 1. Harvesting Time x Area (HTA) Product for Various Illuminations and Low Power Wireless Electronics

| Type of Illumination | Solar | | Indoor Illumination |
|---|---|---|---|
| | Direct | Cloudy | |
| Optical Intensity, $J_R$ | 100 mW/cm$^2$ | 23 mW/cm$^2$ | 1 mW/cm$^2$ |
| Solar Cell Photovoltaic Efficiency $\eta_{ph}$=33% *) | 30% | 30% | 30% |
| "Electrical Intensity," $J_{el}$ | 30 mW/cm$^2$ | 7 mW/cm$^2$ | 0.3 mW/cm$^2$ |
| Harvesting Time x Area (HTA) Product: $A_H \cdot t_A$ | 22 min · cm$^2$ | 1.6 h · cm$^2$ | 37.3 h · cm$^2$ |
| Harvesting Time, $t_H$, for $A_H$=6 cm$^2$ | 3.7 min | 16 min | 6.21 h |

*) Including Ohmic loss of 10%

*Fig. 30*

Table 2. View-Factor vs. U-Parameter

| U | 0.5 | 1 | 2 | 5 | 7 | 10 | 20 |
|---|---|---|---|---|---|---|---|
| $F_{12}$ | 0.236 | 0.414 | 0.618 | 0.82 | 0.867 | 0.905 | 0.951 |

*Fig. 32*

Table 3. Harvesting Areas for Various Types of Radiation, and $<P_c> = 10$ mW, Including Two Photopic Efficiencies: 30% and 12.6% *)

| Type of Radiation | Solar | | Indoor Illumination | Infrared (IR) Radiation | | |
|---|---|---|---|---|---|---|
| | Direct | Cloudy | | $\Delta T = 10°C$ | $\Delta T = 5°C$ | $\Delta T = 1°C$ |
| Photopic Efficiency *) (33%) | 30% | 30% | 30% | N/A | N/A | N/A |
| Electrical Intensity, $J_{el}$ | 30 mW/cm$^2$ | 7 mW/cm$^2$ | 0.3 mW/cm$^2$ | 0.67 mW/cm$^2$ | 0.34 mW/cm$^2$ | 0.068 mW/cm$^2$ |
| Harvesting Area, $A_H$, for $<P_T> = 10$ mW | 1.27 cm$^2$ | 5.43 cm$^2$ | 127 cm$^2$ | 44.8 cm$^2$ | 88.2 cm$^2$ | 441 cm$^2$ |
| Quadratic size: $\sqrt{A_o} \times \sqrt{A_o}$ | 1.13 cm × 1.13 cm | 2.33 cm × 2.33 cm | 11 cm × 11 cm | 6.7 cm × 6.7 cm | 9.4 cm × 9.4 cm | 21 cm × 21 cm |
| Photopic Efficiency *) (14%) | 12.6% | 12.6% | 12.6% | | | |
| Electrical Intensity, $J_{el}$ | 12.6 mW/cm$^2$ | 2.9 mW/cm$^2$ | 0.126 mW/cm$^2$ | Same as above | | |
| Harvesting, Area, $A_H$, for $<P_c> = 10$ mW | 3.0 cm$^3$ | 12.8 cm$^3$ | 294 cm$^3$ | | | |

*) Including Ohmic loss

*Fig. 33*

Table 4. Comparison of Electrical Powers Obtained from: Solar,
Optical (Illumination),
Thermal and Mechanical Harvesting Energies

| No. | Type of Harvesting Energy | $J_{el}$ | Electrical Power |
|---|---|---|---|
| 1 | Solar, Direct | 30 mW/cm$^2$ | 180 mW *) |
| 2 | Solar Cloudy | 7 mW/cm$^2$ | 42 mW *) |
| 3 | Optical (Indoor Illumination) | 0.3 mW/cm$^2$ | 1.8 mW *) |
| 4 | Thermal (10°C Gradient) | 0.67 mW/cm$^2$ | 4 mW **) |
| 5 | Mechanical | N/A | 34 mW |

*) For 6 cm$^2$ – watch-like packaging

**) $A_H$ = 6 cm$^2$ – Harvesting area

*Fig. 36*

Table 5. Summary of (SMTBR) – Values for Various $I_O$ and $<I_S>$, Assuming $k = 1.37 \cdot 10^{-4}$, and Primary Battery with Specific Latent Charge of 100 mA·h/g and $b = 0.005$, $a = 0.005/mo.$, and $g = 0.01$ (SMTBR) – Values are in Days/Gram of Battery Mass

| $I_O$ \ $<I_S>$ | 50 mA | 100 mA | 150 mA | 200 mA | 300 mA | 400 mA | 500 mA | 600 mA | 800 mA | 1A | 1200 mA | 1400 mA |
|---|---|---|---|---|---|---|---|---|---|---|---|---|
| 30 µA | 97.4 | 84.3 | 74.0 | 65.7 | 53.9 | 45.7 | 39.6 | 35.0 | 28.0 | 24.0 | 21.1 | 18.1 |
| 50 µA | 66.4 | 59.7 | 54.2 | 49.9 | 42.6 | 37.4 | 33.5 | 29.9 | 24.9 | 21.4 | 18.7 | 16.6 |
| 70 µA | 50.2 | 46.2 | 42.9 | 40.2 | 35.3 | 31.7 | 28.6 | 26.1 | 22.2 | 19.3 | 17.1 | 15.4 |
| 100 µA | 36.5 | 34.7 | 32.6 | 31.0 | 28.1 | 25.7 | 23.7 | 21.9 | 19.1 | 17.0 | 15.2 | 13.8 |
| 150 µA | 25.4 | 24.3 | 23.4 | 22.5 | 20.9 | 19.6 | 18.4 | 17.3 | 15.5 | 14.1 | 12.8 | 11.8 |
| 200 µA | 19.4 | 18.8 | 18.2 | 17.7 | 16.7 | 15.8 | 15.0 | 14.3 | 13.0 | 12.0 | 11.1 | 10.3 |
| 300 µA | 13.2 | 12.9 | 12.6 | 12.3 | 11.9 | 11.4 | 11.0 | 10.6 | 10.0 | 9.3 | 8.7 | 8.3 |
| 500 µA | 8.0 | 7.9 | 7.8 | 7.7 | 7.5 | 7.3 | 7.2 | 7.0 | 6.7 | 6.4 | 6.1 | 5.9 |

Fig. 38

POWER MANAGEMENT SYSTEM AND METHOD

CROSS-REFERENCE TO RELATED APPLICATIONS

This application claims the benefit of U.S. Provisional Application No. 61/168,187 filed Apr. 9, 2009, which is hereby incorporated herein by reference in its entirety.

TECHNICAL FIELD

The present invention relates generally to battery powered devices, and more particularly, some embodiments relate to power management of battery powered devices.

DESCRIPTION OF THE RELATED ART

The fact that the measurement space is quantized, has been known even before the Heisenberg uncertainty principle was introduced. In other words, the fact that a measured quantity can be determined only with limited accuracy has been known before the arrival of quantum mechanics. The quantization of measurement space is an unavoidable consequence of limited accuracy of any measurement. Moreover, the negantropic cost of any measurement is also unavoidable; any measurement causes entropy increase of the measurement system. Higher measurement precision requires higher negantropic cost. This unavoidable quantization of measurement space has been well explained by L. Brillouin, in his fundamental monography: "Science and Information Theory," Academic Press, 1956.

The power cost of digital electronics is very often ignored, or considered as the secondary-importance-factor. Even in the case of battery-based self-powered electronic systems, such as wireless phones, PDAs (personal digital assistants), smart phones, or MIDs (mobile internet devices), the electrical power budget analysis is typically given significantly less consideration than the analogous optical power budget analysis in the case of optical systems. Even if the power cost is taken into account, it is often difficult to properly apply to system design. Battery specifications are often given in terms such as power density or energy density related to the battery's chemical properties. The battery's characteristics that are relevant a battery system parametric analysis for a powered device are difficult to determine on a specific basis. Rather, battery life is typically given as a broad and often inaccurate estimate based on numerous generic assumptions.

BRIEF SUMMARY OF EMBODIMENTS OF THE INVENTION

According to various embodiments of the invention, systems and methods are provided to allow increased accuracy in measurement of battery characteristics such as battery capacity. Theses methods allow the development of a variety of electronic devices, such as deployable sensor nodes, personal information carriers, security tags, object tracking devices, security gateways, and distributed wearable computers.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

FIG. 30 is a table presenting energy characteristics for various light types for use in energy harvesting implemented in accordance with an embodiment of the invention.

FIG. 32 is a table presenting view factor and U-parameter data for use in energy harvesting implemented in accordance with an embodiment of the invention.

FIG. 33 is a table presenting various harvesting areas for various types of radiation for use in energy harvesting implemented in accordance with an embodiment of the invention.

FIG. 36 is a table comparing various types of energy harvesting for use in energy harvesting implemented in accordance with an embodiment of the invention.

FIG. 38 is a table presenting specific mean time between recharges for various battery parameters.

Figure 1:
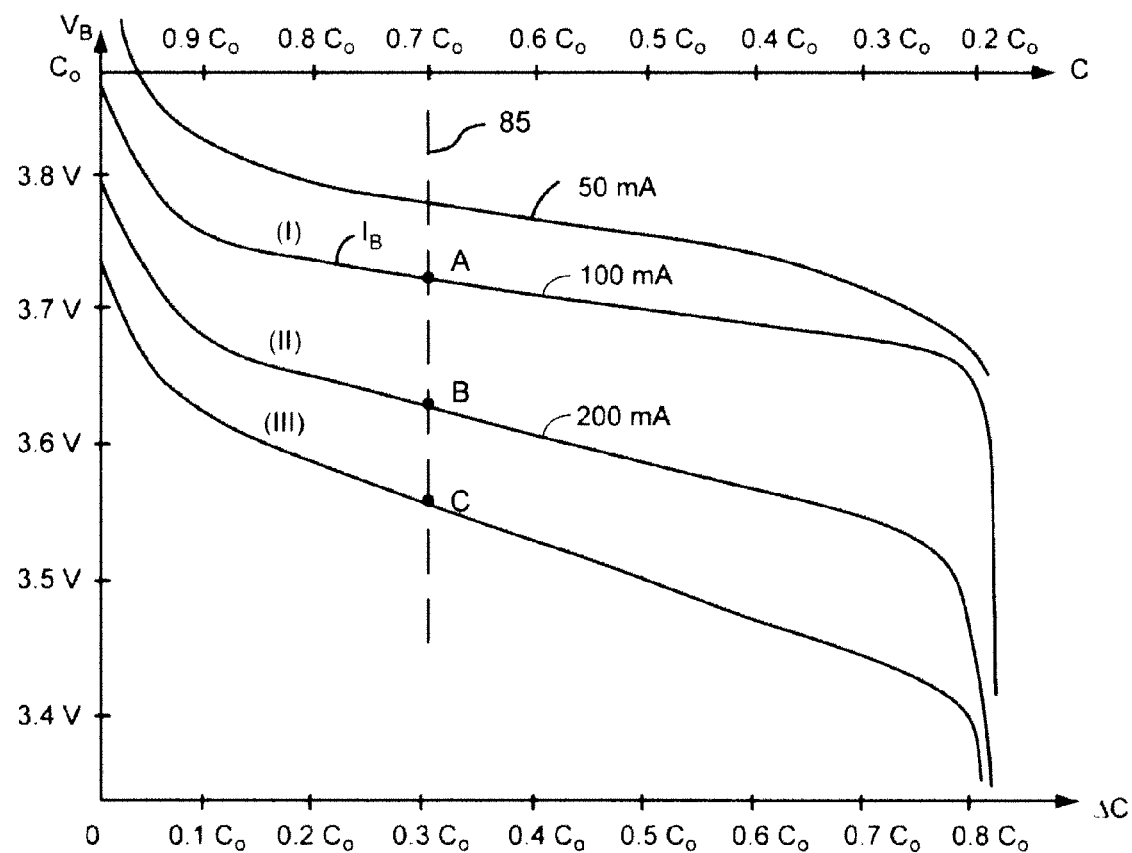
FIG. 1 is a graph of a typical secondary battery's voltage, V, as a function of battery capacity, C, and $\Delta C$, for different discharge currents.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

Some embodiments of the present invention are directed towards systems and methods for determining the remaining amount of latent charge available to a self-powered device during its operation. Further embodiments of the invention are directed toward systems and methods for determining power supply characteristics and configurations for self-powered according to the predicted latent charge profiles of the self-powered device.

In accordance with various embodiments of the invention, a battery's latent charge, Q, is the total charge that can be effectively extracted from a battery before it shuts off, for example to avoid damage caused by deep discharge. The point at which a battery shuts off or stops working may be described by a battery shut-off parameter g. The battery then shuts off or stops working when its capacity, $C_0$, is reduced to the value $gC_0$. For typical secondary (rechargeable) batteries, $g \approx 0.2$ (the battery shuts off at about 20% of its original capacity). For typical primary (non-rechargeable) batteries, $g \approx 0.01$. Accounting for g, the latent charge on a battery is:

$$Q = C_0 - gC_0 = (1-g)C_0$$

However, many batteries, particularly secondary batteries, have fast initial discharge rates. This rate can be described by a parameter, b, describing the amount of discharge in the first 24 h without a load on the battery. For a typical secondary battery, $b \approx 0.05$ (at 25° C.). Accordingly, for the typical secondary battery, after 2 h the battery's capacity is reduced from its initial capacity $C_0$ to $0.95C_0$. For a primary battery, the value of b is typically much lower, for example $b \approx 0.005$. If the first 24 h period of the fast self-discharge is ignored, the latent charge on a battery is $$Q = C_0(1-b) - gC_0 = C_0[1-(g+b)]. \quad (1)$$

In additional to the fast initial discharge rates, batteries have a slower self-discharge rate after the initial fast period. This rate may be described by the percent reduction in charge per month, a. For instance, typical secondary batteries self discharge about 5% per month, so a=0.05/mo. For primary batteries, the a parameter is typically much smaller, for example a=0.005/mo.

These parameters may be used to generate a basic formula describing battery shelf life, $t_B$, defined by the batteries life when self-discharging only. The shelf life $t_B$ may be defined from the exponential temporal Beer's law:

$$C(t_B) = gC_o = (1-b)C_o e^{-at_B}; \Rightarrow t_B = \frac{1}{a}\ln\left(\frac{1-b}{g}\right) \quad (2)$$

where the first 24 h period has been ignored. Assuming, for a typical secondary battery: b=0.05, a=0.05/mo, and g=0.2, $t_B$=31 mo, while for a typical primary battery (b=0.005, a=0.005/mo., g=0.01), $t_B$=76 years.

Additionally, in some cases the self-discharge parameters vary according to temperature. For instance, a typical secondary battery may have a monthly self-discharge rate, a, that doubles for each 10° C. temperature increase from its normal value (here, 25° C.); i.e., when temperature increases from $T_o$=273+25° C.=298 K, to T=308 K; then, the value of a increases from $a_o=a(T_o)$ to $2a_o$; and then from $a_o$ to $3a_o$ for $\Delta T=20$ K. The general formula, is $$a(T) = a_0 2^{(0.1)(T-T_0)} \quad (3)$$

For example, for $a_0=0.05$/mo, and $T-T_o=15°$ C.: $a=2.8$ and $a_0=0.14$/mo; i.e., by increasing temperature from 25° C. to 40° C., the value of a increases from 5% per month to 14% per month. Of course, these parameters may vary for different battery types, for example a may not exactly double with each 10° C. increase, or a may not display the behavior of Eq. (3) throughout the temperature scale to which some embodiments will be subjected. However, for purposes of simplicity the temperature dependence illustrated in Eq. (3) will be assumed throughout this disclosure.

Applying a similar formalism to that of Beer's law, the basic battery self-discharge law in the time domain is as follows:

$$-\frac{\Delta C}{C} = a\Delta t; \, a = a(t, T) \quad (4)$$

where, in general, the a coefficient is not only a function of temperature T, but also of time t. The self-discharge current $I_D$, is $$I_D(t) = -\frac{\Delta C}{\Delta t} = aC(t) \quad (5)$$

where a(t) can also be a slowly varying function of t, and the maximum value is $$(I_D)_{max} = aC_0 = 0.95 C_0 \quad (6)$$

while the capacity reduction, $\Delta C$, is $$\Delta C = C_0 - C_0 a \Delta t \quad (7)$$

where $\Delta t$ is the time decrement.

In accordance with one embodiment of the invention, certain assumptions about the operational parameters of some devices and power supplies may be made. One such assumption is termed the constant current conjecture (C3). The C3 is based on the assumption that in the case of good-performance digital device, the current drawn from the battery for a device, $I^{(i)}$, where the index describes ith device powered by the battery, can be considered constant during the majority of the operation time. In this case:

$$I(i) = \text{CONSTANT} \quad (8)$$

Then, it is convenient to describe a battery by its capacity, $C_O$, as shown in Eqs. (1)-(7). In such a case, assuming Eq. (8), the latent charge, Q, as defined by Eq. (2), can be described as sum of the charges drawn from the battery by respective currents:

$$Q = t^{(1)} I^{(1)} + t^{(2)} I^{(2)} + \ldots = \sum_{i=1}^{N} t^{(i)} I^{(i)} \quad (9)$$

where $t^{(i)}$ is the time when the current was drawn. However, each time, $t^{(i)}$ can be presented in terms of a fraction of the total operating time, t, $$t^{(i)} = \left(\frac{t^{(i)}}{t}\right) \cdot t = k^{(i)} \cdot t \quad (10)$$

where $k^{(i)}$ is the coefficient defining the fraction of total operating time when the ith-device is used. Substituting Eq. (10) into Eq. (9), $$Q = t \sum_{i=1}^{N} k^{(i)} I^{(i)} = t \sum_{i=1}^{N} \langle I^{(i)} \rangle \quad (11)$$

where $\langle I^{(i)} \rangle$ is the mean current of the ith-device, which is the current value uniformly distributed over total time duration. Adding a current representing self-discharge, as in Eq. (5), Eq. (11) becomes $$Q = t \sum_{i=1}^{N} \langle I^{(i)} \rangle + t \langle I_D \rangle \quad (12)$$

and the mean time between recharges (MTBR), is $$t = (MTBR) = \frac{Q}{\langle I_D \rangle + \sum_{i=1}^{N} I^{(i)} k^{(i)}} \quad (13)$$

In some embodiments, certain devices may have continuous power requirements, for example a radio receiver that is continuously during operation. Representing these always-on devices' current as $I_s$, Eq. (13) becomes $$(MTBR) = \frac{Q}{I_s + \langle I_D \rangle + \sum_{i=1}^{M} I^{(i)} k^{(i)}} \quad (14)$$

where $M=N-1$. Dividing the nominator and denominator by $I_s + \langle I_D \rangle$, $$(MTBR) = \frac{\langle t_{so} \rangle}{1 + \sum_{i=1}^{M} \frac{k^{(i)}}{\langle k_o^{(i)} \rangle}} \quad (15)$$

where $\langle t_{so} \rangle$ has the following form:

$$\langle t_{so} \rangle = \frac{Q}{I_s + \langle I_D \rangle} \quad (16)$$

and $$\langle k_o^{(i)} \rangle = \frac{I_s + \langle I_D \rangle}{I_o^{(i)}} \quad (17)$$

Figure 2:
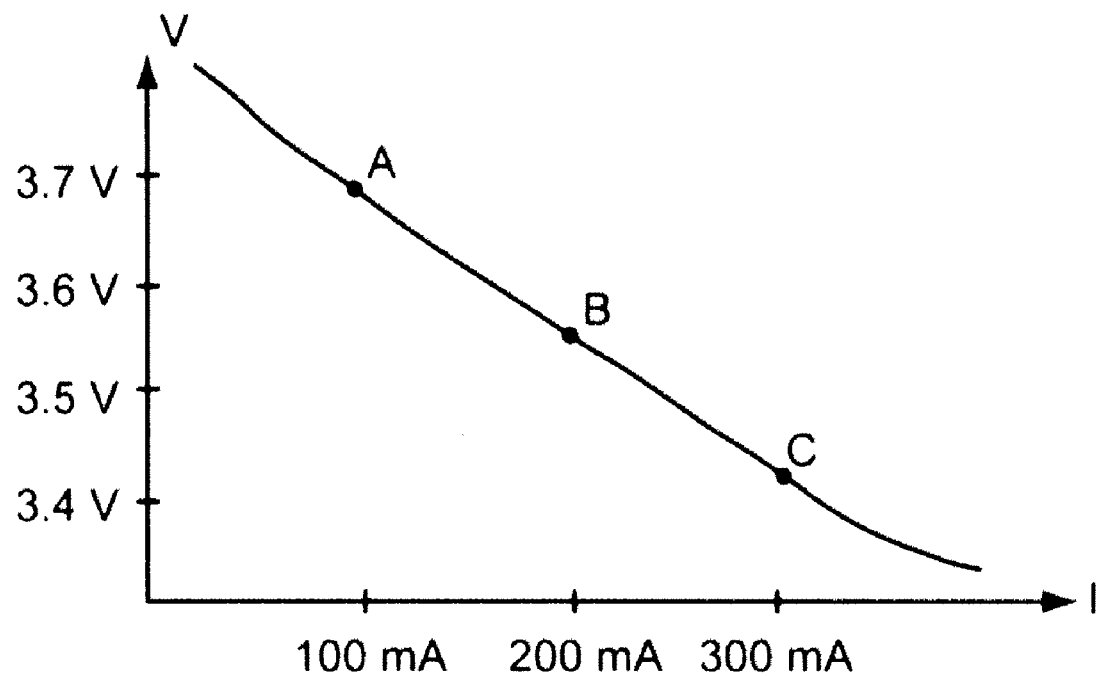
FIG. 2 is a graph plotting the voltage and current characteristics of a constant time line from FIG. 1.

In further embodiments, power management or charge monitoring on a battery powered device may employ battery models where current is not assumed to be constant. For example, FIG. 1 is a graph of a typical secondary battery's voltage, V, as a function of battery capacity, C, and $\Delta C$, for different discharge currents: 50 mA, 100 mA, 200 mA, and 300 mA. Considering a given value of battery capacity, $$C=C(t) \quad (18)$$

for a fixed time, t, results in a vertical line through the range of voltage/current profiles. FIG. 2 is a graph plotting the voltage and current characteristics of the constant time line 85 from FIG. 1. Points A, B, and C from FIG. 1 are indicated on FIG. 2. As these graphs illustrated, the overall battery characteristics, as in FIG. 1, are equivalent to a family of voltage-current characteristics, each for a specific value of C.

Figure 3:
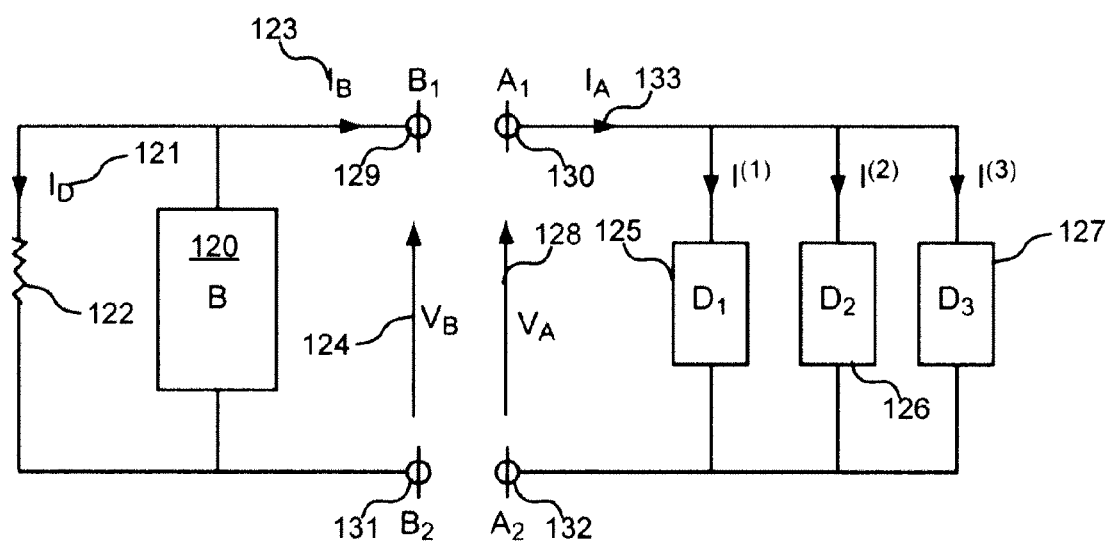
FIG. 3 illustrates a plurality of electrical devices powered by a common power supply implemented in accordance with an embodiment of the invention.

FIG. 3 illustrates a plurality of electrical devices 125, 126, and 127 powered by a common power supply 120 implemented in accordance with an embodiment of the invention. In this example embodiment, devices 125, 126, and 127 are connected in parallel, however in other embodiments, other arrangements are possible. When points $B_1$ 129 and $A_1$ 130 (and $B_2$ 131 and $A_2$ 132) are connected, devices, $D_1$ 125, $D_2$ 126, $D_3$ 127 start to draw current, $I_A$ 133, from the battery B 120. In general, these currents and voltages are functions of time. Combined, they have an overall current-voltage characteristic:

$$I_A=I_A(V_A) \quad (19)$$

Figure 4B:
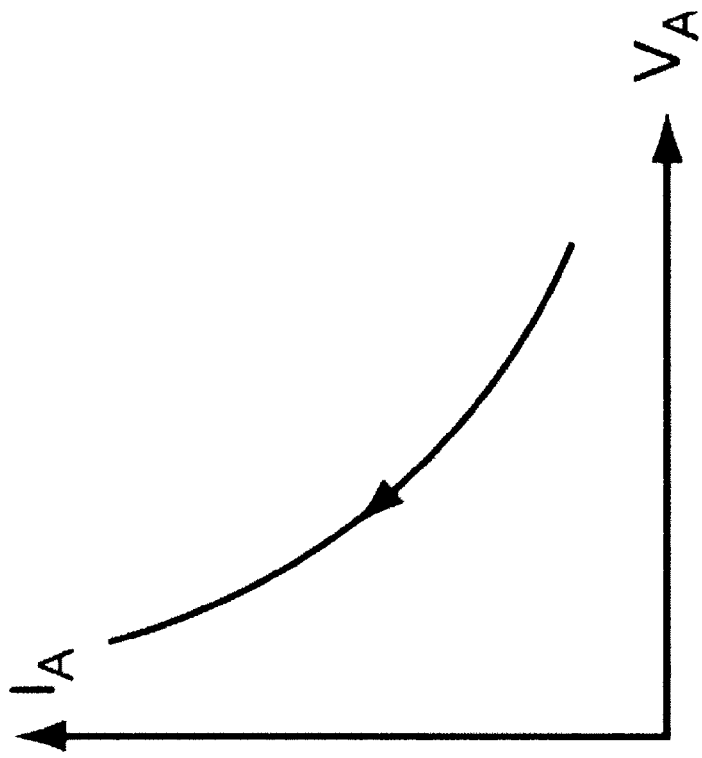
FIG. 4 illustrates two current-voltage characteristic profiles in accordance with an embodiment of the invention.
Figure 4A:
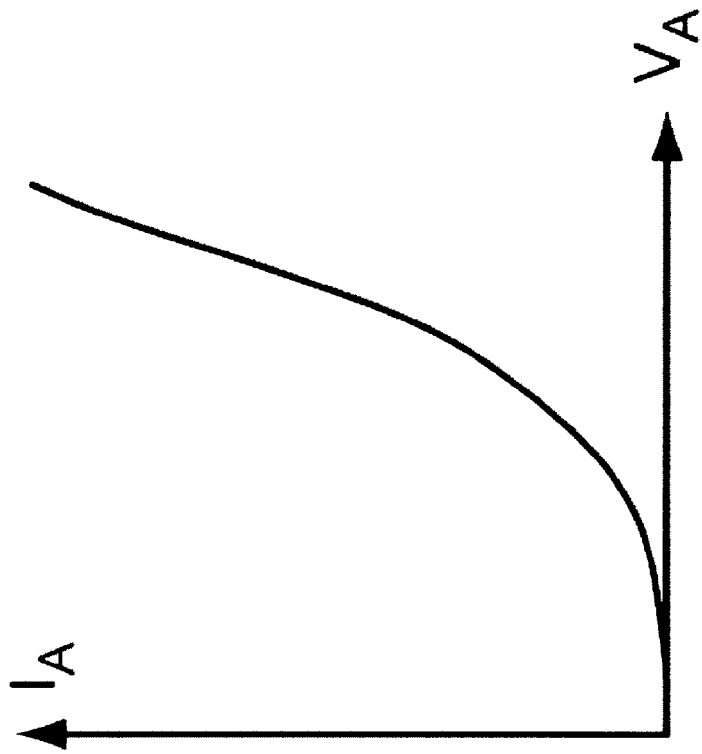

FIG. 4 illustrates two profiles illustrating such current-voltage characteristics. FIG. 4A illustrates a typical profile for a plurality of devices without a current limiter. FIG. 4B illustrates a typical profile for digital devices with current/voltage regulators.

Figure 5:
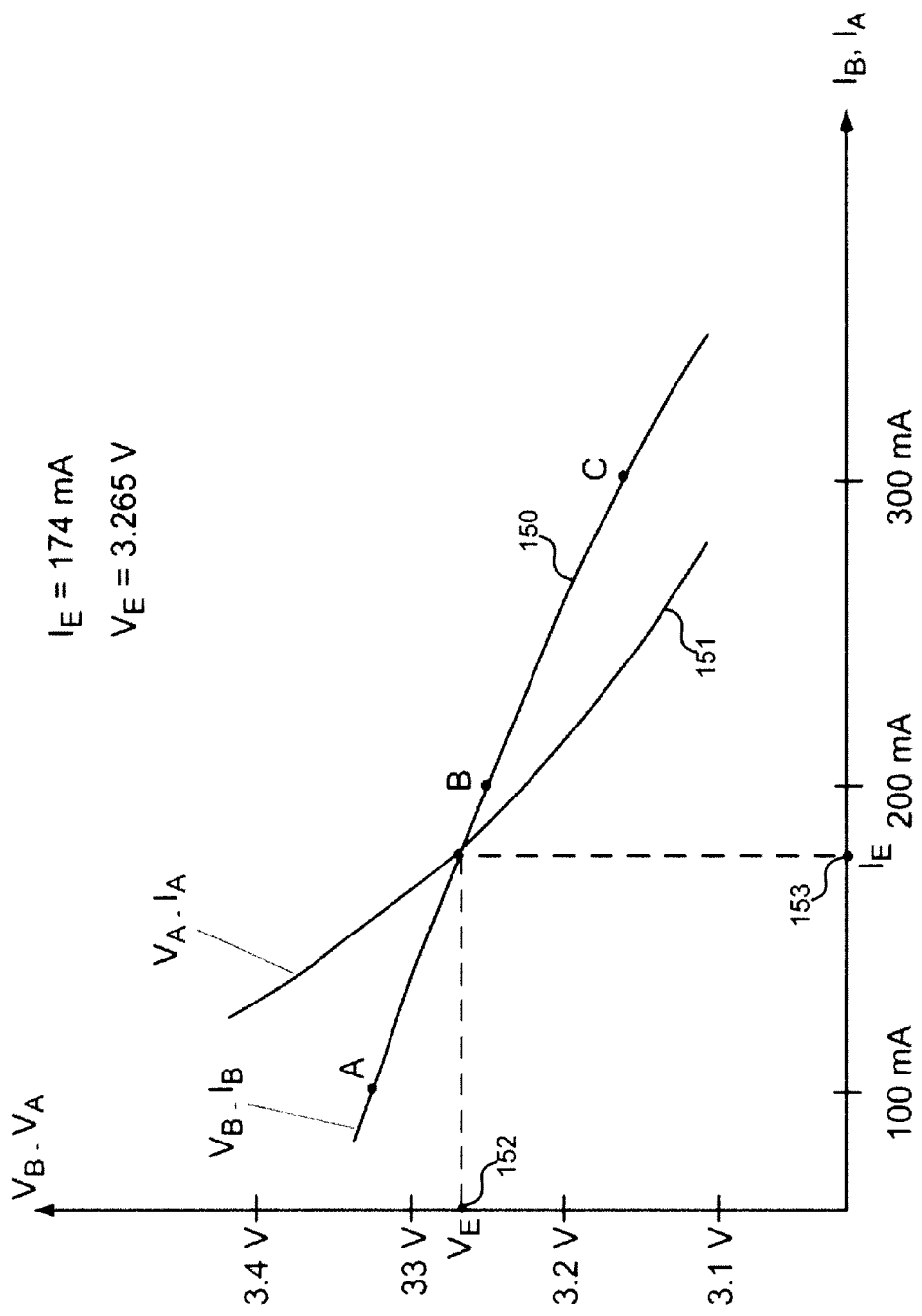
FIG. 5 illustrates a current-voltage characteristic matching situation in accordance with an embodiment of the invention.

When a group of electrical devices are connected to a battery with a capacity C, the voltage/current characteristics of the battery, as illustrated by FIG. 2, will match those of the connected group of electrical devices, as illustrated by FIG. 4. FIG. 5 illustrates this situation, curve 150 illustrates the voltage-current curve of battery 120 while curve 151 illustrates the voltage-current curve of devices 125, 126, and 127. When connected, the operating point $I_E$, $V_E$ is the intersection point between the two curves. The following matching conditions are satisfied by this intersection:

$$I_A=I_B=I_E \quad (20)$$

$$V_A=V_B=V_E.$$

In some embodiments of the invention, methods of battery capacity monitoring are performed using an iterative approach. In this iterative method, the battery capacity at a first time is determined, and the battery capacity at a next time increment is determined according to the charge used during the intervening time increment. The iterative equation has the following from:

$$C_i = C_{i-1} - C_{i-1}a_{i-1}\Delta t - \sum_j \varepsilon_{i-1}^{(j)} I_{i-1}^{(j)} \Delta t$$

where $\Delta t$ is the time increment, $I_i^j$ is the current used by the jth device during the ith time interval, and $\varepsilon_i^j$ is the jth device's activity coefficient described in more detail below. Assuming for simplicity that there are three devices connected to the battery power supply, the iterative equation has the following form:

$$C_i=C_{i-1}-\varepsilon_{i-1}^{(1)}I_{i-1}^{(1)}\Delta t-\varepsilon_{i-1}^{(2)}I_{i-1}^{(2)}\Delta t-\varepsilon_{i-1}^{(3)}I_{i-1}^{(3)}\Delta t-C_{i-1}a_{i-1}\Delta t. \quad (21)$$

Figure 6:
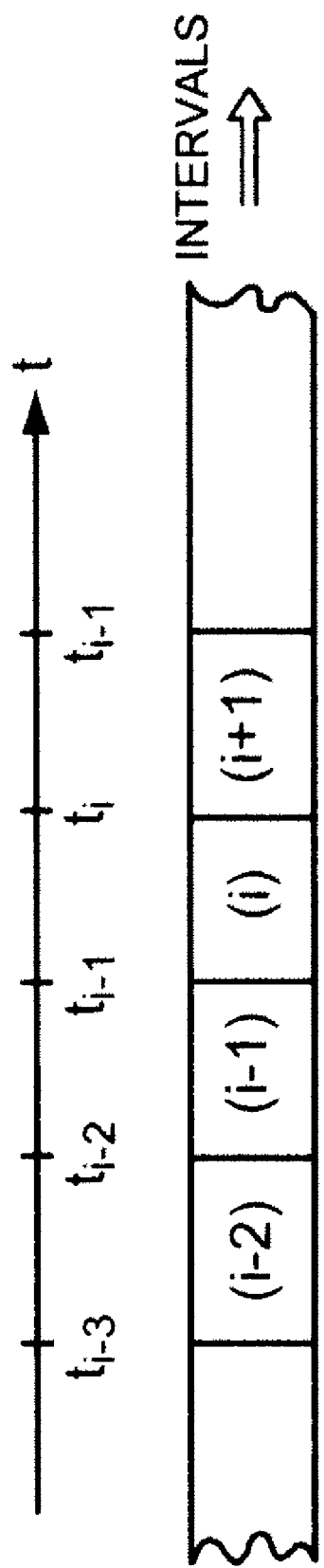
FIG. 6 illustrates a method of indexing operational intervals in accordance with an embodiment of the invention.

The resolution of the time increments may be determined according to application. In one embodiment, the time increment is determined according to the MTBR of the system. For example, if MTBR=1 month, then $\Delta t$=1 hour, but when MTBR=3 days, then $\Delta t$=1 minute. $C_{i-1}$ is the battery capacity during the i−1th time interval, where the time intervals are determined from the preceding time to the current time. For example, the ith time interval is the time between i−1 and i. This is illustrated in FIG. 6. The self-discharge current is described by the latter term in the form:

$$(I_D)_{i-1}=C_{i-1}a_{i-1} \quad (22)$$

where $a_{i-1}$ is the monthly discharge rate at the (i−1)th interval; see, Eq. (5). The $\varepsilon^{(j)}$-parameter defines the "activity $\varepsilon^{(j)}$-pattern" of the jth device, in the form:

$$\varepsilon_i^{(j)} = \begin{cases} 1, \text{ if Device } j \text{ is Active during interval } i \\ 0, \text{ if Device } j \text{ is Inactive during interval } i \end{cases} \quad (23)$$

where i defines the ith time interval (i.e., a given time).

Figure 7:
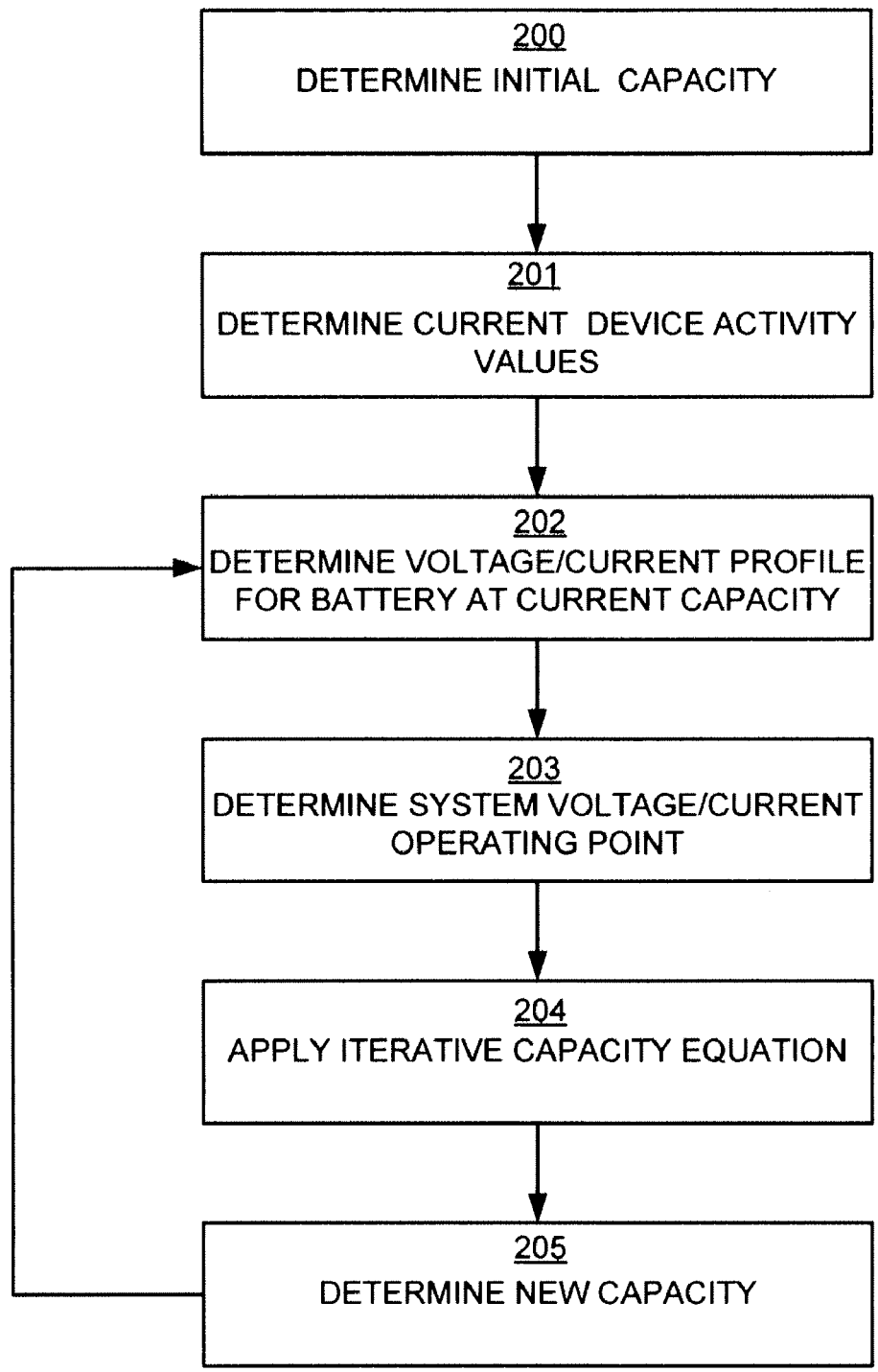
FIG. 7 illustrates a method of voltage-based iterative power management implemented in accordance with an embodiment of the invention.

FIG. 7 illustrates a method of voltage-based iterative power management implemented in accordance with an embodiment of the invention. In step 200, the current capacity of the battery supply is determined. In the initial iteration of the method, the current capacity is defined as the starting point for the iteration method. In typical embodiments, the starting point is taken after the first 24 hours, when the self-discharge is defined by the b parameter as above. In this case, $C_o$ is replaced by $C_o(1-b)$; see Eq. (1). For example, in an embodiment starting after 24 hours with b=0.05, the starting point is as follows:

$$C_0(1-b)=0.95C_0. \quad (24)$$

In other embodiments, the electronic devices may begin operation with a full battery, and the initial starting point would be $C_0$.

In an example where the powered system comprise three devices, with $\varepsilon_o^{(1)}$=0, $\varepsilon_o^{(3)}$=0, and $\varepsilon_o^{(2)}$=1, (meaning that the first and third devices are initially inactive, while the second device is initially active) and assuming that the initial starting point is $C_o(1-b)$ then Eq. (21) becomes:

$$C_1=C_o(1-b)-I_o^{(2)}\Delta t-C_o(1-b)a_o\Delta t, \quad (25)$$

where $a_o$ is the battery monthly discharge for t=0, and $I_o^{(2)}$ has been obtained from the matching condition (Eq. ((20))).

In step 201, the device operational parameters for the next time interval are determined. In the above three-device example, this comprises determining the $\varepsilon_1^{(1)}$, $\varepsilon_1^{(2)}$, and $\varepsilon_1^{(3)}$ values. In some embodiments, the $\varepsilon_i^j$ are known a priori. For example, the $\varepsilon_i$ value for a periodically-operating radio transmitter would be known prior to operation when the transmitter operated with a known schedule of activation and deactivation times. As another example, certain $\varepsilon_i^j$ values may be assumed or estimated for device modeling or system design. For instance, if a desired system had a known minimum MTBR, then a proper battery supply for the system could be chosen by applying these methods to model MTBRs for certain potential battery choices. In these models, the $\varepsilon_i^j$ for different system devices may be arbitrarily chosen according to likely system use. For example, in a wireless sensor with a high-bandwidth radio for uploading video, the high-bandwidth radio might be estimated to operate for 1-5% of the total sensor lifetime; $\varepsilon_i^j$ values may then be chosen that reflect this ratio. In some embodiments, the $\varepsilon_i^j$ values may be presented by means of a look-up table. In still further embodiments, $e_i^j$ may be determined as the system operates. For example, a system control module may have data indicating the operational state of the system connected devices. If a particular device were operational during the latest time interval, then the system control module would set the device's $\epsilon_i$ value for this time interval to 1.

In further embodiments, step 201 further comprises using the $e_i^j$ values for the current time interval to determine the voltage/current characteristics for the active devices. In a particular embodiment, a system control module combines known $I_A/V_A$ characteristics for the active devices to determine an overall active system $I_A/V_A$ summary characteristic, as described with respect to FIG. 4.

In step 202, using the capacity determined in step 200,—in the present example, the $C_1$ value—the battery voltage/current characteristic family, as described with respect to FIG. 1, is used to determine a voltage/current characteristic for the new capacity, as described with respect to FIG. 2.

In step 203, the matching condition, as described with respect to FIG. 5, is used in Eq. (20) to find the $I_E$ and $V_E$-values.

In step 204, $I_E$, $V_E$-values are introduced into Eq. (21), transformed into the following summarized form:

$$C_2 = C_1 - I_{E1}^{(1)}\Delta t - C_1 a_1^{(1)}\Delta t \tag{26}$$

where $I_{E1}^{(1)}$ is the summarized $I_E$ value for the first time interval and $a_1$ is monthly discharge value for the first time interval.

In step 205, the $C_2$ value is calculated from Eq. (26) and the procedure is repeated for the next time interval, i+1, using the newly calculated $C_i$ value. In the present example, using the $C_2$ value, the $C_3$ value is determined using the following equation:

$$C_3 = C_2 - I_{E2}^{(1)}\Delta t - C_2 a_2^{(1)}\Delta t. \tag{27}$$

where, $I_{E2}^{(1)}$ is the summarized current value and $a_2^{(1)}$ is the self-discharge rate determined as described above but for the second time interval.

In some embodiments, desired operational currents, I, may exceed the delivery abilities of the desired batteries. In conventional batteries, delivery of high current can cause the battery voltage to drop rapidly, often to unusable levels. In these embodiments, a supplementary energy storage with a high power density may be employed to provide the required operational currents. For instance, capacitors, such as supercapacitors or ultracapacitors, may be provided with the battery. The battery may be used to charge the capacitors over long time periods with reduced current levels. Once charged, the capacitor may be used to provide the short-term operational currents. In the described iterative capacity monitoring method, the introduction of such a capacitor may be handled in various ways. For example, the battery-capacitor system may be configured to constantly charge the capacitor. This increased the slow battery discharge rate, and thereby modifies the discharge parameter a according to the amount of capacitor charging that occurred during the time period. As another example, the capacitor may be treated as another system device, with lower current than other system devices, but with a longer operating time, reflected by the capacitor's $\epsilon$ values. This method might be used when other devices in the system operating in a less predictable, or bursty, manner, such that constant capacitor charging is not preferred. In other embodiments, changes in the amount of capacitor charging in the system may be taken into account through the use of a dynamic a parameter, that changes in different time periods. In any case, the actual operational currents of the electronic devices that run off of the stored capacitor energies (i.e., radio, memory, sensor, etc. . . . ) are reduced in the above equations by the appropriate amounts to reflect actual current drains on the battery.

In some embodiments, as the battery capacity information is iteratively updated, a system monitor can transmit or present this information to other system devices as requested. In other embodiments, this battery capacity information is used in modeling or design procedures. In which case, the procedure is continued until the $C_i$-will reaches the $gC_o$ value. The last i value, equal to n, is used to determine the MTBR as:

$$(MTBR) = n\Delta t + 24 \text{ hours}. \tag{28}$$

As described in greater detail below, many embodiments of the invention are particularly applicable to device systems having (A) compact size; (B) large MTBR; (C) high wireless transmission bandwidth (>100 kbps); (D) large data content of interest (several GBs); and E) Highly-secure data transmission (in short bursts). They include wireless flash memories, data carriers, sensors, data transformers, and others. In order to satisfy conditions: A, B, C (compactness, longer life, high bandwidth), they need to be small size, yet should have long MTBR (months), and still transmit high bandwidth wireless (RF). A system with a single radio transceiver with one operating mode often has difficulty in satisfying the two contradictory conditions: (B) and (C) under the size constraint (A).

In some embodiments, these conditions are met through a dual radio approach that can satisfy these two contradictory conditions. One radio is a kind of trigger radio, for example, that is constantly on (k=1), yet its current is in the μA range. The second radio is a high-power radio (>100 mA) such that it can transmit large bandwidth. In typical embodiments, the second radio transmits only in bursts such that it is usually inactive (k<<1).

In some embodiments, a system comprises wireless flash memory data carrier, such as a personal data carrier. In one embodiment, the wireless memory data carrier comprises has personal medical data, for example. As another example, a field operative can possess an individual data carrier system that has access to a satellite modem. Due to this modem, he can collect automatically, or manually, critical data, such as video, imagery, telemetric, geophysical, audio, text, graphics, etc., in large amount, approaching several GBs of data. Other field operatives can have also access to this data through wireless connections between PCs, wearable PCs, and PDAs (personal digital assistants), for example.

Another type of embodiment of systems of data transformers that satisfy the above five conditions are sensors. For example, one embodiment may comprise a field deployable concealed sensor, for example a compact sensor that can be discarded after its use. In such an embodiment, the sensors are typically desired to provide secure data transfer, usually wirelessly, to another location. In one embodiment, the sensors send data in high bandwidth bursts. Consider, as an example, a sensor with a video recorder with video resolution of 740× 480 pixels, RGB (24 bpp), and real-time (30 frames per seconds, or 30 fps); then, its throughput is 255 Mbps. Assuming 10:1 video compression throughput is reduced to 25.5 Mbps. One minute of such a video is about 1.5 Gb. Assuming transmission bandwidth is wireless USB, or about 480 Mbps, then the time of transmission will be: 1.5 Gb/480 Mbps≅3 sec. This is a reasonable burst time for a relatively secure link. Other types of information requiring similar bandwidth are comprehensive mission profiles for use in wearable libraries.

As an example, consider, the re-chargeable, or secondary battery, such as Li-Ion, with energy density 160 Wh/kg, or 160 mWh/g. Assuming average voltage of 3.7 V, the battery charge capacity is:

$$43.24 \text{ A·h/kg} = 43.24 \text{ mA·h/g}. \tag{29}$$

Assuming a battery density of 2 g/cm³ (these are approximate numbers, real numbers may be either measured or given by a manufacturer) results in 0.5 cm³/g, which yields 86.48 mAh/cm³, and assuming battery volume, $V_B$=5 cm³ (typical miniature battery volumes are 3.6 cm³, for example), the battery capacity is:

$$C_o = 432.4 \text{ mA·h.} \tag{30}$$

However, secondary batteries may have some characteristics that make them less desired for certain applications. For example, often, they have relatively low energy density, have rather short life times (3 years), are occasionally prone to explosion, and are is highly sensitive to temperature (see Eq. (3)).

Consider a typical primary battery, such as Li—Mn, with energy density of 280 Wh/kg, or 280 mWh/g, for example. Assuming average voltage of 3 V, the battery charge density is:

$$93.33 \text{ mA/g} \tag{31}$$

which is much higher than that in Eq. (29). Assuming battery material density of 2 g/cm³ results in 186.67 mA·h/cm³, and for $V_B$=5 cm³, or battery mass of 10 g, the battery capacity is:

$$C_o = 933.33 \text{ mA·h} \tag{32}$$

which is much larger than that of the secondary battery (see, Eq. (30)).

Assuming, for simplicity, that the C3 rule holds with the following primary battery parameters: a=0.005/mo., b=0.005/24 h, g=0.01; then the latent charge is:

$$Q = C_o(1-b) - gC_o = C_o[1-(b+g)] = C_o(1-0.015) = (933.33)(0.985) = 919 \text{ mA·h} \tag{33}$$

and the average latent charge (after 1st 24 hours), is $$\langle Q \rangle = \frac{C_o(1-b) + gC_o}{2} = \frac{C_o(1-b+g)}{2} = \frac{C_o(1.005)}{2} = (933.33)(0.502) = 469 \text{ mA·h} \tag{34}$$

Therefore, the mean self-discharge current, is $$\langle I_D \rangle = a\langle Q \rangle = \left(\frac{0.005}{730.5 \text{ h}}\right)(469 \text{ mA·h}) = 3.2 \text{ μA} \tag{35}$$

Now, we will discuss two typical cases: a sensor and a data carrier. In both cases, we have trigger radio current $I^{(1)}$, high-bandwidth radio (including μC, or microprocessor), current $I^{(2)}$, and self-discharge current $\langle I_D \rangle$. In the sensor case, however, there is also sensor current, $I^{(3)}$; so the first example describes the sensor case.

Figure 8:
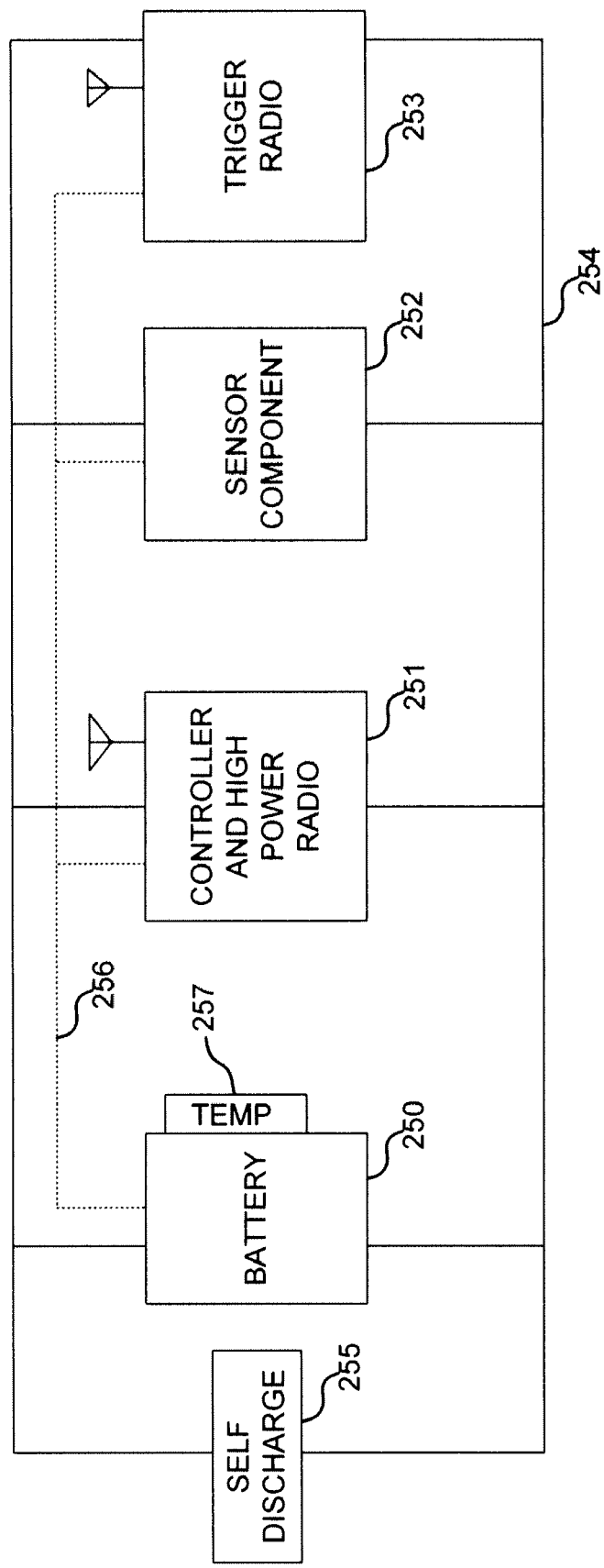
FIG. 8 illustrates a portable or disposable sensor according to an embodiment of the invention.

FIG. 8 illustrates a portable or disposable sensor according to an embodiment of the invention. From a power standpoint, the sensor comprises a plurality of devices, 250, 251, 252, and 253. Again for ease of explanation, the devices are illustrates as connected in parallel 254 to a battery 250. In the illustrated embodiment, a trigger radio 253 continuously, or nearly continuously draws power. The sensor further comprises a high power radio and controller module 251. As described below, this module may be activated when the trigger radio 253 receives a proper activation signal. The sensor further comprises sensor components 252, such as optical sensors, acoustic sensors, infrared sensors, acoustic sensors, actuator-based sensors, EMF sensors, chemical sensors, or other sensor types. In some embodiments, the sensor components is controlled and activated by the controller 251. In other embodiments, the sensor may be periodically activated or activated due to the occurrence of specified events. For example, sensor components 252 may comprise a motion sensor that continuously draws a negligible amount of power, but that activates the actual data measuring sensors when activated by the motion sensor. A communication bus 256 is further provided to enable communications between the various devices, and to allow the controller to measure battery-related data. For example, in one embodiment, the battery 250 has a temperature sensor 257 in communication with the controller 251, which allows the controller to determine the various temperature related battery characteristics to allow the controller to maintain an accurate assessment of remaining battery capacity. The placement of this temperature sensor will typically vary based on application and device form factor and will be located to assure sensing the temperature of the battery energy storage material and not the battery contacts, which will often have a different temperature profile based on operation. For ease of illustration only, the self discharge current 256 is illustrated as a separate device 255.

An example of typical device characteristics follows for the purposes of illustrating how a battery power supply may be chosen for a disposable sensor during design. In this example, the trigger radio is indexed as (1), the high power radio and controller is indexed as (2) and the sensor components are indexed as (3). For the sake of example, assume: $I^{(1)}$=50 μA, $k^{(1)}$=1; $I^{(2)}$=300 mA, $k^{(2)}$=5 min/1 week=4.94·10⁻⁴; $I^{(3)}$=333 mA, $k^{(3)}$=1 sec/1 h=2.78·10⁻⁴; $\langle I_D \rangle$=3.2 μA, In the sensor current case, we assumed the power of 1 W=1000 mW, and voltage of 3 V. Such current can be obtained in the optical sensor case; if the optical sensor operates based on outside requests, then typically, $k^{(3)}$=1 sec/1 h. Otherwise, as in the acoustic sensor case, the power can be lower (10 mW), but $k^{(3)}$ will typically be larger if the sensor operates more often.

Applying the above currents:

$$I_T^{(SENSOR)} = k^{(1)}I^{(1)} + k^{(2)}I^{(2)} + k^{(3)}I^{(3)} + \langle I_D \rangle = \tag{36}$$
$$1 \cdot 50 \text{ μA} + (4.94 \cdot 10^{-4})(300 \text{ mA}) +$$
$$(2.78 \cdot 10^{-4})(300 \text{ mA}) + 3.2 \text{ μA} = 293.14 \text{ μA}$$

and the (MTBR), is $$(MTBR) = \frac{933.33 \text{ mA·h}}{293.14 \text{ μA}} = 3184 \text{ h} = 4.35 \text{ mo.} \tag{37}$$

which is sufficiently long for typical deployable sensor applications.

Figure 9:
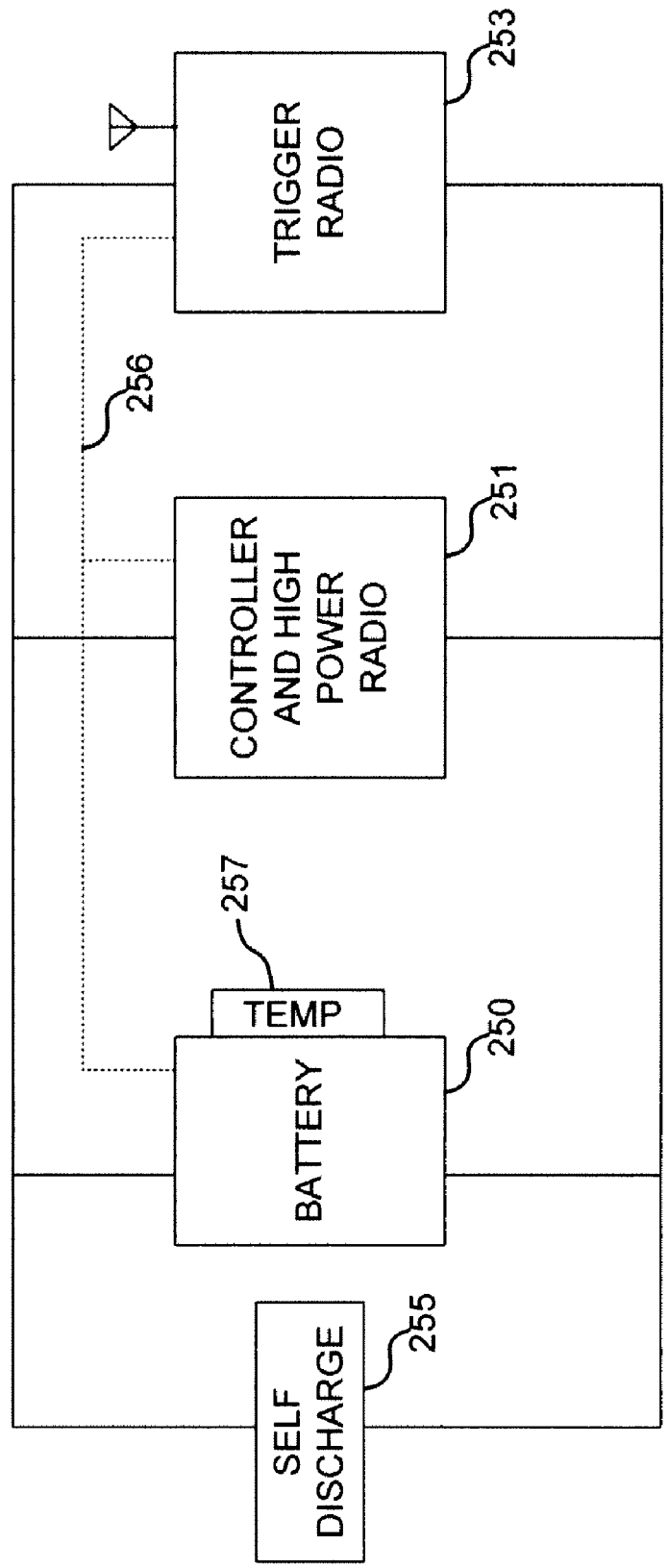
FIG. 9 illustrates a data carrier according to an embodiment of the invention.

FIG. 9 illustrates a data carrier according to an embodiment of the invention. The illustrated data carrier is similar to the sensor described with respect to FIG. 8, except that there are no sensor components in the data carrier. As another example of battery choice during design, in this case, $I^{(3)}$=0, and $$I_T^{(DATA\ CARRIER)} = k^{(1)}I^{(1)} + k^{(2)}I^{(2)} + \langle I_D \rangle = 50 \text{ μA} + 148.2 \text{ μA} + 3.2 \text{ μA} = 201.4 \text{ μA} \tag{38}$$

and the MTBR is $$(MTBR) = \frac{933.33 \text{ mA·h}}{201.4 \text{ μA}} = 4634 \text{ h} = 6.34 \text{ mo.} \quad (39)$$

In order to obtain the specific MTBR(SMTBR), MTBR formula is written in the general form $$(MTBR) = \frac{Q}{\langle I_D \rangle + \sum_{i=1}^{M} k^{(i)} I^{(i)}} = \frac{qM_B}{\langle I_D \rangle + \sum_{i=1}^{M} k^{(i)} I^{(i)}} \quad (40)$$

so, the SMTBR is $$(SMTBR) = \frac{(MTBR)}{M_B} = \frac{q}{\langle I_D \rangle + \sum_{i=1}^{M} k^{(i)} I^{(i)}} \quad (41)$$

where q is the latent charge density. In the current example, $M_B = 10$ g, so $$(SMTBR)^{(DATACARRIER)} = \frac{6.34 \text{ mo.}}{10 \text{ g}} = 19.31 \text{ days/gram.} \quad (42)$$

Performing similar calculations for the sensor example described above results in an SMTBR of 13.27 days/gram.

Figure 10:
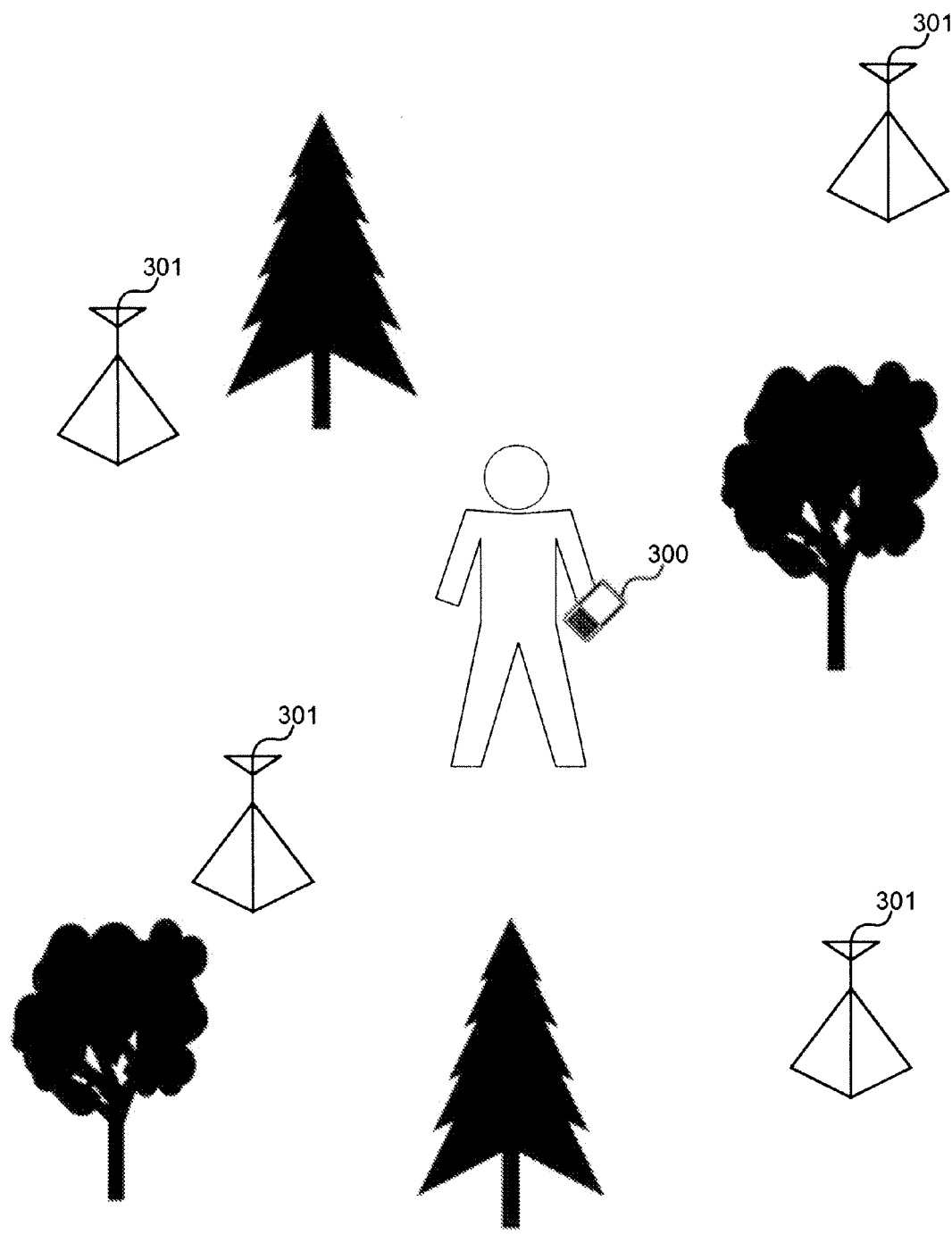
FIG. 10 illustrates a system of deployed sensors in accordance with an embodiment of the invention.
Figure 11:
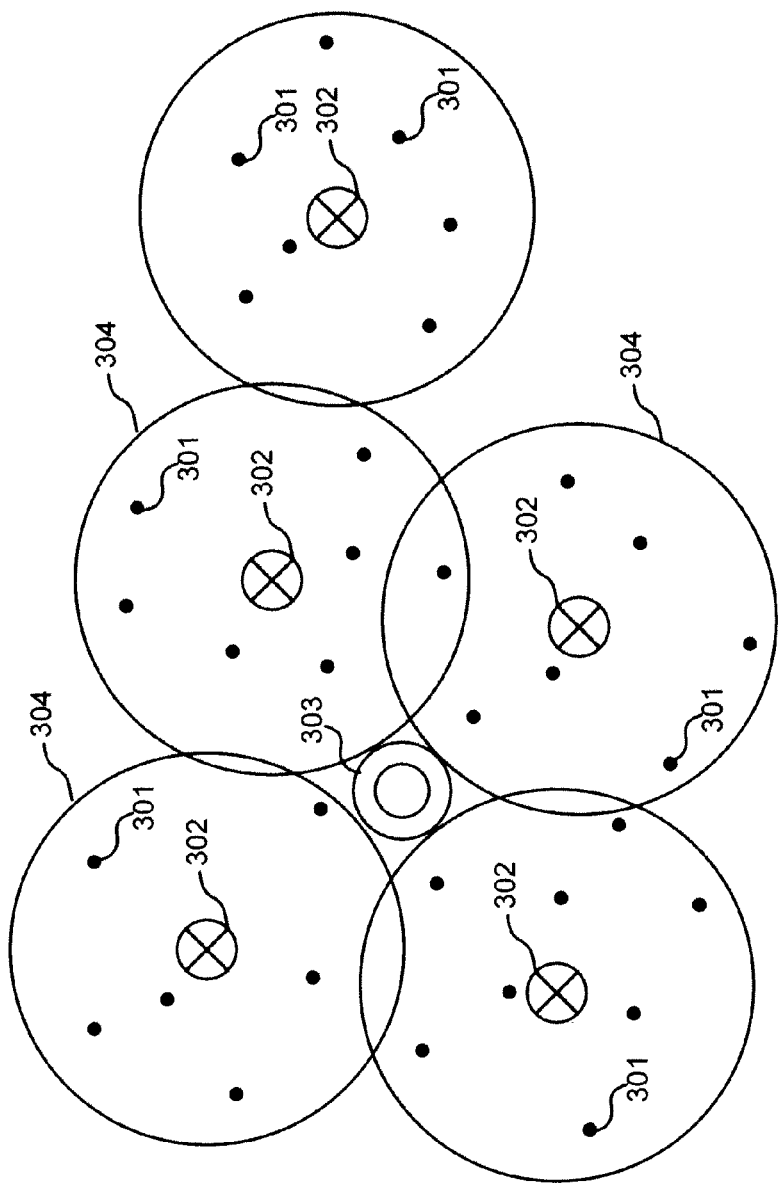
FIG. 11 illustrates a sensor system implemented in accordance with an embodiment of the invention.

FIGS. 10 and 11 illustrate unmanned ground sensor (UGS) systems implemented in accordance with an embodiment of the invention. In the illustrated embodiment, sensors 301 comprise unmanned ground sensors as described with respect to FIG. 8 having dual radio transceivers. In another embodiment, as described below, sensors 301 may comprise UGSs with a dual mode radio having a passive mode and active mode. In this embodiment, the sensors 301 have a first radio transceiver capable of communicating in a first frequency band, for example at a band center around 916 MHz. The sensor 301 have a second radio transceiver capable of communicating at a second frequency band, for example a frequency band centered around 2.4 GHz or 5.8 GHz.

As described above, sensors may developed with multi-month lifetimes that have battery power requirements that are sufficiently small to allow a small form factor for the sensors. However, under such conditions, sensor battery power may not be sufficient to allow the sensor to perform periodic updates to a centralized location or designated entity. In one embodiment, the sensor nodes are configured to operates under request from a central node or authorized communications device.

In the embodiment illustrated in FIG. 10, sensors 301 are accessible directly by a field operative or vehicle equipped with a communications device 300. For example, communications device 300 may comprise a PDA, a laptop, a wearable computer, or other type of communications device. In the embodiment illustrated in FIG. 11 and described in more detail below, sensors 301 are connected in a hierarchal network to local communications nodes 302, which may also comprise field deployed sensors or communications towers. The local nodes 302 are then connected to a central node 303.

Figure 12:
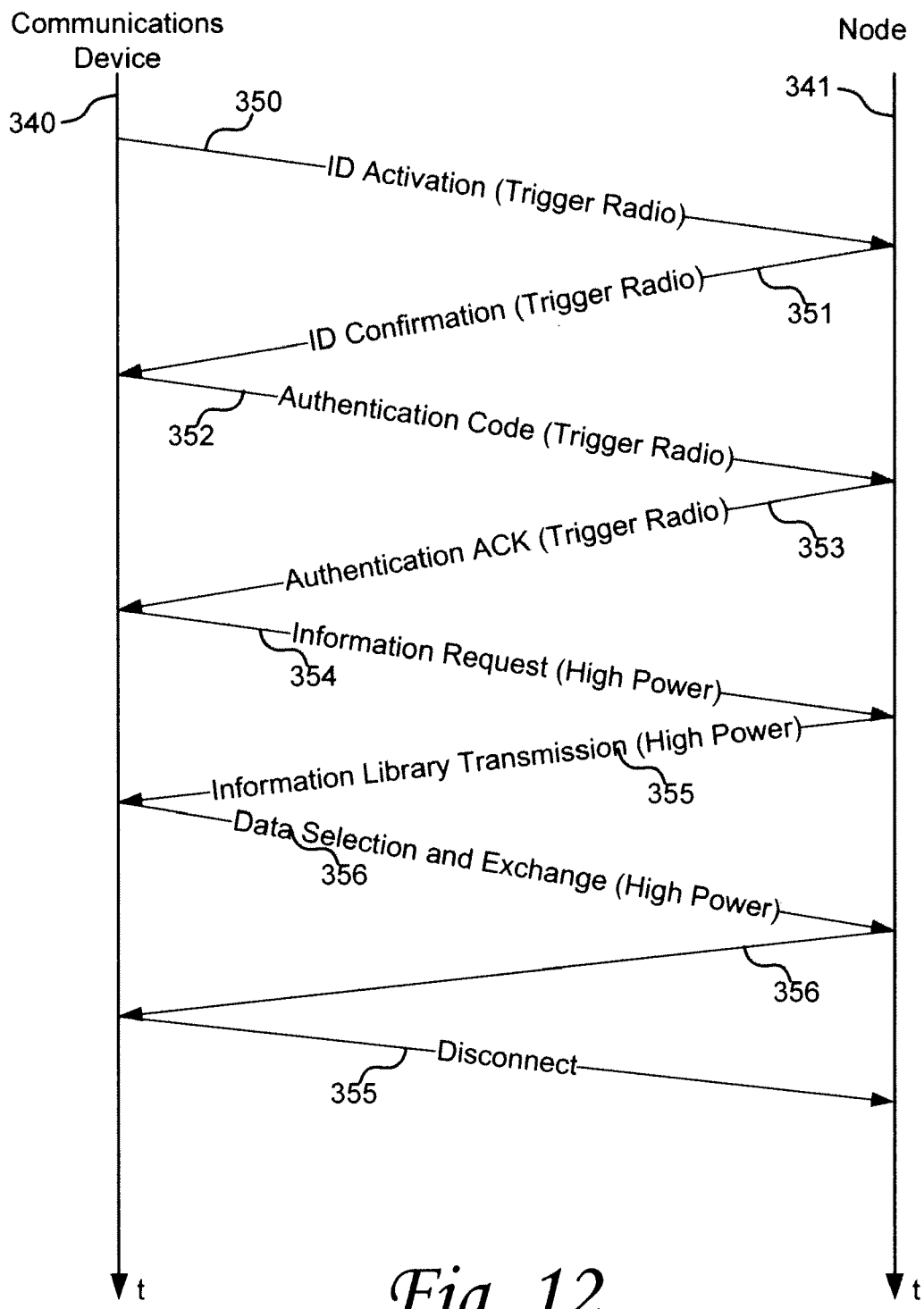
FIG. 12 illustrates a communications session between a node and a communications device in accordance with one embodiment of the invention.

FIG. 12 illustrates a communications session between a node 341 and a communications device 340 in accordance with one embodiment of the invention. In one embodiment, this illustrates a communications session between a sensor node and a central or local communication node as illustrated in FIG. 11. In other embodiments, this may illustrate a communications session between a communication device similar communications sessions occur between sensor nodes 301 and local communications nodes 302 and between communications devices and data storage devices as described with respect to FIG. 9. The illustrated communications session comprise an on demand mode (ODM) operation.

In step 350, the ODM session is activated by an activation signal transmitted from the communications device 340, such as a central node or PDA, to the node 341. In some embodiments, the activation signal is transmitted using a trigger radio frequency. In steps 351-353, the session is authenticated. In step 351, the node 341 confirms that is has received an activation signal. In step 352, the device 300 transmits an authentication code 352 that may comprise a password or passkey. In step 353, the node 341 transmits an authentication acknowledgement signal and begins communication in the high bandwidth mode.

In the illustrated embodiment, the node 341 has a library of stored information. For example, a seismic sensor node 341 might have a record of seismic activity indexed by date or magnitude. As another example, a wearable health sensor worn by a field operative might have a record of the operative's health information. In steps 354 and 355, the communications device 340 requests this information and the node 341 presents it to the device. In step 356, the communications device selects what data it will download from the node 341 and the data transfer begins. The connection and information selection steps 350-355 are typically included in the $t_{OVH}$—an overtime (OVH) time, which can be quite long (0.5 sec). In some embodiments, this may be reduced to millisecond scale, under specific Framework (F/W) improvement, for example by eliminated the ability to select information for downloading, and instead having the node 341 transmit only a predetermined type of information.

This dual-radio architecture also results in some protection from ping based attacks. In some embodiments, this comes from the fact that the $1^{st}$ radio ("frontal" radio) is the sensor-type radio, not cellular radio such as Wi-Fi. Such a trigger radio is applied for the UGS which can be a concealed sensor, for example. As such, it cannot respond to ID activation requests on typical cellular bands, or other invitation signals coming from unknown source, until the trigger-frequency authentication (ID) process is successfully completed. Therefore, in contrast to the cellular phones, it has reduced sensitivity to the ping-events, or Denial of Service (DoS) counterfeiting efforts. Also, in some embodiments, the LPD (Low Probability of Detection) is exactly equal to zero.

To maintain a low integrable current, some embodiments apply higher currents required to run high power devices but only in short bursts. The CONOPS coefficient can be defined as the ratio of the time, when the operation current, $I_o$, is used, versus the total, $t_L$, in the form: $k = t_o/t_L$. This means that during the remaining time: $t_L - t_o$, the system is at low current value; $\langle I_s \rangle$, state. However, even in the case of the non-operation state, there are two currents: trigger radio current, $I_c$, and the sleep current, $I_s$. This trigger current can be quite significant: $I_c = 15$ mA, for example, and coming only in periodic short bursts while the sleep current is very low: Is=30 μA, for example. Thus, the $\langle I_s \rangle$-value can be still low; e.g., $\langle I_s \rangle = 70$ μA.

For the sake of clarity, consider $t_o = 1$ h, and $t_c = 24$ h (i.e., one hour per day operation time); then, $k = 1/24 \cong 0.04$. Assuming: $I_o = 50$ mA, $\langle I_s \rangle = 70$ μA, and $\langle I_D \rangle = 100$ μA (self-discharge current); then, $kI_o=2.1$ mA; thus, $kI_o>><I_s>$, and $kI_o>><I_D>$. Therefore, instead of $I_o$-value, as in the case of the single-radio case, we have $kI_o$-value. Thus, by applying the dual radio communications scheme, the MTBR value can be increase by approximate value of $k^{-1}=24$ over single radio devices. As a more detailed example, a more accurate MTBR value can be calculated based on the particular case of a battery with $C_o=300$ mA·h; then, the so-called latent charge value, is: $Q_o=225$ mA·h, and, since the total average current, $<I_T>=kI_o+<I_s>+<I_D>=2.1$ mA+70 μA+100 μA=2.27 mA, the MTBR=$Q_o/<I_T>$=(225 mA·h/2.27 mA)=99 h. Assuming the high energy density of the rechargeable battery, such as a Li-ion, or polymer-ion, equal to 185 Wh/kg, or 185 mW/g, for 3.7 V nominal voltage, results in 50 mA·h/g, and 6 g of battery weight for $C_o=300$ mA·h. Therefore, there are 99 h of operation per 6 g of battery weight, or 16.5 h/g. The inverse of this 0.061 g/h, which is termed Battery Weight Cost (BWC). So, the BWC is very low: BWC=0.061 g/h.

Figure 13:
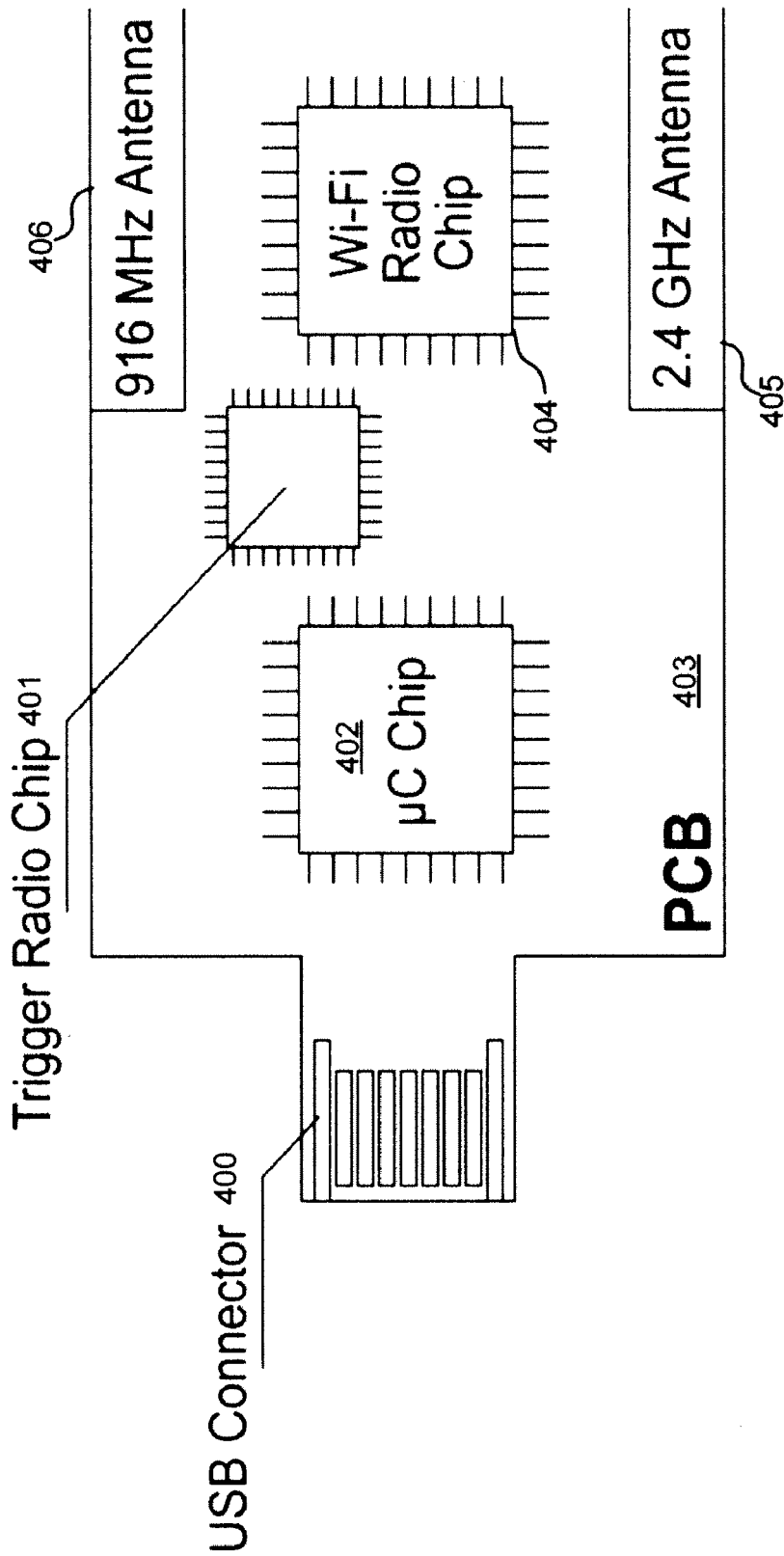
FIG. 13 illustrates a system level layout of a printed circuit board of a data carrier implemented in accordance with an embodiment of the invention.

FIG. 13 illustrates an example PCB (Printed Circuit Board) which is in SLS (System Level Solution) integration. This system may comprise a personal information carrier, configured to store predetermined information on a flash memory (not pictured), which may be disposed on the other side of the PCB 403. For example, the illustrated system may be provided to patients in a hospital, to allow ready access to the patients" information by medical personnel. A USB connector 400 allows a hardwired interface between the system and an external computer system. For example, when connected to an external computer system through the USB connector 400, the system may behave as a typical flash memory USB drive. The system further comprises a first radio subsystem comprising a first antenna 406 coupled to a first radio controller 401. As described herein, the first antenna and radio controller may operate as a trigger radio, providing low power always-on reception of incoming data connection requests. A second radio subsystem comprises a second radio antenna 405 coupled to a second radio controller 404. In some embodiments, the second radio subsystem provides the bandwidth for wireless data transfer to and from the system with an external computer system, after the external system has been authenticated using the first radio subsystem. A microcontroller 402 is further disposed on PCB 403 and coupled to the various system devices. The microcontroller 402 is programmed with logic configured to allow it to perform the various functions described herein. For example, in some embodiments, the system can function similarly a node 340 as described with respect to FIG. 12. In a particular embodiment, the system form factor can be small, such as 6 cm×2 cm×0.5 cm=6 cm³, and the approximate weight can be calculated, assuming density of 2 g/cm³ (silicon), or slightly lower, yielding 12 g-total weight.

A more complex communications device, such as an PDA may have a design similar to the illustrated system, except the microcontroller (μC) is replaced by the microprocessor (μP). Such a PDA system may also be programmed with more advanced functionality that allow it to act as a local or central node 302 or 303, as described with respect to FIG. 11.

The operational processes described above require Overhead (OVH) time, $t_{OVH}$, in order to provide authentication ($I_D$) and information selection for a regular node. After this transactional operation, the information data (e.g., sensor data or personal information data) are transferred into a more centralized node (such as a local node 302 or central node 303 in FIG. 11), which requires time, $t_o$. Thus, the total time, $t_L$, is $$t_L = t_o + t_{OVH}. \quad (43)$$

Therefore, the effective bandwidth, $B_{eff}$, may be defined as $$B_{eff} = \frac{V}{t_L} = \frac{V}{t_o + t_{OVH}} \quad (44)$$

where V is the information data volume, in kbits or Kbytes. From Eq. (44), $$\frac{1}{B_{eff}} = \frac{t_o + t_{OVH}}{V} = \frac{t_{OVH} + \frac{V}{B_o}}{V} \quad (45)$$

where $B_o = V/t_o$ is the regular bandwidth of the device which can be high; e.g., 100 kbps, 1 Mbps, or even 10 Mbps. Thus, the time, $t_o$, can be very small. For example, for V=1 kb and $B_o=100$ kbps, $t_o=10$ msec. Now, by analogy to $B_o$, the overhead bandwidth, $B_{OVH}$, may be introduced in the form:

$$B_{OVH} \equiv \frac{V}{t_{OVH}}. \quad (46)$$

Introducing Eq. (46) into Eq. (45), $$\frac{1}{B_{eff}} = \frac{1}{B_o} + \frac{1}{B_{OVH}}. \quad (47)$$

Eq. (47) is analogous to that for parallel connection of resistors, in the form: $1/R=1/R_1+1/R_2$, which shows that if $R_1<<R_2$, then $R \cong R_1$; i.e., is equal to the smaller resistor value. In the instant case, however, the overhead time can be long, 0.5 sec, for example. Then, $B_{OVH}=1$ kb/0.5 sec=2 kbps; i.e., $$B_{OVH} << B_o \Rightarrow B_{eff} \cong B_{OVH} \quad (48)$$

i.e., the effective bandwidth is limited by the overhead bandwidth. This means, that, as long as $B_{OVH}<<B_o$, it does not matter if the $B_o$-value is 100 kbps, 1 Mbps, or 10 Mbps. Then, the effective bandwidth value, $B_{eff}$, will be almost the same, equal to rather low values such as 2 kbps.

Figure 14:
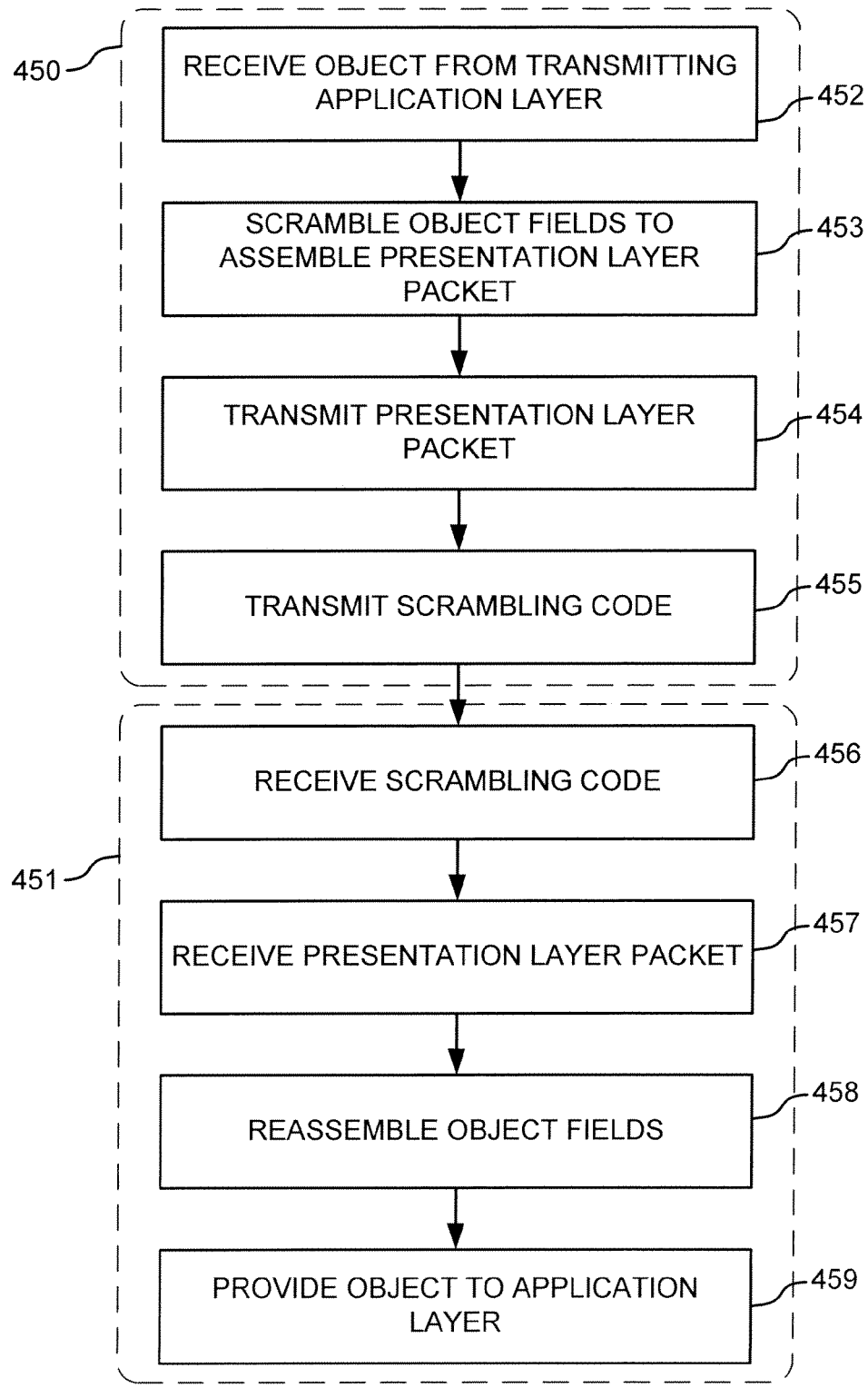
FIG. 14 illustrates a method of obfuscated data transmission implemented in accordance with an embodiment of the invention.

Further embodiments of the invention comprise methods for data formatting for data transfer between systems. These methods may be used to obfuscate transmitted data to such that the actual transmission sequence of data between systems is scrambled or permuted with respect to a standard format for the data. One such method is illustrated in FIG. 14. An object to be transferred between computer systems may comprise a plurality of fields in a specific order. For example, a picture file or object might comprise a name field, a date field, an object size field, and a field containing a bitmap. To properly use a received object, a computer application layer program may have a specific order required for the fields, otherwise the object cannot be properly opened, decoded, or utilized. In one embodiment of the invention, a presentation layer protocol is configured to scramble the fields of an object to be transmitted. A similar presentation layer protocol on the receiver side is configured to reassemble the object and present it to an application layer program embodied a receiver system.

Figure 15A:
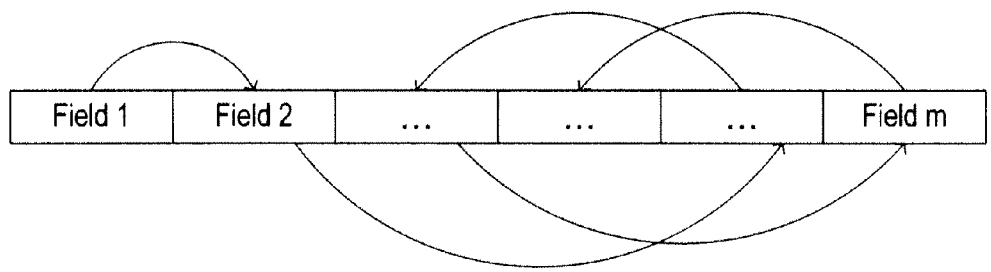
FIG. 15 illustrates example scrambling patterns for a method of obfuscated data transmission implemented in accordance with an embodiment of the invention.

In FIG. 14, steps 452-455 are performed by a presentation layer protocol on a transmitting system 450, while steps 456-459 are performed by a presentation layer protocol on a receiving system 451. In step 452, the transmitting presentation layer receives an object to be transmitted. In step 453, the object's fields are the rearranged or scrambled to assemble a presentation layer packet. In some embodiments, a single application layer object is scrambled, for example by permuting the fields as illustrated in FIG. 15A. For example, for an application layer object having five fields, a scrambling permutation might rearrange the fields as follows (in 2-line permutation notation):

$$\begin{pmatrix} 1 & 2 & 3 & 4 & 5 \\ 4 & 1 & 5 & 2 & 3 \end{pmatrix}.$$

In step 454, the assembled presentation layer packet is transmitted, for example by providing it to a session or transport layer protocol for transmission to a receiving system.

The illustrated embodiment further comprises transmitting the scrambling code 455. In some embodiments, the scrambling code is transmitted in a separate transmission. For example, the scrambling code or codes to be used for a session may be transmitted during the session establishment. In embodiments employing dual radios, the scrambling code may be transmitted with one radio, while the packet is transmitted with the other radio. For example, a low-bandwidth trigger radio might be used to transmit the scrambling code while a high-bandwidth wi-fi radio might be used to transmit the packet. In other embodiments, encryption might be employed to secure the scrambling code and the object. In these embodiments, the scrambling code might be protected with a more secure, but more computationally intensive, encryption scheme than the packet.

In other embodiments, the scrambling code might be determined by the transmitting and receiving systems without the need to transmit it between them. For example, the scrambling code might be determined pseudorandomly using a seed that has been pre-shared between the systems. Accordingly, the scrambling code can change between transmissions and the receiving system can determine the next scrambling code by advancing the pseudorandom sequence.

Figure 15B:
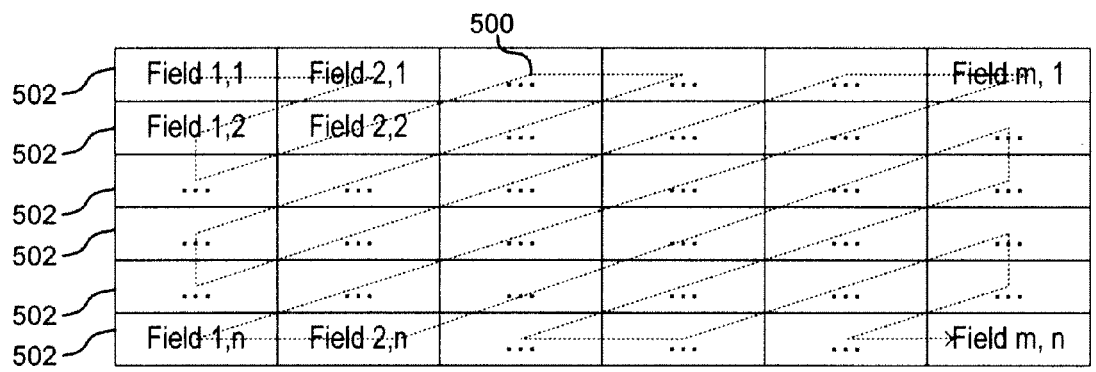
Figure 15C:
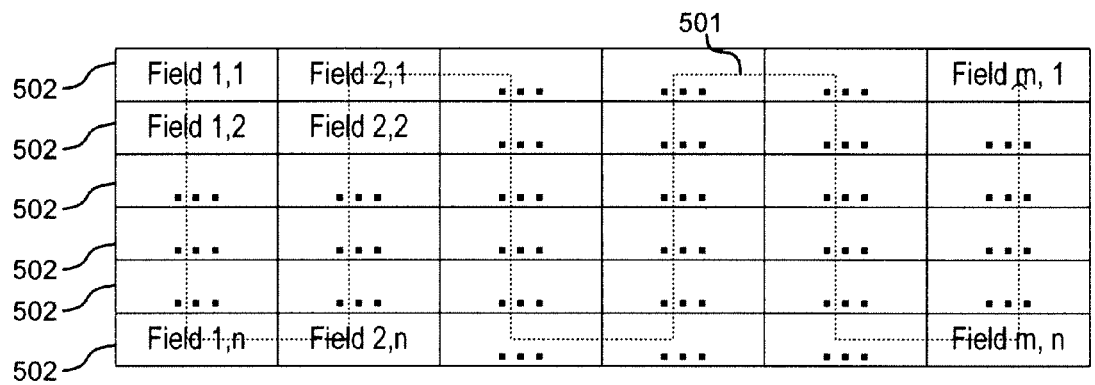

In further embodiments, the field scrambling procedure may be performed across multiple application layer objects. For example, a presentation layer protocol may be configured to buffer multiple objects to assemble presentation layer packets comprising fields selected from more than objection. FIGS. 15B and 15C illustrate two such methods. As illustrated in these figures, in one embodiment, a presentation layer protocol may be configured to maintain a plurality of n objects 502 in a buffer, with each object comprising a plurality of m fields. The presentation layer protocol can then assemble a presentation layer packet, as in step 453 using a predetermined sequence 500 that covers the fields of all n objects. In one embodiment, the presentation layer packet comprises information from the same number of fields as the received object 502. For example, in FIG. 15C, if m=n=5, then a first presentation layer packet would comprise the first fields from each of the 5 objects, the second presentation layer packet would comprise the second fields from each of the 5 objects, and so on. In other embodiments, the presentation layer packets might contain information from fewer or more fields than are in an application object.

In some embodiments, the covering sequence used to assemble the packets can be selected from a predetermined number of covering sequences provided to both presentation layer protocols. In such an embodiment, the sequences might be indexed, and the index of the sequence transmitted as the scrambling code in step 455, or the index of the sequence might be pseudorandomly or otherwise determined in a shared manner at both the transmitting system and receiving system. In other embodiments, the covering sequences might be generated as needed according to a predetermined algorithm. The sequences may then be provided an index using a predetermined indexing function. In these embodiments, the sequence used to assemble the presentation layer packet itself or the index of the sequence may be transmitted to the receiver, or generated independently in an equivalent manner at the receiver system.

In a particular embodiment, a number of filters, or scrambling sequences are determined separately for specific file formats. When the presentation layer protocol is provided a file in a certain format, the presentation layer selects the scrambling sequence from the plurality of scrambling sequences that are preconfigured for that file format.

Some embodiments of the invention relate to Progressive Pre-ATR Preview-Persistent (P4) surveillance. These embodiments are particularly applicable to critical area persistent surveillance, such as persistent border surveillance. FIG. 11 illustrates such an embodiment of the invention comprising a sensor network deployed to monitor a region. In the illustrated embodiment, a first plurality of sensor nodes 301 are deployed throughout the region. A second plurality of local area nodes 302 (also termed local communications nodes above) are deployed an connect with sensor nodes 301 deployed within ranges 304 surrounding the local area nodes 302. The sensor nodes 301 within a range 304 and their corresponding local area node 302 form a local area network (LAN). A sensor area network (SAN) is formed by communications between the plurality of LANs and a central sensor area node 303 (also termed central node above). Here, rather than relying on typical highly-directional fixed microwave lines for communications between the LAN nodes 302 and SAN node 303, communications are conducting using wireless communications with bandwidth two orders of magnitude (~1 Mbps) lower, and still preserving almost the same functionality due to a Power-Centric-Compound-Wireless (PCCW) network combining low-bandwidth radio working in a continuous mode, and high-bandwidth radio working in bursts. In some embodiments, sensor nodes 301 may come in and out of operation on a fairly random basis. For example, some sensor nodes 301 may be damaged and put out of operation, new sensor nodes 301 may be put into operation, or some sensor nodes 301 may be worn by field personnel and may therefore move around the deployment area. Accordingly, in some embodiments, LAN nodes 302 are configured to transmit wake-up signals in a periodic fashion to maintain accurate records of connected devices. In one embodiment, a LAN node 302 is configured to periodically emit a ID activation signal 350 as described with respect to FIG. 12, then the LAN node 302 is able to conduct a census of its surrounding area by monitoring return ID confirmation signals 351.

Figure 16:
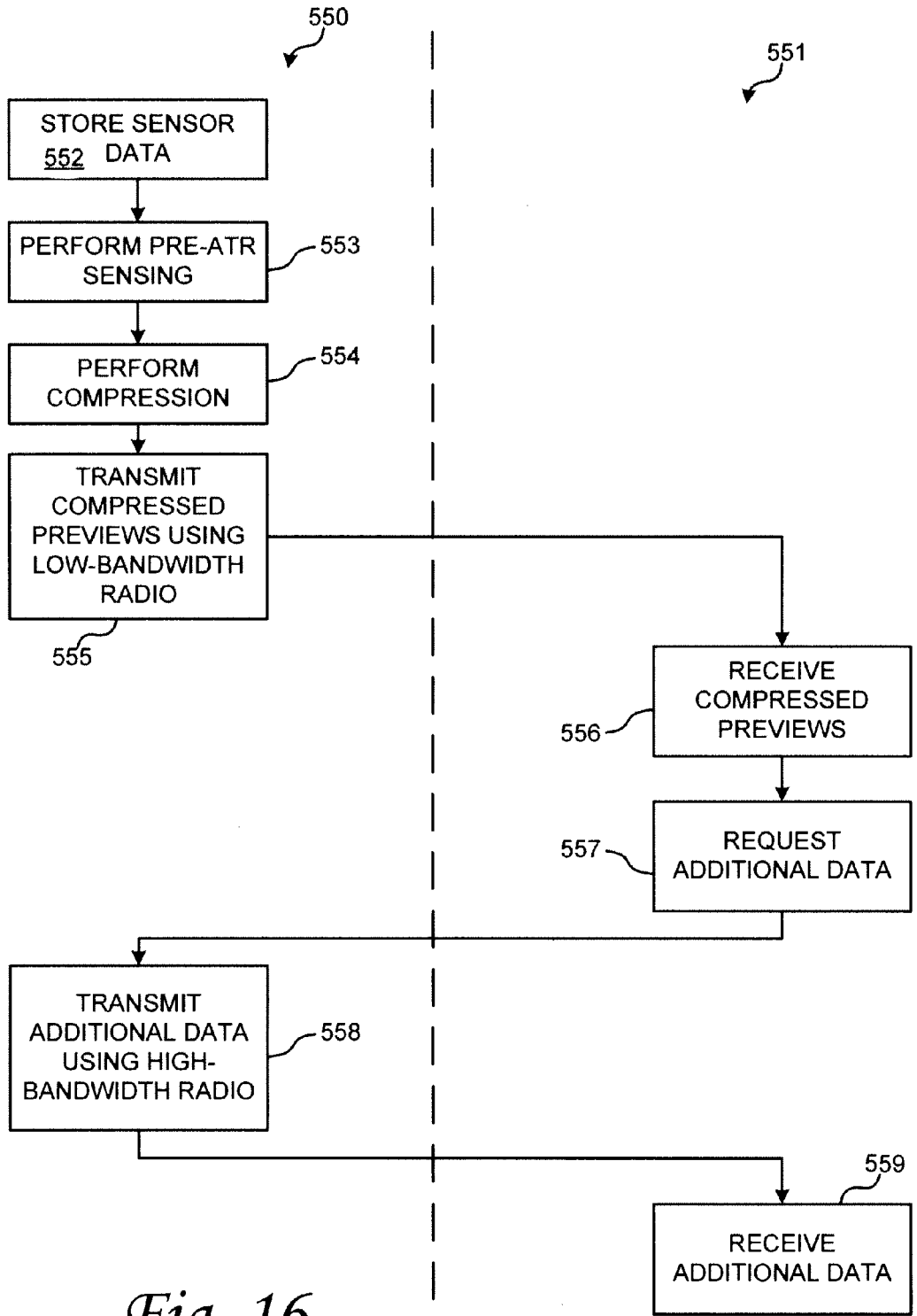
FIG. 16 illustrates a method of operation for a network according to an embodiment of the invention.

FIG. 16 illustrates a method of operation for a PCCW network according to an embodiment of the invention. The illustrated method describes the operations of a LAN node 550 and a SAN node 551. In step 552, the LAN node stores sensor data received from connected sensor nodes. In some embodiments, the sensors may continuously transmit accumulated sensor information, for example using a low bandwidth, always-on connection. In other embodiments, the sensors may be configured to transmit bursts of accumulated sensor information. For example, a video sensor might transmit 10 s of video every minute. In still further embodiments, the sensors may be configured to transmit information in response to a request from a LAN node or a SAN node.

In step 553, the LAN node 550 performs pre-ATR (automatic target recognition) on the stored data. For example, the LAN node 550 may identify areas or regions of interest using the methods described in US Patent Publication No. 2008/0310742, published on Dec. 18, 2008, the contents of which are hereby incorporated in their entirety. In this form of pre-ATR a method of moving object location by triangulation, as well an object velocity vector evaluation, is used. Other pre-ATR sensing includes: color mapping, shape, size, texture, and other type of sensing: audio, seismic, ultrasound, RF, IR, thermal, to avoid full-scale ATR (Automatic Target Recognition) which is troublesome and effective only in very particular situations. Therefore, pre-ATR defines only areas/directions of interest; so a sensor node's camera's PTZ (pan, tilt, zoom) can be tuned into those (x,y; kx,ky; t)—time-phase-space regains of interest, supported by GPS and automatic software algorithms.

In step 354, the LAN node 550 performs compression or generates previews for transmission to the SAN node 551. In some embodiments, the LAN nodes 550 may be unmanned, while the SAN nodes 551 are manned or in communication with a manned station to allow sensor information to be chosen from the previews. In one embodiment, a pre-ATR procedure defines time-segments of video frames, or VFTPs, that are sent to SAN nodes 551 for selection of longer VFTPs to save wireless transmission bandwidth. In one embodiment, the LAN node 550 identifies video frames of interest, in the form of short VFTPs, with about 3 sec-time length, or about 100 frames, assuming: 30 frames per second, or 30 fps. In some embodiments, these previews are of sufficiently small size to allow them to be sent over a low-bandwidth radio connection in step 555. In other embodiments, a high-bandwidth radio may be used in burst mode to transmit the previews.

In step 556, the previews are received at the SAN node 551. These previews may then be used by a SAN node operator, or a more computationally intensive program or algorithm, to select what additional data is required from the sensors. The SAN node 551 is then used by the operator to request the additional data from the LAN node 550 in step 557. In steps 558 and 559, the LAN node responds to the additional data request by transmitting the requested data using a high-bandwidth radio, which is received by the SAN node.

Defining: $t_R$-recording time (here: $t_R$=3 sec); $B_o$-original bandwidth (here: $B_o$=(740)(480)(24)(30)=255 Mbps; C-compression ratio (here: C=50, assuming COTS MPEG2 compression); $B_c$-compressed bandwidth (here: $B_c$=$B_o$/C=255/50=5.1 Mbps); T-wireless throughout (here: T=1.5 Mbps). Then, the preview transmission time, $t_w$ is $$t_w = \frac{B_c \cdot t_R}{T} = \frac{B_o t_R}{C \cdot T} = \frac{V_R}{T} \quad (49)$$

where $V_R$ is preview bit volume:

$$V_R = \frac{B_o \cdot t_R}{C} = \frac{255}{50}(3) = 15.3 \text{ Mb} = 1.91 \text{ MB} \cong 2 \text{ MB} \quad (50)$$

For comparison, for 1 hour of recorded video, the bit volume, $V_R'$, is $$V_R' = \frac{255}{50}(3600) = 18.36 \text{ Gb} = 2.3 \text{ GB} \quad (51)$$

Thus, gigabytes of recorded video data can be stored in repository libraries, installed in the LAN nodes. For example, for one week of video data stored in only one camera, the byte volume $V_R''$, is $$V_R'' = V_R'(24)(7) = 386 \text{ GB} \quad (52)$$

The wireless transmission time, $t_w''$, of such huge volume data, even with high throughput of T=100 Mbps, will be quite large:

$$t_w'' = \frac{(386)(8)}{(0.1)} = 30,880 \text{ sec} = 8.58 \text{ hours} \quad (53)$$

Therefore, transmitting all video data into the SAN central node, would be highly ineffective. In contrast, the wireless transmission time, $t_w$, for single preview, is very short, even for much lower wireless transmission bandwidth: T=1.5 Mbps:

$$t_w = \frac{V_R}{T} = \frac{15.3 \text{ Mb}}{1.5 \text{ Mbps}} \cong 10 \text{ sec} \quad (54)$$

In order to illustrate further aspects of these embodiments, consider the following fundamental relation for the general RF-communication:

$$\frac{P_o}{B \cdot d^2 \Omega} = \text{constant} \quad (55)$$

where $P_o$ is the output RF-power, B is transmission bandwidth, d– is communication distance and $\Omega$ is solid angle of propagation. The output (antenna) power is proportional to bandwidth and to a solid angle, as well as proportional to communication distance in square. Therefore, in order to keep the same power, the reducing bandwidth m-times is equivalent to increase the distance $\sqrt{m}$–time. For example, if bandwidth is reduced 100-times, then the distance can be increased 10-times, or, equivalently, the solid angle can be increased 100-times. For example, for the latter case, if the bandwidth has been reduced from 100 Mbps into 1 Mbps; then, solid angle of propagation can increase from 1°×1°-narrow propagation to 3°×33°-wider angle of RF propagation. On the other hand, reducing the power is almost always advantageous, since it proportionally increase the MTBR-value. (This figure is usually represented by the antenna gain in decibels; the solid angle measure has been introduced for sake of transparency).

The security of computer devices, such as: computers (PCs, laptops, desktops), wireless phones, iPhones, smart phones, Mobile Internet Devices (MIDs), PDAs, etc., is vulnerable in two major ways, either physically, or by communication links. The communication links can be wired and wireless; the wireless ones are mostly RF-links, and IR-links (infrared links). The security principle applies to both. The RF-security is mostly protected by access security protocols, such as WPA and WPA2. Further embodiments of the invention are related to the physical security, in general, and to internal memory security (IMS), in particular.

The basic IMS problem is that the computer device can be stolen, tapped, or compromised another way by hostile party which can recall all device's internal memory and read any confidential, sensitive, proprietary, or other private and official data. This memory data can be encrypted by some cryptographic system (module) including algorithm and secret key. Such cryptographic modules have been standardized by NIST, including AES (Advanced Encryption Standard) used by ANSI (American National Standard Institute), and NSA (National Security Agency).

The most important cryptographic primitive is password, and the minimum requirement of "secure" system is such that the adversary, who can see the ciphertext and knows the system, still cannot recover the entire cleartext, or plaintext (so-called Kerckoff's, or Shannon's principle). The classical cryptography is symmetric cryptography, and public key asymmetric systems and trapdoor functions have been introduced only recently, in 1970s, such as the well-known RSA function. The other authentication solution is due to biometric systems, such as fingerprint recognition.

Figure 17A:
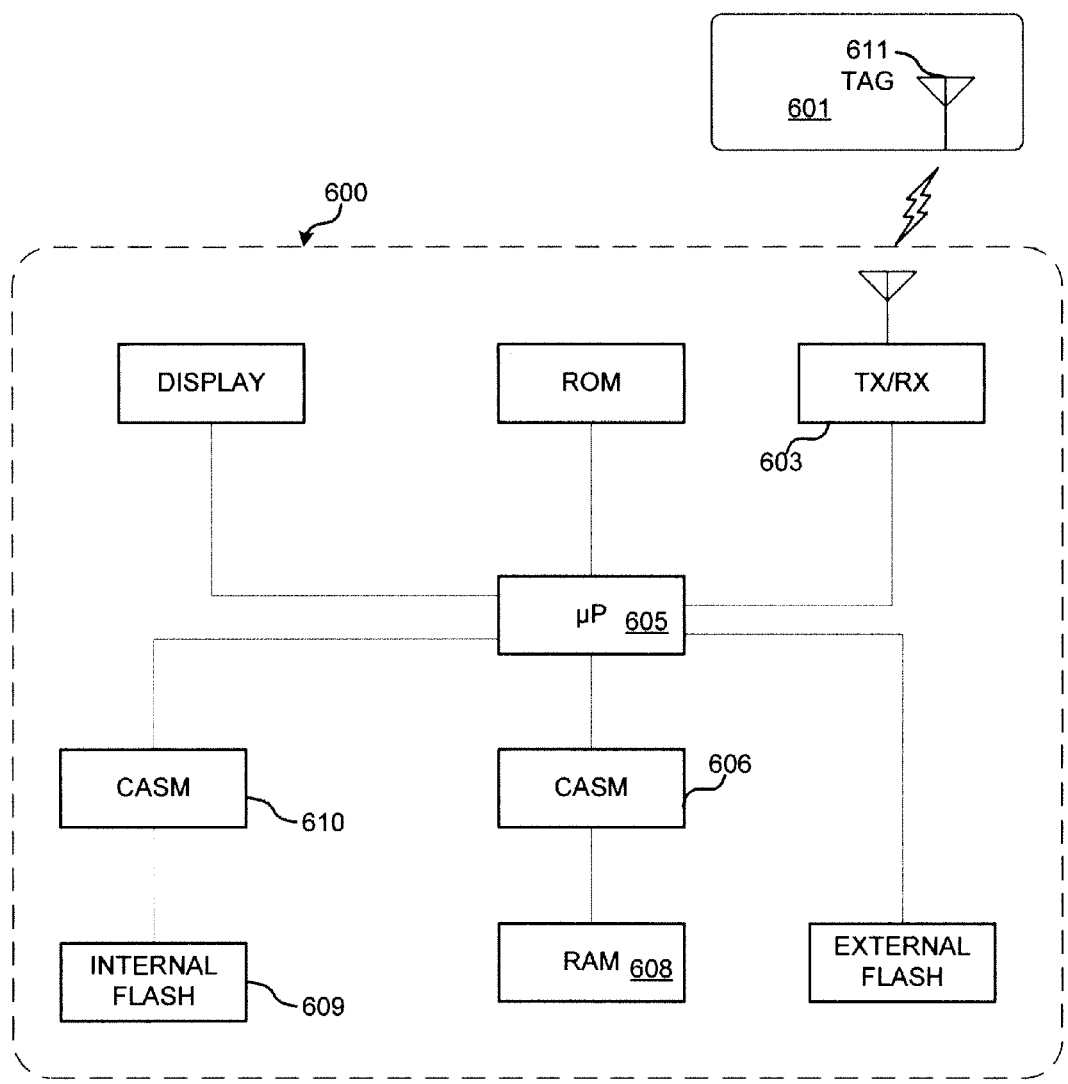
FIG. 17 illustrates a system for data security implemented in accordance with an embodiment of the invention.

Illustrated in FIG. 17a, some embodiments of the invention comprise wireless security tags 601 that interface with computing devices programmed with wedge-embedded, or wrapper-embedded software in the form of cryptographic authentication software modules (CASMs) 610, installed between the device's 600 microprocessor (μP) 605 and internal memory such as RAM 608, or internal flash memory 609. Using a token or passkey provide by the security tag 601, the CASMs 610 and 606 encrypt and decrypt data transferred between the microprocessor 605 and the internal flash 609 and RAM 608, respectively.

In the illustrated embodiment, the CASM software module 606 is a wedge (or wrapper) between the microprocessor 605 and RAM 608, or internal flash memory 609 (in the case of CASM module 610), or other internal memory for internal security purposes. It applies at least one of the following OSI layers: #2 (Link: firmware); #4 (TCP); #3 and #4 (TCP/IP); #5 (Session); and #7 (Application). SEDI (Sensitive Data Interception) is typically applied for CASMs, for encryption and decryption of data stored in internal RAM and flash memories.

In some embodiments, a CASM is a software module at an operating system level layer. For example, a PDA 600 may be programmed with a real time operating system (RTOS). The typical RTOS systems are: Microsoft Windows CE (Window embedded Compact), including Windows Mobile 5.0, or Windows CE/M; .NET Compact Framework, based on C# (C-Sharp language); Embedded Linux; and Green Hills software such as INTEGRITY. In these embodiments, the programs utilizing the memory are hosted programs that run within the frameworks provided by the RTOS. The CASM modules run between the hosted programs and the framework such the memory access by the hosted programs is secured.

In one embodiment, the CASM uses data interception to scan the bytecode of a program being secured by the CASM. For instance, the CASM intercepts and inspects the CIL (Common Intermediate Language) or JBC (Java byte code) for the Microsoft and Sun distribution, respectively. A just-in-time (JIT) compiler is then introduced by either Microsoft's Common Language Runtime (CLR) or Sun's Java Runtime Environment (JRE) virtual machines to transfer the intermediate code into machine language. The insertion of crypto functions cells by SEDI will still really be apparent for inspection of the managed code (MC) files. Additionally, the CIL can be modified by using custom libraries. In one embodiment, the CASM scans the intermediate language and inserts an encryption function drawn from the custom library when the program stores a value to memory. In this embodiment, the CASM further inserts a decryption function drawn from the custom library when the program loads a value from memory. An alternative embodiment can include hardware additions, especially in the case a second radio transceiver will be used (e.g., in addition to Wi-Fi 2.4 GHz, a 916 kHz-radio) for RF interference minimization purposes.

In some embodiments, the data interception may be performed at run-time. For example, the CASM module may operate as an add-on to the RTOS system to intercept the hosted program's intermediate language commands as they are executed. In another embodiment, the CASM module may be configured to manipulate the intermediate language prior to execution. For example, the CASM module may be configured to scan and modify any byte code or other intermediate language program as it is installed on the device. In this case, the CASM module may still operate during run-time to perform the encryption and decryption functions using keys received from the security tag 601.

Figure 17B:
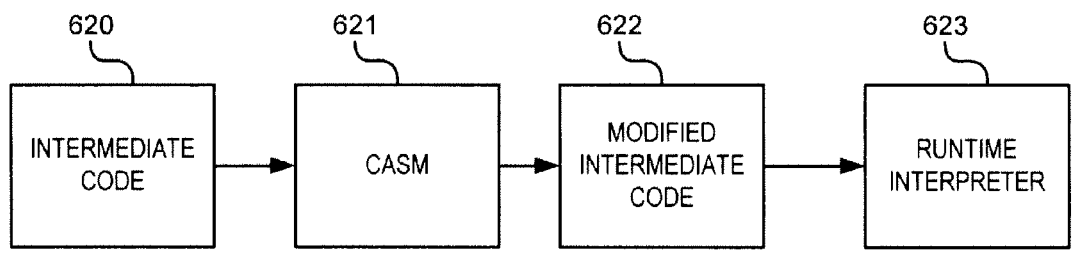

FIG. 17B illustrates the operation of a CASM module in accordance with an embodiment of the invention. In the illustrated embodiment, a program to be secured is provided to the system in the form of intermediate code 620. Typically, this intermediate code is interpreted by an interpreter or just in time complier 623 at run-time. In the illustrated embodiment, a CASM software module 621 is provided on the system to modify the intermediate 620 to generate modified intermediate code 622. As discussed above, the modified intermediate code is configured to encrypt data before storage and to decrypt data upon retrieval. The modified intermediate code 622 is then provided to the runtime interpreter 623 for system execution. Because intermediate code 620 comprises an arrangement of known standard instructions determined according to the type of interpreter 623 employed by the system, the CASM module may search the intermediate code 620 for recognized standard commands that cause memory writes and memory reads. The write code portions may then be automatically modified to form an intermediate code with encryption functions inserted at write locations and decryption functions inserted at read locations. In other embodiments, the runtime interpreter 623 may be modified itself to recognize and encrypt and decrypt memory access. Alternatively, the runtime interpreter 623 may be modified to recognize custom instructions inserted into the intermediate code 622 by the CASM module 621. The custom instructions may then be used to encrypt and decrypt the memory using the security keys provided by the CASM software.

The illustrate embodiment further comprises a security tag 601, which is a hardware and software sub-solution. In typical embodiments, the CASM software modules do not have authorization protocols (i.e., anybody in possession of the PDA could apply the software). In some embodiments, the authorization could be provided by some biometric system. However, for embodiments with increased security requirements a biometric system may be too complex and too easy to bypass by a sophisticated adversary. In these embodiments, a security tag 601 embodied in a separate form factor from the PDA 600 is configured to provide authorization to the CASM modules 606 and 610. The security tag 601 is configured with a transceiver 611 configured to communicate with a corresponding transceiver 603 in the PDA 600. In some embodiments, the transceivers 603 and 611 are standard 2.4 GHz wi-fi radios, for example as would be present on a commercial off the shelf PDA. In other embodiments, the PDA 600 further comprises a second transceiver for communications with the security tag 601, such as a 916 kHZ radio. Although these embodiments may have higher design complexity, the second radio may provide a higher degree of protection from RF interference and reduced detectability.

In further embodiments, a tag 601 may be further configured with additional components. For example, the tag may have a memory, such as an internal flash memory that allows it to act as a data repository in addition to a key server. In these embodiments, in addition to providing security keys to CASM modules, the tag may be used as an external safeguard for certain data. For example, such an embodiment may comprise a personal information carrier of the type described with respect to FIG. 13 or may be used in a compound firewall as described with respect to FIG. 18.

Figure 18:
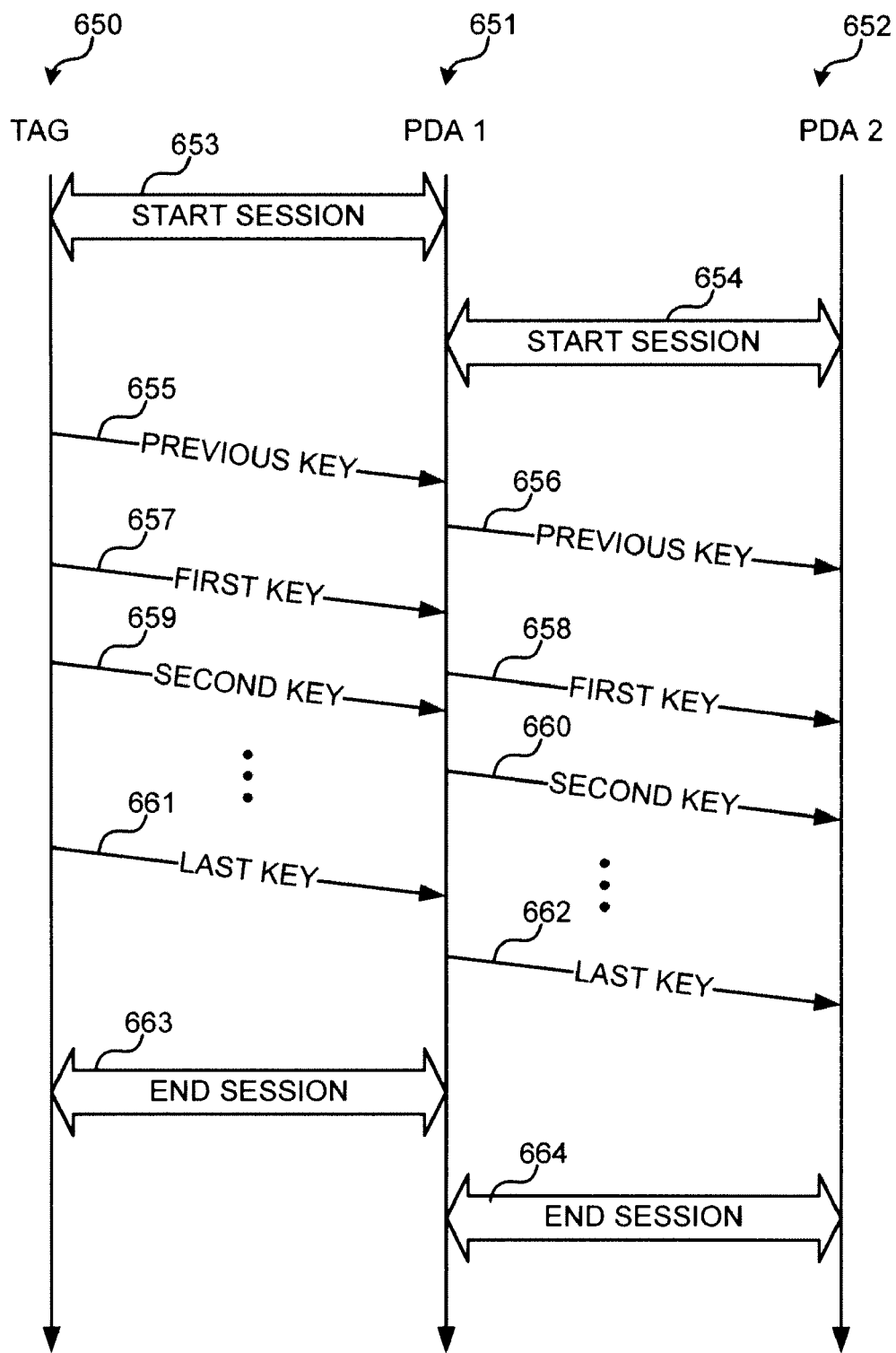
FIG. 18 illustrates a method of security key management implemented in accordance with an embodiment of the invention.

FIG. 18 illustrates a method of interaction between a security tag and a plurality of CASM enabled PDAs according to an embodiment of the invention. In some embodiments of the invention, CASM modules in a computing device are configured to receive encryption keys from an external source. The received keys are then used in cryptographic functions to encrypt and decrypt data being written and read from internal memory, respectively. In some embodiments, the received keys are received from an authenticated security tag 650. Accordingly, in order to operate an CASM enabled computing device, a security tag 650 must be within sufficient physical proximity to allow a communications session between tag 650 and computing system 651. In further embodiments, the received keys may also be received from other authenticated computing devices. Accordingly, a tag 650 may be able to provide keys to a computing device 652 that is not in physical proximity via an intermediary computing device 651.

In the illustrated process, a security tag 650 establishes a session 653 with a computing device such as a first PDA 651. In step 654, the first PDA 651 establishes a session 654 with a second PDA 652. In some particular embodiments, the communications session are established using Wi-Fi protocols and are authenticated using Wi-Fi's WPA2 encryption standards.

In some instances, a computing devices will have internal memory contents from a previous operation session, which will remain encrypted between operating sessions. In step 655, the security tag transmits the last key from the previous operating session. This allows the PDA 651 to decrypt the internal memory contents stored during the previous operation session. In step 656, the first PDA 651 relays the received previous key to the second PDA 652, enabling the second PDA to access its own internal memory.

In step 657, the tag 650 transmits the first key for the current operating session to the first PDA 651, which is retransmitted by PDA 651 to PDA 652 in step 658. The CASM modules embodied in the PDAs use the transmitted key to decrypt and re-encrypt the current memory contents using the newly transmitted key. Moreover, additional memory writes or reads are encrypted by the CASM modules using the new key, until an updated key is transmitted. In some embodiments, a separate key is used for each operating session, and steps 655-658 occur each time the PDAs 651 and 652 are activated. In other embodiments, key updates occur according to other parameters. For example, a key might be updated once an hour, or once a day, or once a minute.

In the illustrated embodiments, new keys are transmitted to the CASM modules with a predetermined frequency such that multiple keys are transmitted during a single operating session. In steps 659 and 660, a second key is transmitted to PDA 651 and relayed to PDA 652 during the operating session. The CASM modules on both PDAs then use the new key to re-encrypt the current internal memory contents using the new encryption key. This process is continued through steps 661 and 662 until the sessions are ended in steps 663 and 664. The number of times a new key is transmitted can vary significantly in various embodiments. For example, in some cases only a single new key is transmitted during an operating session, while in other embodiments, new keys may be transmitted millions of times. The security tag 650 then stores the last key transmitted in step 661 to send in the next communication session.

The methods used by the security tag 650 to generate new keys may vary in different embodiments. In some embodiments, the security tag may generate the keys itself, for example using a random process (for example, using a noisy diode number generation scheme) or a pseudorandom process (for example, using a cryptographically secure pseudorandom number generator (CPRNG)). In other embodiments, the security tag may be pre-programmed with predetermined keys, for example, the security tag may be pre-programmed with a key table of sufficient length for the particular application. In some embodiments, for additional security, the security tag is provided with enough keys or is provided with a CPRNG with a sufficiently long period that each key is only used once.

In further embodiments, the CASM modules are programmed with a time limitation, within which they must be provided a new key. For example, a time limitation might be 1 hour. In such a case, after 1 hour, the internal memory data will be erased, partially, or completely, unless the security tag sends a new key. Although this requires that the security key and computing system remain in physical proximity, or come into physical proximity regularly, it can increase the security level of the computing system by placing a time limitation on decrypting the data in the internal memory.

In some embodiments, the security tag is placed in a physically secure, concealed, or inaccessible location. For example, the security tag is embedded in a wall of a building, buried under or embedded within concrete, or is implanted under the skin of a field operative. In these embodiments, a range surrounding the security tag is established that allows devices within that range to have a secured internal memory through a continuously operating process of the type described in FIG. 18. In a particular embodiment, the secure location of the security tag allows the security tag to be used for anti-tampering or inventorying sensitive computing equipment. In this embodiment, the CASMs embodied on the computing equipment to be protected are configured to require a key update within a certain time limit, as described above. If this key update does not occur, then the CASMs are configured to erase the memory of the computing equipment, thereby protecting information stored on the computing equipment from theft. In these embodiments, if the security tag is not provided an external power source, it may be configured to have an extended MTBR. In some embodiments, the extended MTBR may be multiple years, for example, between 3 and 30 years, or more. This may be achieved in a variety of manners. For tags where the size is not a limiting factor, such as tags embedded in concrete or other locations in a building, the tags may be provided with a sufficiently large and stable power source for the extended operation. In other embodiments, methods of energy harvesting, as discussed below may be included in the security tag.

In some embodiments, the secure wireless link between a security tag and a computer can be used as a compound fire wall against fraud in medical billing situations. In a typical electronic medial record (EMR) medical billing situation, a doctor informs a nurse of a patient's diagnosis and treatment. Medical codes are based on translating long-hand description of medical conditions and medical treatment into numerical code, following the International Classification for Disease, or ICD. Using these codes, the nurse then enters the data into an EMR using EMR software on a computer system. A billing department then uses the EMR to generate an invoice that is transmitted to a 3rd party, such as an insurer, who pays for the treatment. In some cases, the generated invoices do not accurately reflect the patient's treatments costs and the 3rd party payer can be overcharged. This can result in accusations against the nurse's integrity.

In one embodiment of the invention, a device based compound firewall (CFW) is implemented as an anti-fraud measue. The compound firewall device applies password protection at OSI Application Layer #7, as well as extra wireless-link protection at OSI Session Layer #5, by using a security tag of the type described with respect to FIG. 18 with a tag-specific API (application program interface) and data transfer (DTW) software. The software is compatible to a standard medical system either military (such as AHLTA or VISTA), or civilian ones, and to the standard *Windows® CE/Mobile* 5.0 *RTOS* and *Microsoft's .NET® Compact Framework* 2.0, based on the C# programming language, or other standard wireless RTOS system. For example, it can be compatible to AHLTA-M which is the mobile version of the AHLTA. In some embodiments, the AF-tag wireless solution is based only on microcontrollers (μC) such as PICs, or ARM-7s, that execute fixed, hardware-based firmware, as opposite to rewritable memory-resident software being run on a Pentium processor, for example. Therefore, the AF tags are not able to receive any new instructions (such as those from malicious software agents); thus, the AF-tag is resistant to attack by malicious software, at least on OSI Layer 7 (i.e., including viruses).

Figure 19:
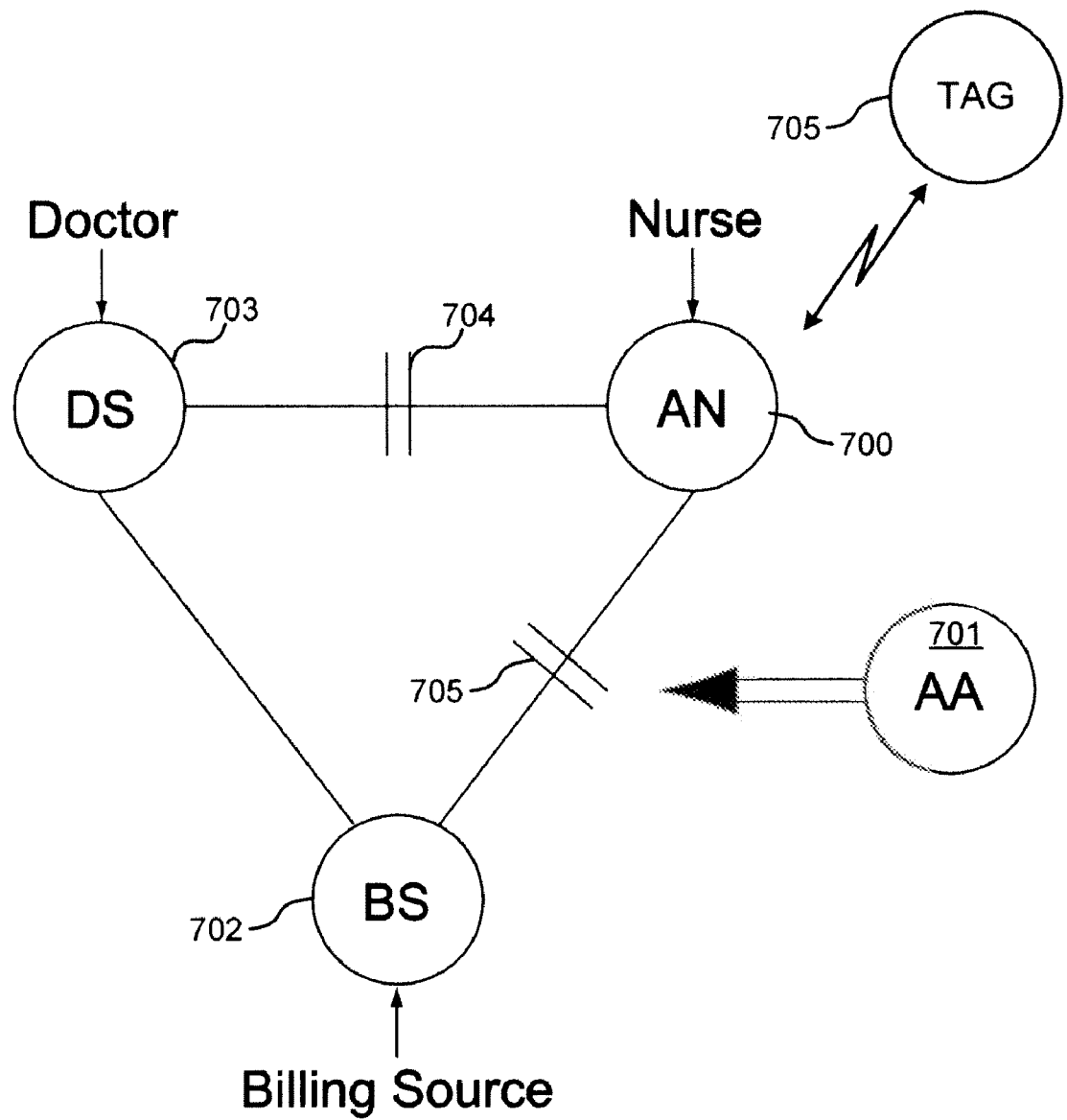
FIG. 19 illustrates a compound firewall implemented in accordance with an embodiment of the invention.

FIG. 19 illustrates a compound firewall according to an embodiment of the invention. In this embodiment, a designated computer system 700 is provided for use by a nurse in billing practices. The nurse's computer system 700 interfaces with a security tag 705 as described with respect to FIG. 18. The computer system 700 is configured to communicated with a doctor's computer system 703 and a billing source's computer system 702. The computer system 700 stores diagnosis and treatment record entries generated by diagnosis and treatment information transmitted by computer system 703. Computer system 702 is provided with access to these records for invoice generation.

The computer system 700 is configured with CASM software modules that protect the medical records stored on the system. This is achieved through interface with a tag 705, as described with respect to FIG. 18. Additionally, the tag 705 is configured to store backups of medical records generated at computer system 700. In a particular embodiment, when a medical record is finalized, the user of system 700 enters a finalization command that causes the finalized medical record to be stored in tag 705. In this embodiment, the memory in the tag 705 is protected using encryption with an encryption key that is available only to an authorized auditor 701, such as an insurance company or other medical bill paying party. Accordingly, a compound firewall 704 and 705 is established between the doctor's system 703 and the nurse's system 700 and the billing system 702.

In a particular embodiment, the tag 705 has a small form factor designed to be worn on a wristband or necklace. The tag 705 must then be worn by the user of system 700 to gain editing access to stored medical records. Additionally, each time a particular medical record is edited, the medical record is backed up to the tag 705. Accordingly, the stored medical records are protected from tampering because editing access requires physical access to tag 705. The stored medical records are further protected from tampering, even from parties with physical access to tag 705, because no party other than an authorized auditor 701 is given access to the backup memory of tag 705.

In some further embodiments, the tag 705 is provided with an access port for a card or other device that can be coupled to the tag to allow access to the tag's 705 memory. A plurality of tags 705 may be used throughout a medical environment such as a hospital. The plurality of tags 705 may all accept the same access device, which is physically kept by the authorized auditing party. Accordingly, the access device may be used to conduct full audits of the medical environment without risk of password disclosure to unauthorized parties. In still further embodiments, the tag or access device may be equipped with biometric security systems, such as fingerprint readers, to further ensure that only the authorized auditing party has access to the backup records.

A typical battery self-discharge current, $I_D$, is not constant, but is proportional to the battery latent charge, Q, at a given time; i.e., $$Q=Q(t) \tag{56}$$

Figure 20A:
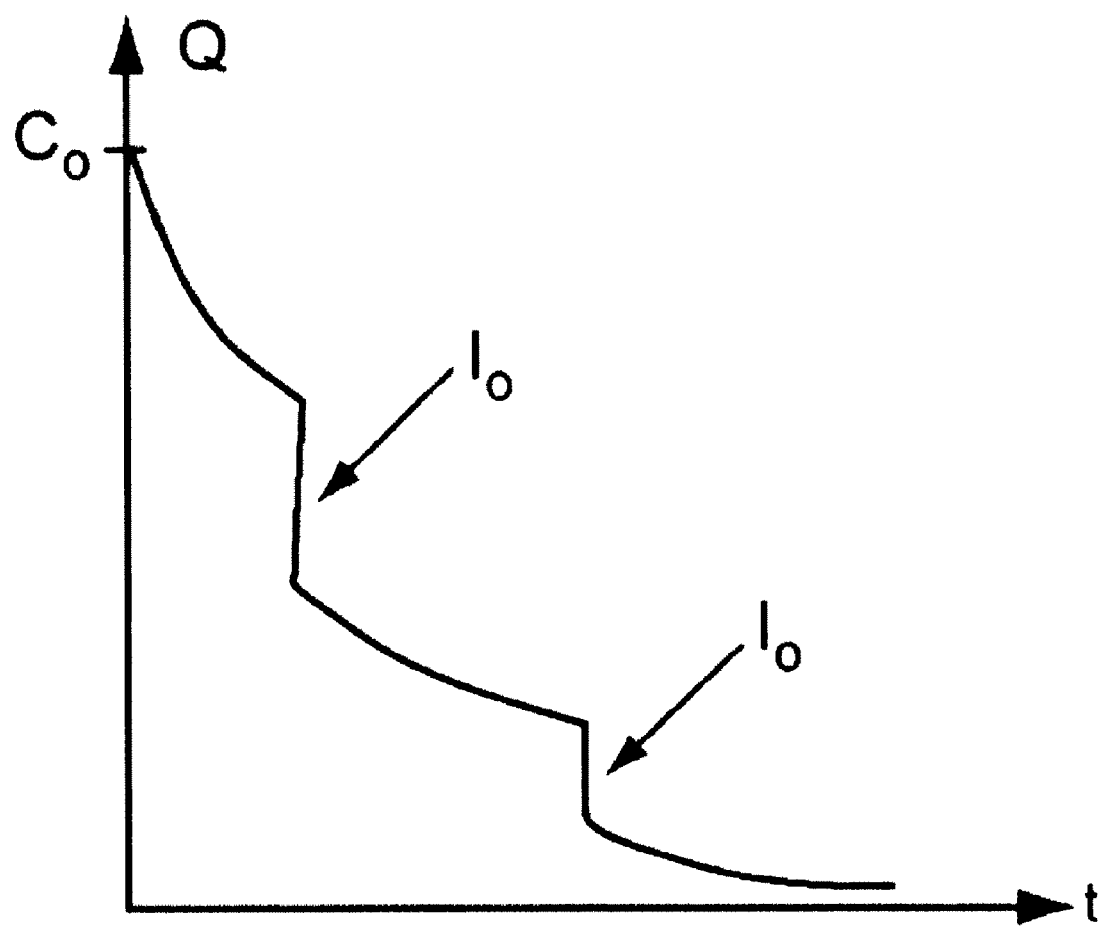
FIG. 20 is a graph illustrates battery capacity over a predetermined time scale for use in methods of power management implemented in accordance with an embodiment of the invention.
Figure 21:
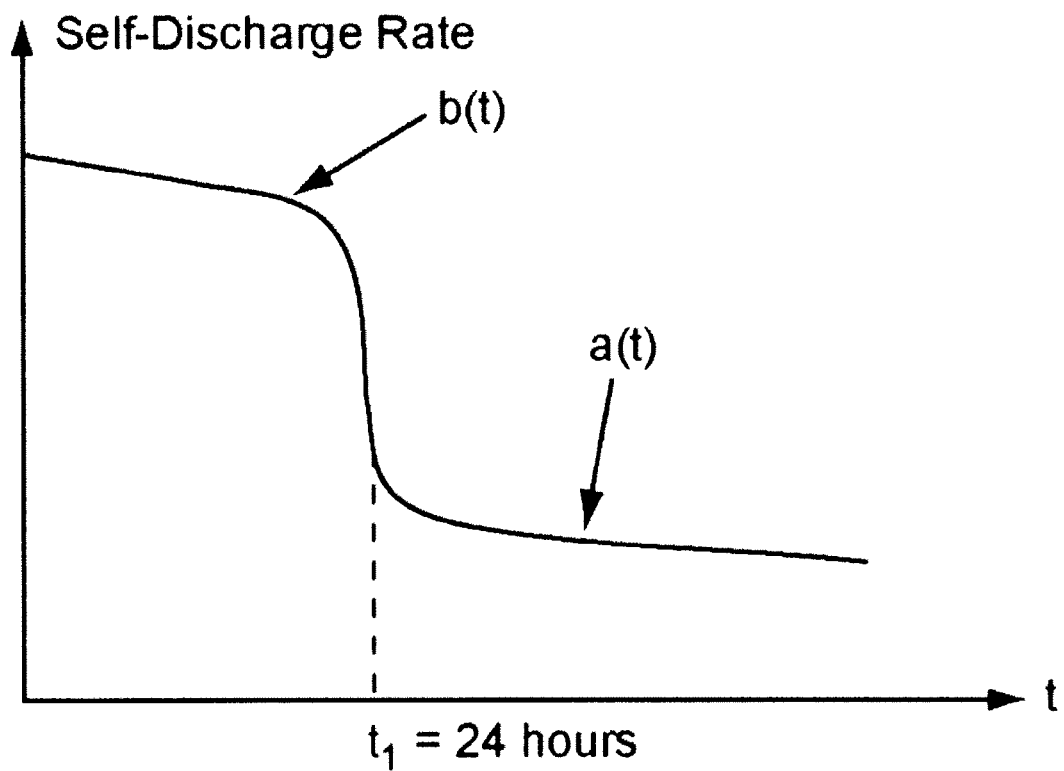
FIG. 21 illustrates changes to a battery self discharge rate after a predetermined time for use in methods of power management implemented in accordance with an embodiment of the invention.

The situation is further complicated by the fact that the instant latent charge value, Q(t), depends on the system operation, especially how much the operation current, $I_o$, has been used. FIG. 20 illustrates this situation, where under the time scale of the t access, the operational period is considered nearly instantaneous. Therefore, the easiest $I_D$-modeling is for the battery on-the-shelf operation; i.e., when all operation currents are zero. In such a case, the temporal Beer's law holds, as a consequence of the following time-rate formula:

$$-\frac{dC}{C} = b(t)dt \tag{57}$$

where b-parameter is fast self-discharge rate that holds for, approximately, first 24 hours of battery self-discharge. Later, this value is reduced to much smaller self-discharge rate, a(t), as shown in FIG. 21.

For the time value higher than 24 hours, a similar formula to that in Eq. (57) applies:

$$-\frac{dC}{C} = a(t)dt. \tag{58}$$

Typically, b-values are in the range of 0.05/24 hours, or $$b=0.05/24 \text{ hours}=2.1 \cdot 10^{-3} h^{-1} \tag{59}$$

while, a-values are in the range of 0.05/mo., or $$a=0.05/\text{mo.}=0.05/730.5 \text{ h}=6.8 \cdot 10^{-5} h^{-1} \tag{60}$$

where the average month, averaged over 4 earth years, is 730.5 hours. From Eq. (57), the following general mathematical solution is obtained:

$$C(t) = C_o e^{-\int_0^t b(t)dt} \tag{61}$$

where $C_o=C(0)$, and $t \leq t_1 = 24$ hours. For $t > t_1$, $$C(t) = C_1 e^{-\int_{t_1}^t a(t)dt} \tag{62}$$

where $C_1=C(t_1)$. Assuming, for simplicity, the constant values for a,b-parameters, then Eqs. (61) and (62) collapse into the following simplified relations:

$$C=C_o e^{-bt}, C=C_1 e^{-a(t-t_1)}, C_1=C_o e^{-bt_1}. \tag{63}$$

By applying Eq. (63) the following relation is obtained for average self-discharge current, $\langle I_D \rangle$, within $t \leq t_1$:

$$\langle I_D \rangle = \frac{C_o - C_1}{t_1} = \frac{C_o(1 - e^{-bt_1})}{t_1} \quad (64)$$

where for: $bt_1 \ll 1$, this relation simplifies into the following approximate relation:

$$\langle I_D \rangle \cong \frac{C_o[1 - (1 - bt_1)]}{t_1} = C_o b; bt_1 \ll 1. \quad (65)$$

For $b=0.05/24$ hours, we obtain $bt_1=0.05 \ll 1$; so, Eq. (65) holds.

In the case where device operation with operating current $I_0$ occurs, the above equations do not hold, so, the iterative formulas have to be applied, as discussed above. In some cases however, for evaluation purposes, approximate formulas can be applied, when two special cases are of interest:
 a) MTBR$\gg t_1$
 b) MTBR comparable with $t_1$-values.

Case (a). In this case the following approximate formula is applicable:

$$\langle I_D \rangle_2 = a\langle Q \rangle; \langle \theta \rangle = \frac{Q_1 + Q_2}{2} \quad (66)$$

where $Q_1 = C_1$ and $Q_2 = C_o$ g=(0.2) (300)=60 mA·h.

EXAMPLE 1

$a=0.05/\text{mo}$, $b=0.05/24$ h, $C_o=300$ mA·h, $g=0.2$.

From Eq. (63), $C_1 = C_o e^{-0.05} = 0.951 C_o$, and $Q_2=300 (0.2)=60$ mA·h; thus, $C_1=285$ mA·h, and $\langle \theta \rangle = 172.5$ mA·h. Therefore, $$\langle I_D \rangle_2 = \left(\frac{0.05}{730.5}\right)(172.5) = 11.8 \ \mu A. \quad (67)$$

Case (b). For such a case, and for $t \leq t_1$, the following approximate formula ($b=0.05/24$ h) is applicable:

$$\langle I_D \rangle_1 C_o b = \left(\frac{0.05}{24}\right)(300) = 0.625 \text{ mA} \quad (68)$$

and, for $t > t_1$, formula (67) is applied. Accordingly, this shows that the fast self-discharge current (625 μA) is much larger than slow self-discharge current (11.8 μA).

In the case when there is no operation during $t \leq t_1$, and MTBR$\gg t_1$, the MTBR-value starting from $t=t_1$ can be calculated, and one day can be added. Then, applying the approximate formula (66) confirms the accuracy of the approximation.

The CONOPS coefficient, $k^{(i)}$, defined by Eq. (10), allows the introduction energy-centric tunable functionality (ECTF) for every ith-device, defined by the following formula:

$$\langle I_{TD} \rangle = \sum_{i=1}^{M} k^{(i)} \langle I^{(i)} \rangle \quad (69)$$

where $\langle I^{(i)} \rangle$ is the average (mean) current of the ith device, and $\langle I_{TD} \rangle$ is the total (device) current, excluding the self-discharge current $\langle I_o \rangle$, as in Eq. (40), for example, where M is a number of devices. In comparison to equation Eq. (40), the $I^{(i)}$—value has been replaced by the average (mean) value, $\langle I^{(i)} \rangle$. This is because this section considers such situation that the functionality of the device can be reduced for power consumption minimization purposes. In some embodiments, when, during operation the battery latent charge has been reduced to a predetermined low value, such as 30% for example, of battery capacity $C_o$, some lower priority devices reduce their functionality. Following the ECTF rule, $\langle I^{(i)} \rangle$-value decreases. Such scenarios can be included in the voltage-based Iterative Power Management Algorithm (VIPMA) described above. In some embodiments, this algorithm could be installed in a personal information carrier, a sensor node, a sensor network node, a distributed werable computer, or other device or system described herein, as a software addition. In further embodiments, the VIPMA can also produce various alarms that are transmitted to a system user, such as yellow and red alarms. For example, a yellow alarm could occur when the latent charge status is such that:

$$Q = \epsilon C_o; \epsilon < 1 \quad (70)$$

where $\epsilon$ is a predetermined VIPMA parameter describing how much latent charge has been left, before the battery stops working. This parameter is typically around 20% ($\epsilon=0.2$) for typical rechargeable batteries and much less (e.g., $\epsilon=0.01$) for primary batteries. Therefore, for the yellow alarms, typical embodiments set $\epsilon=0.3$ for rechargeable battery. A red alarm can be used to alert a system user of more severe power reduction, for example, a red alarm could occur at c=0.25, for example.

In some embodiments, power control is implemented at the multiple alarm points. For example, in the case of the yellow alarm, or red alarm, two types of power reduction can be applied. At a yellow alarm point some $I^{(i)}$-values are reduced and at a red alarm point, further $I^{(i)}$ values are reduced. In some embodiments, the step of reducing $I^{(i)}$ values at the red alarm point further includes applying ECTF to reduce the functionality of connected devices. As an example of the ECTF, a color display image might be replaced by a black-white one. As another example, a middle sleep state could be replaced by a deep sleep state of a wearable computer. In such a case the wake-up can take more time, but the functionality will be reduced, leading to the reducing power consumption. As a result, the $\langle I_{TD} \rangle$-value will be reduced; thus, increasing battery run time. In further embodiments, extra VIPMA regulations include a) $k^{(i)}$—regulation; b) $I^{(i)}$—regulation; or c) dual (or more) alarm system addition.

Figures 22A, 22B, 22C, 22D, 22E:
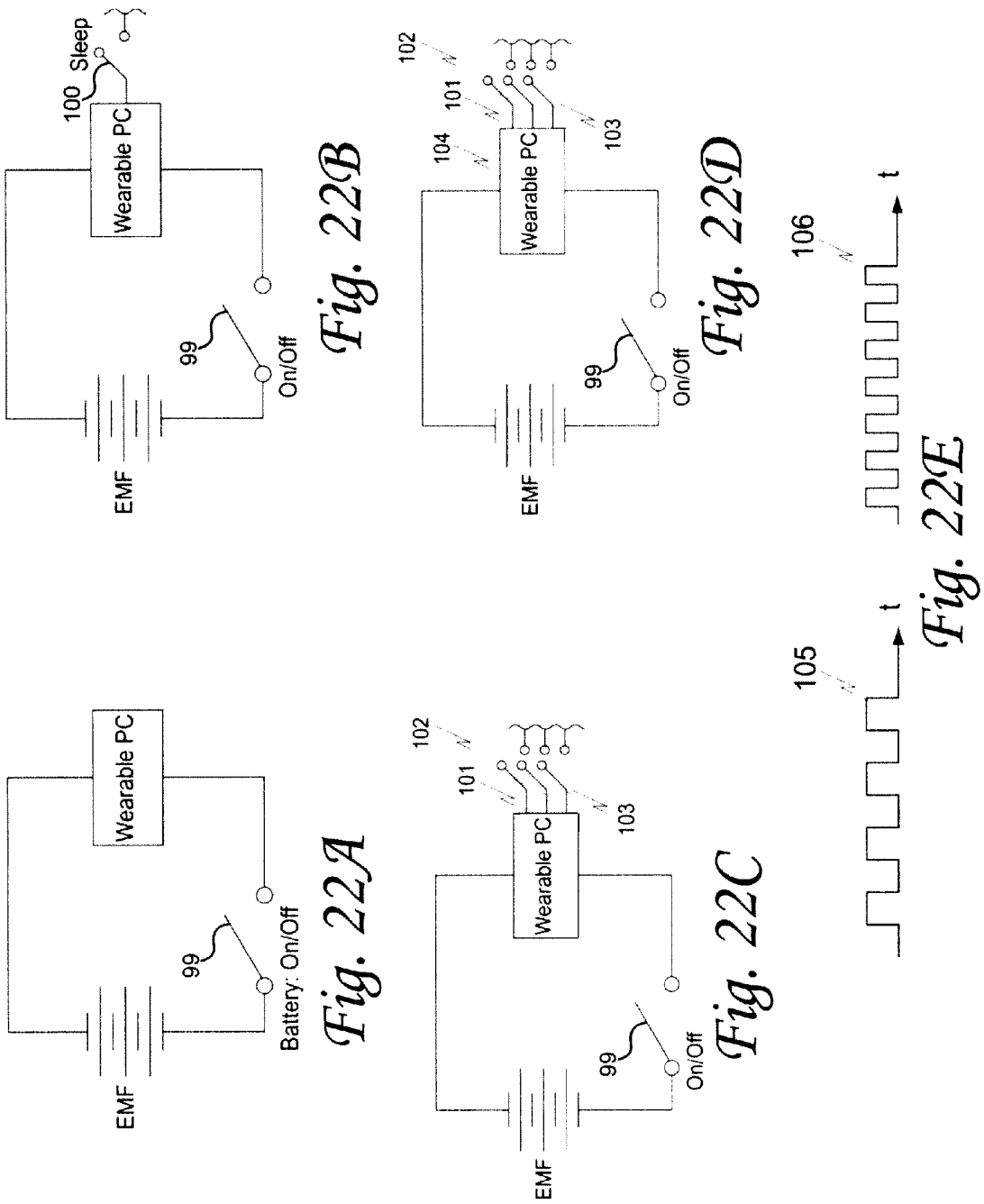
FIG. 22 illustrates examples of power saving regulations that may be employed in some embodiments.

FIG. 22 illustrates examples of power saving regulations that may be employed in some embodiments. FIG. 22A illustrates the case where the device, here a wearable PC, is disconnected from the battery. In some embodiments, this power saving measure may be employed as a last resort power saving mode. In other embodiments, this power saving measure may be employed as a default power saving mode, for example in embodiments having relatively simple control systems, such as personal information carriers. FIG. 22B illustrates an additional power save mode comprising a sleep state 100. In some embodiments, the sleep state 100 may comprise hibernating the connected device, or disconnecting power from various peripheral devices. In embodiments employing alarms, a yellow alarm may trigger the device to enter into sleep state 100, while a red alarm may trigger the device to disconnect the battery 99. FIG. 22C illustrates a system employing a plurality of sleep states 101, 102, and 103. In some embodiments, these sleep states may be entered into as triggered by a corresponding plurality of alarm states, and may represent an iterative decrease in device functionality. For example, sleep state 101 may comprise disconnecting non-essential peripherals, sleep state 102 may comprise entering a black-and-white mode instead of a color mode for a wearable PC having a display, and sleep state 103 may comprise saving the current device state to RAM and deactivating most device functions. FIGS. 22D and 22E illustrate an additional mode of reducing functionality 104, comprising a computer system reducing its clock rate from a high rate 106 to a lower clock rate 105. In some embodiments, this additional functionality reduction may be performed when triggered by an additional alarm, or may be performed in conjunction with other sleep state behaviors.

Figure 23:
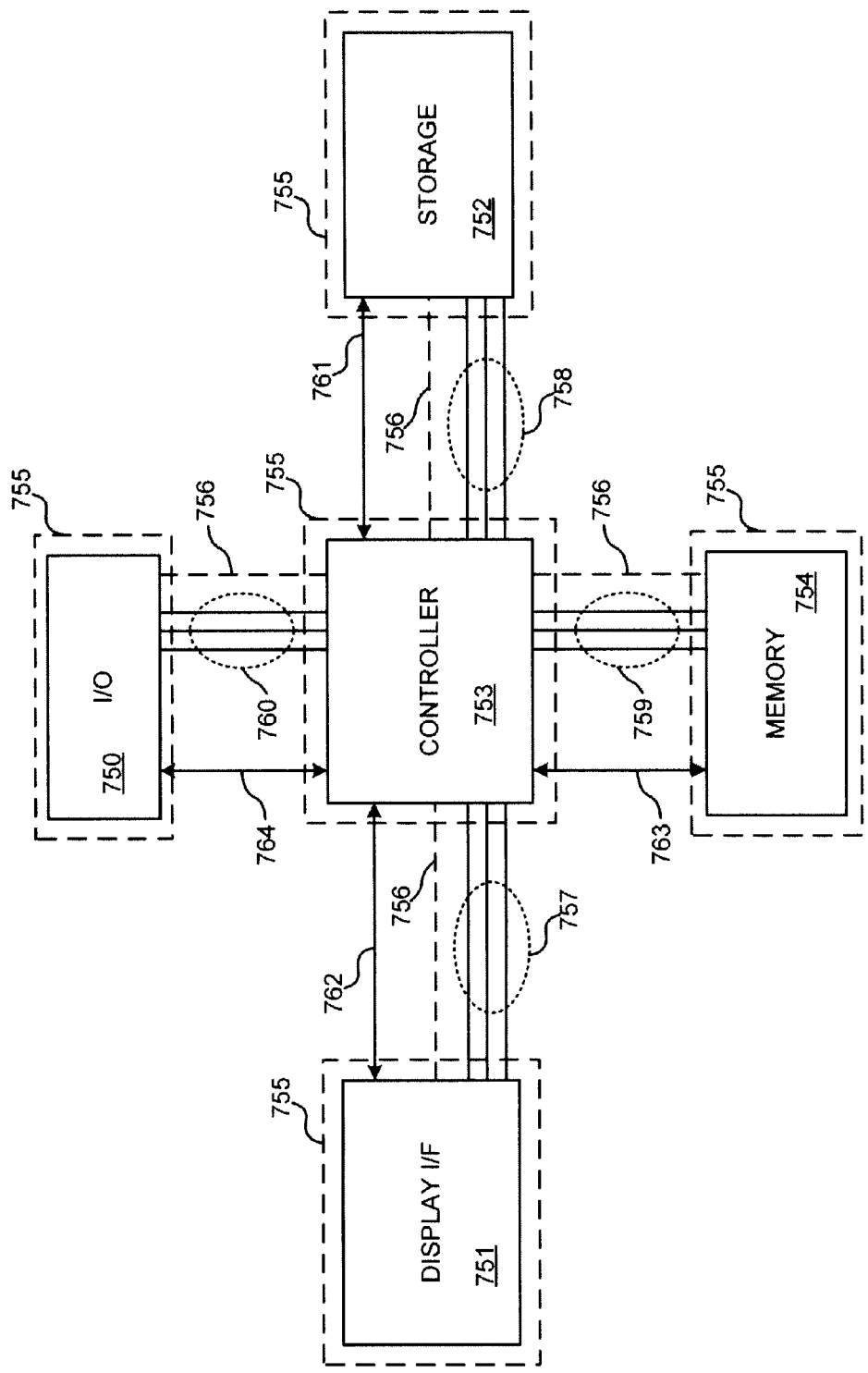
FIG. 23 illustrates an embodiment of the invention comprising a distributed wearable computer.
Figure 27:
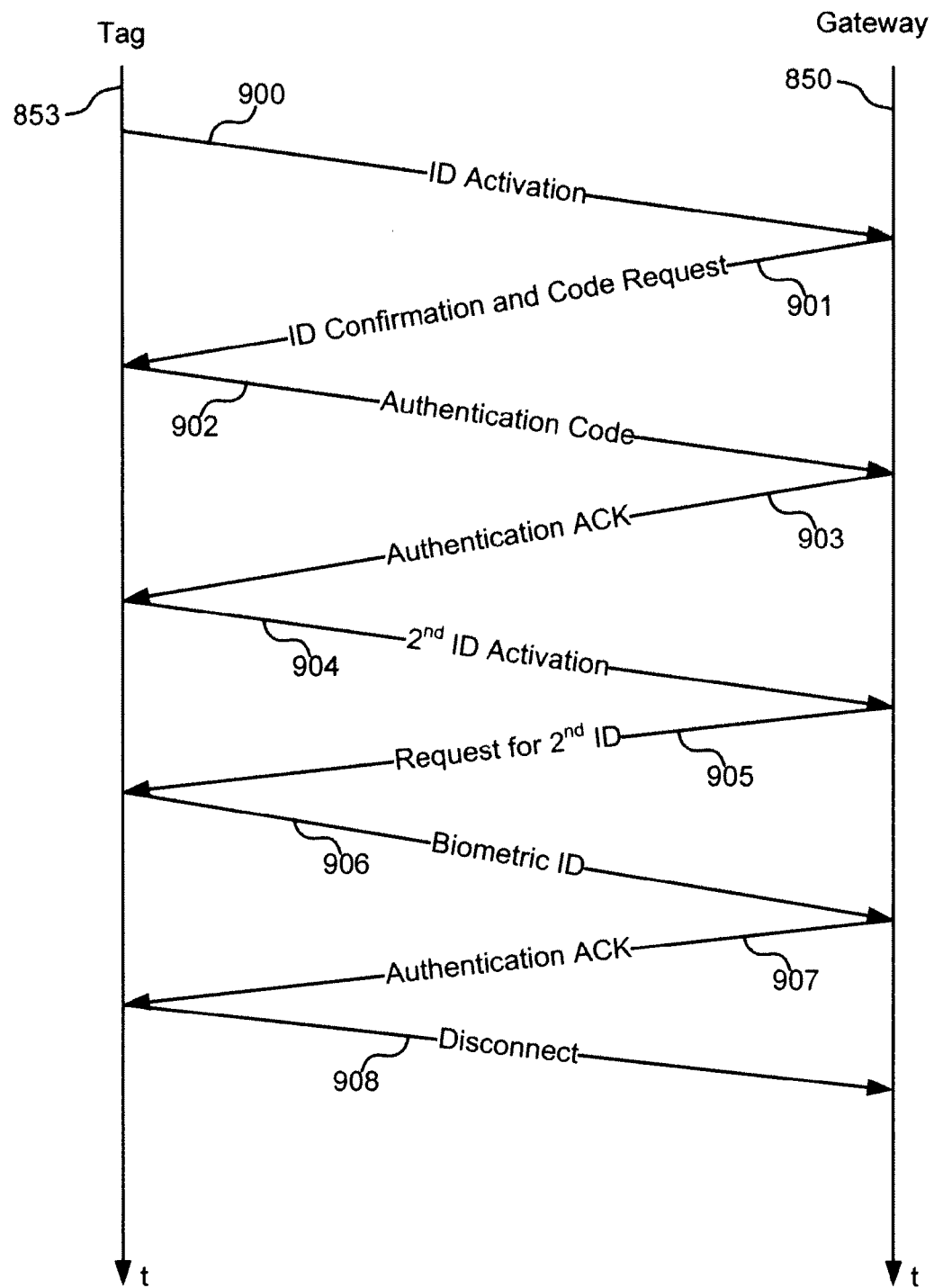
FIG. 27 illustrates how the system of FIG. 26 may be used for authorization and restricted access according to an embodiment of the invention.

FIG. 23 illustrates an embodiment of the invention comprising a distributed wearable computer (DWC). This embodiment may employ the ECTF feature in the form of various sleep types of various clock rates as described above. The power consumption of such DWC is proportional (approximately) to its clock rate. Therefore, it is higher for clock rate 106, compared to clock rate 105. In FIG. 27, further DWC features are added. Rather than a typical wearable PC that has critical sub-systems such as display, μC/μP, storage, and memory integrated into one packaging with a possible single shielding or EMI/environmental housing, the DWC of FIG. 23 has a modular or distributed architecture. In one embodiment, the DWC comprises a central controller module 753 that may comprise a microprocessor, a microcontroller, or other control module, and other control features typically found on a computer motherboard. Controller module 753 is connected 759, 758, 757, and 760 with a memory module 754, a storage module 752, a input/output (I/O) module 750, and a display module 751, respectively. In some embodiments, a battery module may from a sixth separately connected module, or may be integrated with one of the illustrated modules. In further embodiments, for example in field wearable computers for sensitive field operations, the DWC may comprise shielding 755, and 756, such as TEMPEST shielding. Accordingly, the illustrated conformable and comfortable for human body, if it is pack-wearable by an operator at his/her back.

In the illustrated embodiment, the connection distances between the modules are adapted according to the communication bandwidth required by the various modules. Different interfaces between the modules must be synchronized to different interface throughputs and various connection lengths, in order to make this concept functionally-effective, power-centered and conformable/comfortable to human body. Therefore, it is also important to determine the maximum length of these connections. Also, after distribution of those modules, we need to provide the separate shielding for all these modules. If the data transfer throughput (speed) is very fast, the related connections lengths must be very short (1 cm); otherwise, they can be larger. For example the connection between controller 753 and memory 754 must be very fast (for example, on the order of multiple Gbps); thus, its length is restricted to a few cm. A similar situation is for interface between display 751 and controller 753 where the speed is in the range of 500 Mbps. However, the connections between controller 753 and I/O 750 and between 753 and storage 752 are slower; so, the connection lengths can be longer, <40 cm and <100 cm, respectively. In other embodiments, the functionality of some modules may be incorporated into a single module, for example a touchscreen display may operate as display 751 and I/O 750, in which case the above distances may be correspondingly adjusted. In some embodiments, connections 759, 758, 760, 756 may comprise conductive fabric connections that also serve as harnesses or straps between the devices.

Figure 24:
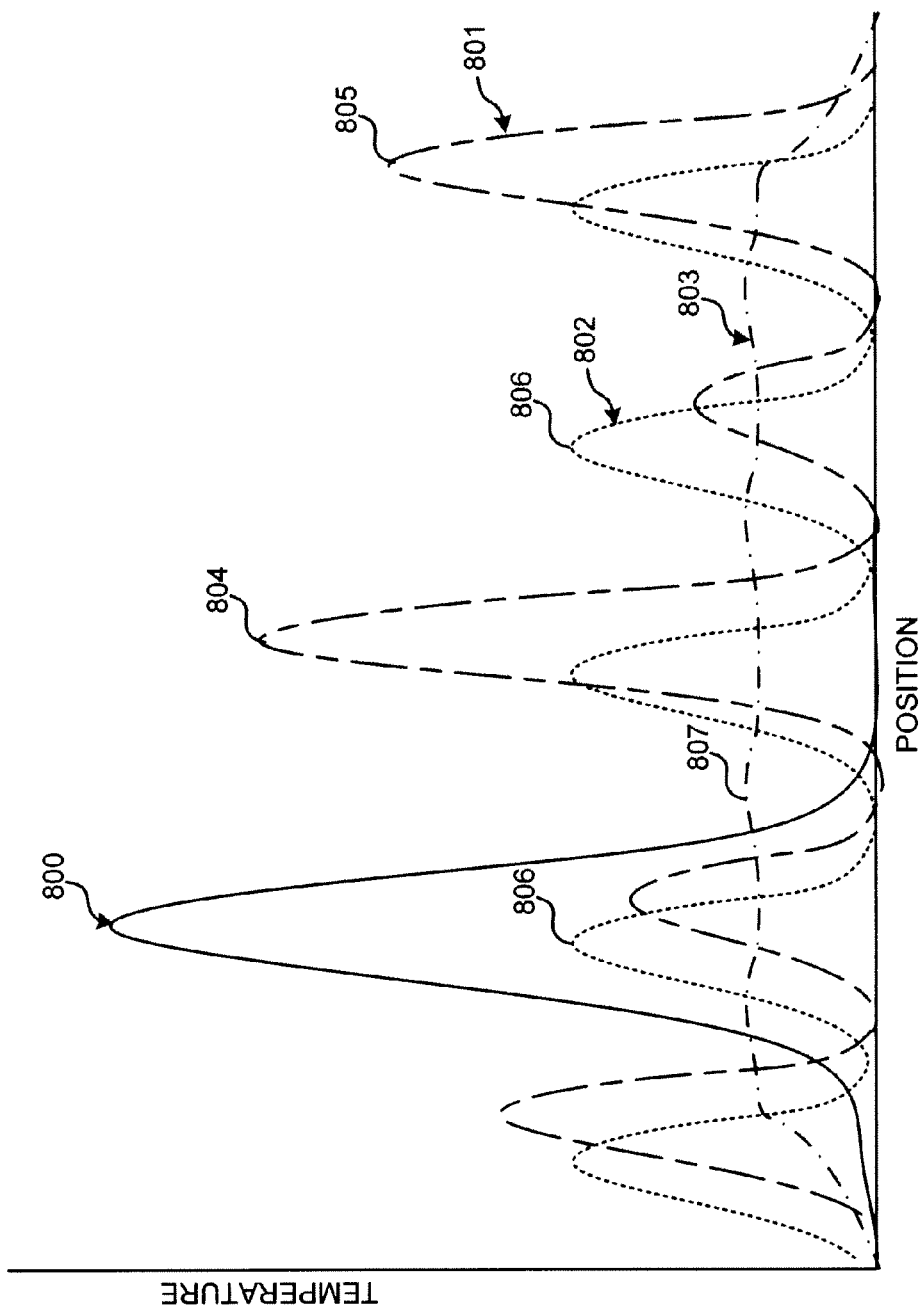
FIG. 24 illustrates the heat signatures of some embodiments of the invention as compared to a typical field wearable computer.

In still further embodiments, the connections may serve as heat dissipating or conducting elements. FIG. 24 illustrates the heat signatures of some embodiments of the invention as compared to a typical field wearable computer. In a typical field wearable computer, all of the heat produced by the computer is located at the single computer housing, producing a heat signature 800 having a distribution centered around the single computer location.

Different DWCs may have different heat signatures according to various embodiments. Heat signature 801 illustrates a DWC without heat distributing or dissipating connectors. Different modules produce different amounts of heat, so that heat signature 801 appears as a plurality of peaks, such as 805 and 804, with different heights. Although, since the heat producing elements are still physically distributed, no single peak is a large as the case of the single wearable computer. Heat signature 802 illustrates the case of heat distributing connectors. In some embodiments, heat distributing connectors, such as phase change material based heat conductors may be used to distribute the heat produced the system among all the modules, resulting in a heat signature 801 comprising a plurality of equal peaks 806. Heat signature 803 illustrates the case where the connectors additionally dissipate heat, so that heat is distributed throughout the system, and the heat signature 803 appears as a generally plateau shape 807. As the examples illustrate, the maximum heat produced by various embodiments may be tailored by incorporating heat conducting or dissipating connectors between some or all of the distributed system modules. This may serve to increase the wearer's comfort by avoiding uncomfortable hot spots, or to increase security in cases where a low general heat signature is preferred.

Figure 25:
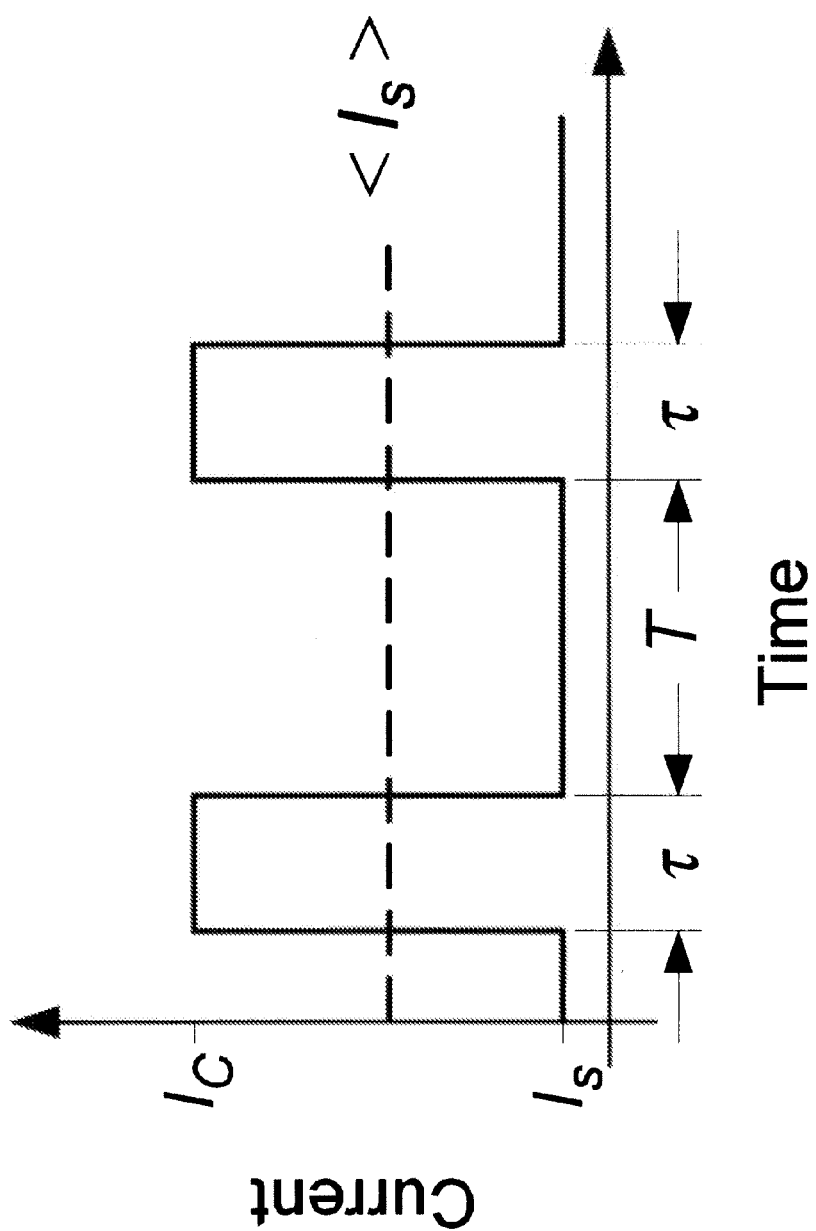
FIG. 25 illustrates a current distribution for a single-radio trigger radio implemented in accordance with an embodiment of the invention.

Many embodiments described herein employ a dual radio concept based on two cooperative radios: high-bandwidth (higher power) and lower bandwidth (lower power). However, these embodiments may also employ a single radio, based on two currents, sniff current, $I_c$, and sleep current, $I_s$, for the trigger radio, as shown in FIG. 25. FIG. 25 illustrates a current distribution for a single-radio trigger radio, illustrating a pseudo-dual-radio (PDR) approach including: sleep current, $I_s$, sniff current, $I_c$, and the average current, $\langle I_s \rangle$, where τ is $I_c$—current duration and T is $I_s$—current duration.

In this case, we can apply dual-radio (M=1) formulas (14), (15), (16), and (17), by writing: $I_o^{(1)}=I_c$, in the form (see, Eq. (17)):

$$\langle k_o^{(1)} \rangle = \frac{I_s + \langle I_D \rangle}{I_c}. \tag{71}$$

We can also add other devices (M>1). This is under assumption that: τ<<T, which is usually satisfied, (and if not, these equations may be modified as appropriate). Then, $$k^{(1)} = \frac{\tau}{\tau + T} \cong \frac{\tau}{T} \tag{72}$$

where τ is the sniff-current duration and T is the sleep current duration. Then, the total current, $\langle I_T \rangle$, is $$\langle I_T \rangle = I_c k^{(1)} + I_s + \langle I_D \rangle \tag{73}$$

where $k^{(1)}<<1$. Then, $I_c$—value can be relatively large, 20 mW, for example, while $I_s$ is a small value; e.g., $I_s$=30 μA. Then, for $k^{(1)}=10^{-3}$, and $\langle I_D \rangle$=4 μA, we obtain $$\langle I_T \rangle = (20 \text{ mA})(10^{-3}) + 30 \text{ μA} + 4 \text{ μA} = 20 \text{ μA} + 30 \text{ μA} + 4 \text{ μA} = 54 \text{ μA} \tag{74}$$

and, for the initial (after the 1st 24 hours) latent charge value: $Q_o=200$ mA·h, we obtain $$(MTBR) = \frac{Q_o}{\langle I_T \rangle} = \frac{200 \text{ mA·h}}{54 \text{ μA}} = 3704 \text{ h} = 5.1 \text{ mo} \quad (75)$$

assuming 730.5 hours/mo., average over 4 years period. For such larger MTBR-values, it is reasonable to replace the rechargeable battery by primary battery. Then, we can assume $Q_o$—value at least two-times larger, leading to MTBR-values, approaching 1 year. It should be noted that the "low-bandwidth" trigger radio has usually quite reasonable bandwidth (e.g., 128 kbps) which can be used for the on-demand-mode (ODM) operation described herein.

Figure 26:
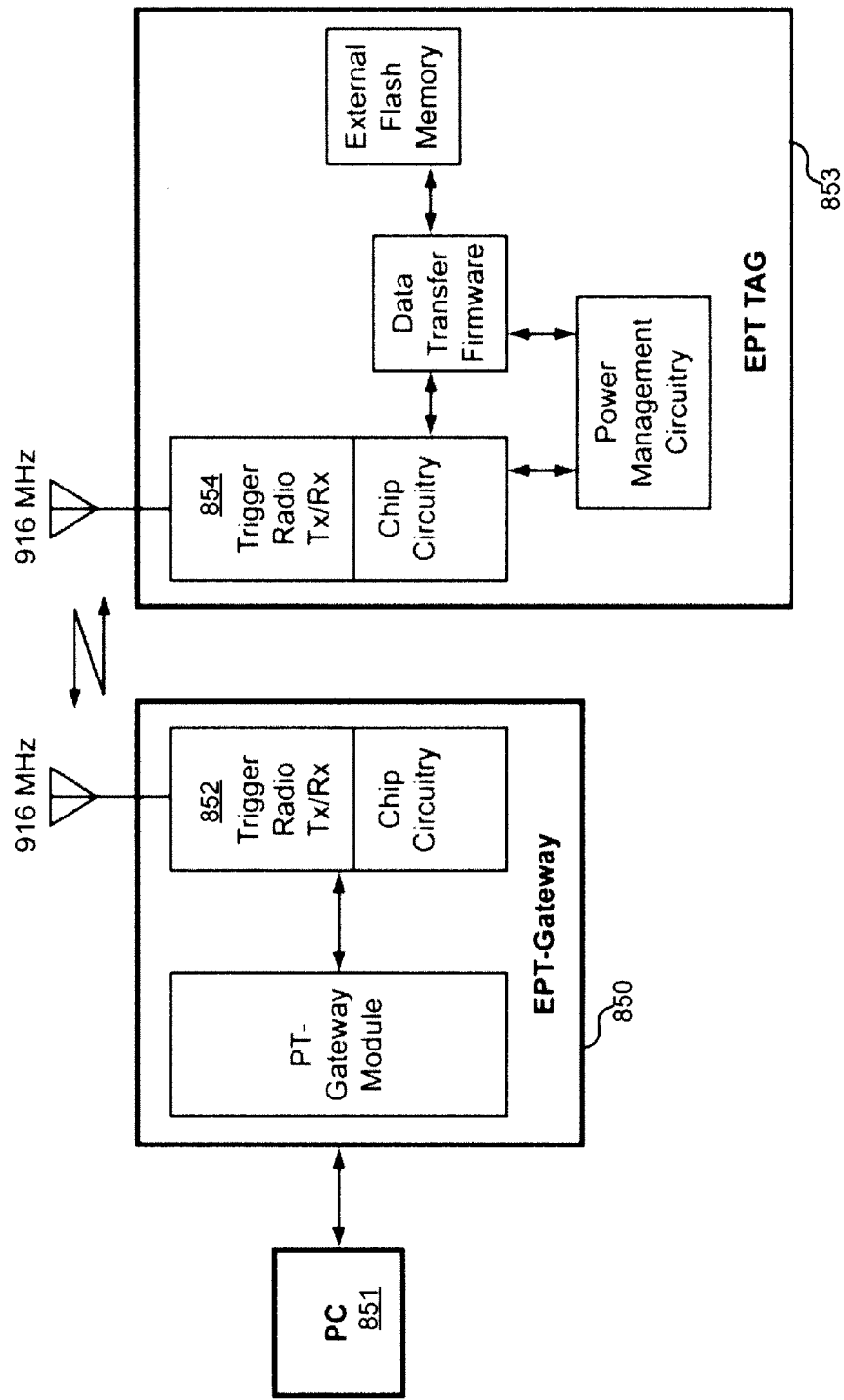
FIG. 26 illustrates an electronic personal tracker system according to an embodiment of the invention.

FIG. 26 illustrates an electronic personal tracker (EPT) system according to an embodiment of the invention. This embodiment is an example of the PDR operation, described with respect to FIG. 25 and Eqs. ((71)-(75)). An EPT gateway module 850 is configured to interface with a computer 851 to provide a means for tracking EPT tags 853 within range of the gateway 850. These gateway devices may be distributed throughout a specific environment, and may serve as means to track personnel wearing the tags 853, or other item equipped with tags 853. For example, a hospital may equipped with a plurality of gateways 850. Tags 853 may be used to control access to various portions of the hospital, through the use of the tracking gateways 850. Additionally, as described above, the tags 853 may also serve as information carriers, storing medical records or credentials of tag wearers. These gateways 850 may additionally serve as interfaces between PCs 851 and the tags 853, thereby allowing transfer of data to and from the tags 853 and the PC 851. Similarly to the communications nodes 302 described with respect to FIG. 11, the gateways 850 can constantly and automatically search the proximity area in order to locate tags 851 in their proximity. After the authentication (ID) such as by the applying of the WPA (Wi-Fi Protected Access), or other protected access code, as described with respect to FIG. 12, it can search for data, by selecting some of them from tag library, including medical data, or other, by applying On-the-Demand (OTM) operation, for example. As illustrated by Eq. (75), this can be a very energy efficient operation.

FIG. 27 illustrates how the system of FIG. 26 may be used for authorization and restricted access according to an embodiment of the invention. In some embodiments, gateways 850 may be installed in restricted access locations. For example, access to a computer system 851 may be restricted to certain personnel, or the gateway 850 could be used to provide access to other systems, such as an area of a hospital or a particular vehicle. Similarly to the process described with respect to FIG. 12, a tag wearer wishing to gain access to the area or object protected by the gateway 850, enters the proximity of the gateway 850 and transmits an activation request 900 to the gateway 850. Receipt of the activation request 900 triggers the gateway 850 to transmit a first authentication request 901. The tag then transmits an authentication code 902 that is preprogrammed into the tag 853. The gateway 903 then transmits an acknowledgement 903 of the code. In some embodiments, this first authentication process is sufficient for a first level of access. For example, a tag 853 may be worn by a hospital patient, or field personnel and may contain medical records of the wearer. The first authentication may be sufficient to allow the tag wearer access to a gateway protected medical record storage to allow the tag wearer access to upload recent changes to the wearer's medical condition.

In further embodiments, a second layer of authentication may provide increased protection for secure systems. This second layer may be required for access to further functionality, for example access to read or editing access to medical records, for access to a restricted area of a hospital, or for access to restricted access vehicle. For example, a second layer of protection may include a biometric authentication step, password authentication step, or other authentication step that is unique to the user of tag 853. In the illustrated embodiment, a tag wearer 853 transmits a second activation signal 904 to gateway 850. The gateway 850 transmits a request for the second authentication code or means of identification 905. In the present embodiment, a biometric signature 906 is input into the tag 853 by the user and transmitted to the gateway 850. For example, the tag 853 may comprise a device for input of a biometric signal, such as a fingerprint scanner or retinal imager. Or, in other embodiments the tag 853 may comprise a key pad or other input device to allow the tag user to input a user specific authentication code. After receiving the biometric ID signal 906, the gateway transmits an authentication acknowledgement signal 907 and allows the tag 853 or the tag user access to the restricted area or system. Although illustrated as disconnecting 908 after this process, in further embodiments, the gateway 850 and tag 853 may establish an on-going authentication process as described by FIG. 18, to ensure that tag wearer remains in proximity to the gateway during its access to the restricted system.

Figure 28:
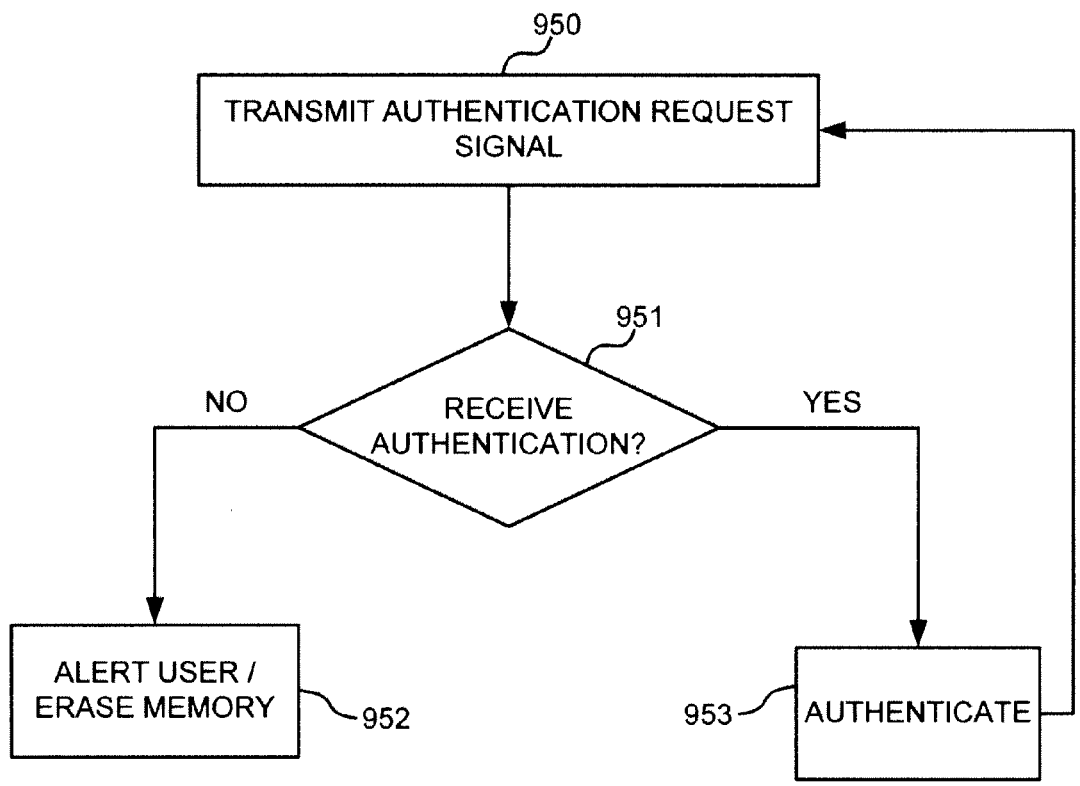
FIG. 28 illustrates a system for package tracking and security according to an embodiment of the invention

In a further embodiment, the gateway and tag system described with respect to FIG. 26 may be used for device tracking and security. In some cases, it is desirable to maintain a particular device or product within a certain predetermined area, and to avoid allowing that product or device to leave the predetermined area. FIG. 28 illustrates such an embodiment of the invention. In the illustrated embodiment, a gateway 850 is coupled to a PDA, or other computer system to form a device tracker. A device to be tracked is then equipped with a tag 853. In the illustrated embodiment, rather than the tag providing authentication to the gateway as in FIG. 27, the gateway provides authentication to the tag. The tag 853 emits an authentication request signal 950. These authentication signals may be used by gateways 850 to locate and track tag equipped devices within their proximity. If the tag receives an authentication signal in step 951, then the tag authenticates that it is its correct location 953 and allows the device to continue operating. The tag 853 is further programmed to repeat the method from step 950 at a predetermined frequency. It in step 951, the tag 853 does not receive an authentication from a gateway 850, then the device can determine that it has left its authorized area. In this case, various remedial measures can be taken, depending on the application. In one embodiment, the tag 853 transmits an alert 952 to some remote location to alert a system user that the tag has left the authorized area. In another embodiment, the tag 853 causes the device to erase its memory 952 or otherwise render itself inoperable. In a further embodiment, the tag 852 does not erase the device's memory or its own memory after a first failed authentication attempt, but rather waits until a predetermined number of failed authentication attempts.

Figure 29:
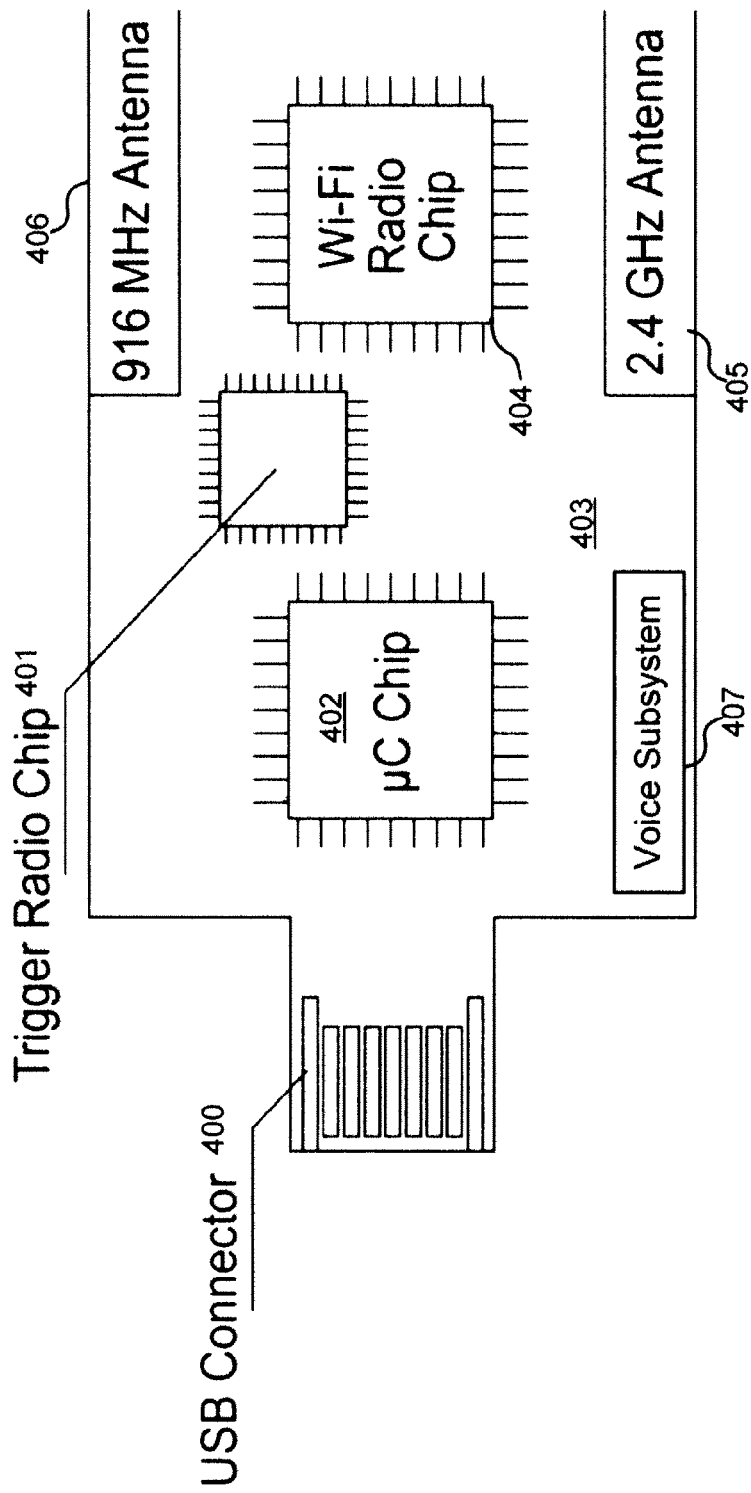
FIG. 29 illustrates a personal information storage and voice recorder tag according to an embodiment of the invention.

FIG. 29 illustrates a personal information storage and voice recorder tag according to an embodiment of the invention. FIG. 29 illustrates an information storage tag, as described with respect to FIG. 13, with the additional of a voice recording subsystem 407. In some embodiments, this voice sub-system may include components such as: microphones, signal conditioning, narrowband filter (300 Hz-3.5 kHz), amplifier, A/D-converter, microcontroller (μC), and flash memory. In other embodiments, some functionality of these components may be performed by the microcontroller 402 and software routines, and instead of a separate flash memory, the voice subsystem 407 may interface with the tag's 403 flash memory. Many hours of digitized voice can be recorded on the SOLEIC tag's flash memory due to the use of standard specialized technique such as analog filtering, digital signal processing, and perceptually-lossless data compression, using standard CODECs. This functionality can be added with the minimal impact to the size of the tag 403, being very close to 1 cm$^3$. In another embodiment, this voice subsystem 407 or its functionality is incorporated into a PDA or other portable computer, for example, as described with respect to FIG. 17. Whether the voice subsystem 407 is incorporated into a tag 403 or PDA, a tag 403 is used with a PDA during voice recording operations. Tag 403 establishes a connection with a PDA, for example, as described with respect to FIG. 18. Then, a program on the PDA handles the display of the recording status on the PDA's screen via GUI, provides confirmation of the recording, and creates a library file for the tag 403. This library file may then be accessed during subsequent library access operations with other PDAs, gateways, or other computer systems, as described herein. In a particular embodiment, the voice recording sub-system 407 is physically located distantly from radio sub-systems 406 and 405 to minimize interference with the radio subsystems.

Many of the systems described herein may be further equipped with systems for energy harvesting from energy sources such as solar, heat, mechanical, and indoor illumination, to provide alternative methods of electricity generation in order to increase battery run time, or MTBR. These devices may be designed to provide energy-centered power budget optimization and have very long MTBR times (VELOM). For example, an anti-tampering or tracking tag of the type described with respect to FIG. 28 may use energy harvesting as a supplement to battery power to allow effectively indefinite use without replacement of the battery. The selection of type of harvested energy depends on specific alternative energy availability and its efficiency; i.e., how much alternative energy we can harvest from certain harvesting area, $A_H$. Typical estimation procedure, provided in this section is based on the following rule: estimate how much $A_H$-value is needed to cover full power consumption of a certain device, on daily basis. If we obtain the realistic $A_H$-value, then the specific alternative energy creates the practical option for such energy harvesting. We will obtain quite surprising results showing that solar energy and internal illumination optical energy are viable candidate for energy harvesting, in the case of miniature information carrying wireless devices of the type described herein.

In some embodiments, an energy harvesting module may comprise a solar power cell. For example, a particular device may have the following device parameters, typical for miniature wireless devices in dual-radio operation, such as: $I_o$=100 mA, k=10 min/month=2.28·10$^{-4}$, $\langle I_D \rangle$=4 μA, and $\langle I_s \rangle$=100 μA. Then, the average total current, $\langle I_T \rangle$, is $$\langle I_t \rangle = kI_o + \langle I_s \rangle + \langle I_o \rangle = (2.28 \cdot 10^{-4})(100 \text{ μA}) + 50 \text{ μA} + 2 \text{ μA} = \quad (76)$$
$$22.8 \text{ μA} + 100 \text{ μA} + 4 \text{ μA} = 126.8 \text{ μA}$$

Thus, assuming the nominal voltage of 3.7 V, we obtain $$\langle P_t \rangle = (3.7 \text{ V})(126.8 \text{ μA}) = 469 \text{ μW} \quad (77)$$

For direct solar illumination, we assume the optical intensity of: $J_R$=100 mW/cm$^2$, and solar cell (a tandem) photovoltaic efficiency: $\eta_{ph}$=33%, with Ohmic loss of 10%; so, $\eta_{ohmic}$=90%. Therefore, the quantity, called by us an "electrical intensity," Jel, is $$J_{el} = J_R \times \eta_{ph} \times \eta_{ohmic} = (100 \text{ mW/cm}^2)(0.33)(0.9) = 30 \text{ mW/cm}^2 \quad (78)$$

and, the energy balance equation, is $$\langle Pt\Delta \rangle (24 \text{ h}) = J_{el} \cdot A_H \cdot t_H \quad (79)$$

where, the left side is the daily (24 h) power consumption of the device, and the right side is the equal solar energy produced by harvesting area, $A_H$, during exposure time, $t_H$. Therefore, the required harvesting TIME×AREA (HTA) product, is (for direct sunlight):

$$A_H \cdot t_H = \quad (80)$$
$$\frac{\langle P_T \rangle (24 \text{ h})}{J_{el}} = \frac{(469 \text{ μW})(24 \text{ h})}{J_{el}} = \frac{11.2 \text{ mW} \cdot \text{h}}{30 \text{ mW/cm}^2} = 22 \text{ min} \cdot \text{cm}^2$$

For cloudy solar illumination, we assume $J_{el}$=7 mW/cm$^2$, so the HTA-product, for cloudy conditions, is $$A_H \cdot t_H = \frac{11.2 \text{ mW} \times \text{h}}{7 \text{ mW/cm}^2} = 1.6 \text{ h} \cdot \text{cm}^2 \quad (81)$$

and, for indoor illumination, we have, $$A_H \cdot t_H = \frac{11.2 \text{ mW} \times \text{h}}{0.3 \text{ mW/cm}^2} = 37.3 \text{ h} \cdot \text{cm}^2 \quad (82)$$

All these data have been summarized in Table 1, presented in FIG. 30.

As illustrated by Table 1, even indoor illumination is sufficient to cover full daily power consumption of miniature wireless device, assuming realistic watch-like packaging, when $A_H$=6 cm$^2$. This is very optimistic prognostics for obtaining the VELOM (Very Large MTBR) batteries/devices that could operate without, or almost-without regular battery, either primary, or secondary.

Figure 31:
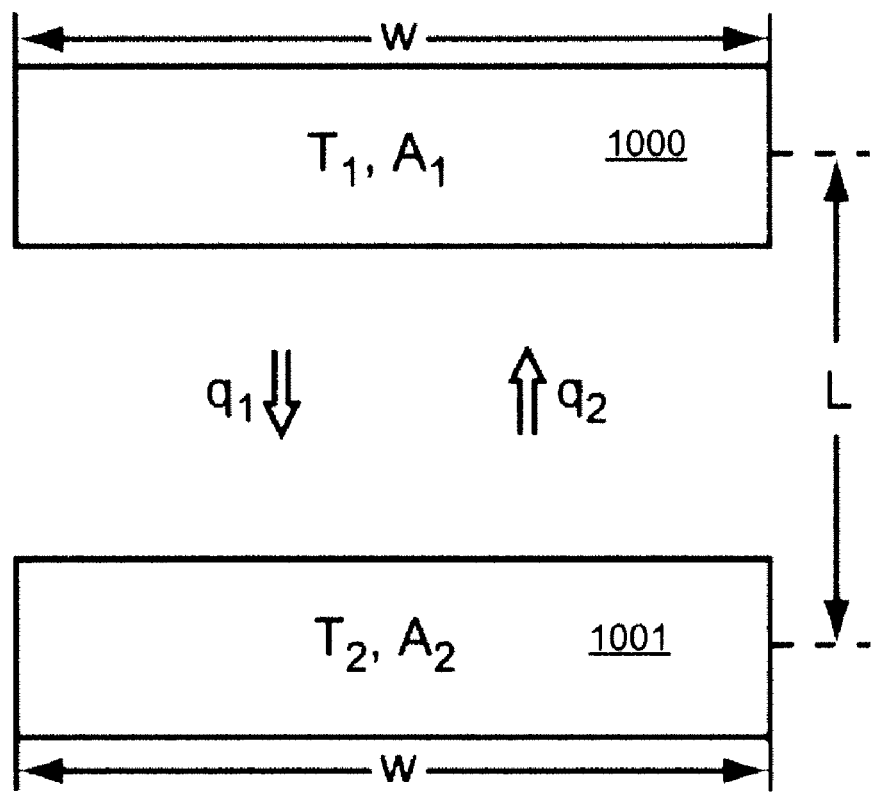
FIG. 31 illustrates thermal energy harvesting for use in energy harvesting implemented in accordance with an embodiment of the invention.

In other embodiments of the invention, thermoelectric effects or other thermal sources of power generation may be employed for supplemental energy harvesting. The thermoelectric components are based on the Carnot cycle defined by the thermal gradient:

$$\eta_{CARNOT} = \frac{\Delta T}{\bar{T}} = \frac{T_1 - T_2}{\bar{T}}; \bar{T} = \frac{T_1 + T_2}{2} \quad (83)$$

where η is the Carnot cycle efficiency. Consider two plates 1000, and 1001 with the same cross-section dimension, w; distance, L; and the same cross-sectional areas: $A_1$=$A_2$=A, but various temperatures: $T_1$ and $T_2$, with $T_1$>$T_2$, as shown in FIG. 31. Then, heat $q_1$, is larger than $q_2$, with net heat transfer $q_{12}$=$q_1$−$q_2$, which depends on overall geometry, defined by the so-called view factor (VF)[8], in the form $$F_{12} = \frac{(U^2 + 1)^{1/2} - 1}{U}; U = \frac{w}{L} \quad (84)$$

which is tabulated in Table 2.

The net heat transfer is determined by the following basic formula[8]; $\Delta T=T_1-T_2$, and $(\Delta T/\overline{T})\ll 1$, as a consequence of the Stefan-Boltzmann law:

$$q_{12} = \eta_{ohmic} \cdot A_H(1-R)F_{12}\sigma(T_1^4 - T_2^4) \cong \quad (85)$$
$$4\eta_{ohmic}A_H(1-R)F_{12}(\sigma\overline{T}^4)\left(\frac{\Delta T}{\overline{T}}\right)$$

where $\eta_{ohmic}$ is the Ohmic efficiency, R is the reflection coefficient, and $\sigma$ is the Stefan-Boltzmann constant: $\sigma=5.7\cdot 10^{-8}$ W/m²K=$5.7\cdot 10^{-9}$ mW/cm²K.

As an example, assume $T_1=273°+30°$ C.=303° K, $T_2=273°+20°$ C.=293° K; so, $\Delta T=10°$ C., and $\overline{T}=298°$ K; then:

$$\eta_{CARNOT} = \frac{\Delta T}{\overline{T}} = \frac{10° \text{ K}}{298° \text{ K}} = 0.0336 \quad (86)$$

Assume w=1 cm², L=1 mm; then, U=10, and $F_{12}=0.905$, from Table 2. Assume an Ohmic loss of 10%; then, $\eta_{ohmic}=0.9$; and assume R=20%. We also have $\sigma\overline{T}^4=45$ mW/cm², and from Eq. (85), we obtain:

$$\left(\frac{q_{12}}{A}\right) = 4(0.9)(0.8)(0.905)(0.0336)(45) = 3.94 \text{ mW/cm}^2 \quad (87)$$

or, 0.394 mW/cm²° K.

Typical heat (thermoelectric) batteries are based on so-called Seeback effect. Then, the electrical efficiency, $\eta_e$, is (this efficiency is an analog of the photovoltaic efficiency)

$$\eta_e = \left(\frac{T_1-T_2}{T_1}\right)\frac{\sqrt{1+Z\overline{T}}-1}{\sqrt{1+Z\overline{T}}+\frac{T_2}{T_1}} \cong \left(\frac{\Delta T}{\overline{T}}\right)\frac{\sqrt{1+Z\overline{T}}-1}{\sqrt{1+Z\overline{T}}+1} \quad (88)$$

where Z is the basic Figure of Merit (FoM) of the thermoelectric effect, defined as $$Z = \frac{\sigma S^2}{k} \quad (89)$$

where $\sigma$ is electrical conductivity, k—is thermal conductivity, and S in Seeback coefficient, in µW/K. Then, ZT—quantity is dimensionless, where $\overline{T}$ is average temperature, defined by Eq. (83). Then, for good thermoelectric materials, we can assume:

$$Z\overline{T} \cong 1. \quad (90)$$

Thus, the second factor in Eq. (88), $\eta_2$, has the form:

$$\eta_2 = \frac{\sqrt{1+Z\overline{T}}-1}{\sqrt{1+Z\overline{T}}+1} = \frac{\sqrt{2}-1}{\sqrt{2}+1} = 0.17 \quad (91)$$

While the 1st factor, in Eq. (88), is the Carnot efficiency, defined by Eq. (83). In order to avoid using twice the Carnot efficiency, we combine Eqs. (87) and (91) without the $\eta_1$—factor. Then, the "electrical intensity," $J_{el}$, is $$J_{el}=(3.94 \text{ mW/cm}^2)(0.17)=0.67 \text{ mW/cm}^2 \quad (92)$$

In various embodiments, in order to design for the particular embodiments, the different characteristics of different energy harvesting measures may be compared. For comparison of the solar and thermal conversions into electricity, we consider, as an example, the case of larger wireless device, with $<P_T>=10$ mW. Then, we assume that both solar, (optical), and thermal exposures operate 6.5 hours per day. Thus, we can obtain the following power balance equations for both solar and thermal cases, where, for solar, we assume, as before: $\eta_{ph}=33\%$, $\eta_{ohmic}=0.9$, and $J_R=100$ mW/cm², 23 mW/cm², and 1 mW/cm² for direct, cloudy, and indoor illuminating, respectively, while for thermal, we assume temperature gradients: $\Delta T=10°$ C., 5° C., and 1° C. In addition to the high photovoltaic efficiencies (33%) for triple-junction tandem solar cells, as before, we also add low photovoltaic efficiency (14%) that holds for amorphous silicon cells. Then, for 1 day power consumption, which is compensated by 6.5 hours of solar harvesting, we have $$\langle P_T\rangle(24 \text{ h}) = (J_R A_H \eta_{ph} \cdot \eta_{ohmic})(6.5 \text{ h}) \Rightarrow A_H = \frac{3.7\langle P_T\rangle}{J_{el}} \quad (93)$$

and, for the thermal energy harvesting, we have, respectively (see; Eq. (85))

$$\langle P_T\rangle(24 \text{ h}) = \left[4\eta_{ohmic} \cdot A_H(1-R)F_{12}(\sigma\overline{T}^4)\right]\left(\frac{\Delta T}{\overline{T}}\right) \quad (94)$$

$$\left(\frac{\sqrt{1+Z\overline{T}}-1}{\sqrt{1+Z\overline{T}}+1}\right)(6.5 \text{ h}) = J_{el}(6.5 \text{ h}); A_H = \frac{3.7\langle P_T\rangle}{J_{el}}$$

as in Eq. (93).

Table 3, presented in FIG. 33, compares harvesting areas, $A_H$ for various types or radiation. As illustrated, for $\Delta T=10°$ C., the thermal electrical intensities are twice as large as those for indoor illumination.

In further embodiments, continuous and homogenous electrical energy into a self-powered electronic device may be provided through the use of an energy storage and release system. These systems may be employed to supplement energy harvesting systems that may provide sufficient power for device operation, but not in a homogeneous manner. In some embodiments, rechargeable batteries may be used for this electrical energy storage. In such applications, rechargeable batteries have high energy density (120 Wh/kg), but low power density (i.e., slow charge and discharge), and their lifetime is short (3 yr). In contrast, primary batteries have long lifetimes (>30 yr), but they are not rechargeable, and so cannot serve as energy storage to homogenize energy from energy harvesting systems. In one embodiment, a supercapacitor (SC) or ultracapacitor (UC), which does not apply chemical energy, and so has very high power density (i.e., very fast charge and discharge) and a long lifetime (>30 yr), may be employed as an energy storage. Typical energy density for capacitor based temporary energy storage is rather low (6-10 Wh/kg). However, this may be sufficient for some devices, and may be determined through MTBR optimization design.

In some embodiments, Phase-Change Materials (PCMs) can be used for temporary energy storage for power homogenization. PCMs can store solar energy during a day and release it during the night. However, their storage and release are typically not as well controlled as in the case of supercapacitors (SCs). Accordingly, in some embodiments, PCM systems are used to supplement SC systems. During the solid to liquid phase transition they absorb latent heat while keeping a steady temperature. Then, they release this heat at night, when temperature decreases. They have a high heat of fusion, melting and solidifying at a certain temperature, capable of storing and releasing large amounts of thermal energy. In a particular embodiment, a PCM system employs inorganic $Mn(NO_3)_2 \cdot 6H_2O$, with a melting point of 15-25° C. and a heat of fusion of 267 kJ/kg=74 Wh/kg. This energy density is half that of rechargeable batteries (120 Wh/kg). This material also has a very high volume specific heat of 4.37 MJ/m$^3$° C.

In some energy harvesting systems, infrared radiation (IR) may be used to provide a heat source for a thermoelectric energy harvesting system. In applications open to the environment without other heat sources present, the basic component of IR radiation is due to atmospheric emission produced by $CO_2$ molecules (5-8 μm) and $H_2O$ molecules (13 μm). Although IR radiation departs significantly from blackbody radiation, we can still apply[8] the Stefan-Boltzmann law:

$$G_{atm} = \sigma T_{sky}^4 \quad (95)$$

where $T_{sky}$ is the so-called effective sky temperature[8], which, at night, is usually much lower than the air temperature, $T_\infty$; e.g., −5° C. vs. 10° C., especially under desert conditions. Typical low sky temperatures can even be as low as 230° K (−43° C.) for cold, clear skies; while high values range up to 285° K (+12° C.). The effect of low $T_{sky}$ values can be so strong that, during a cold clear night, water may freeze even though the air temperature exceeds 273° K (0° C.)[8].

The thermoelectric effect exploits a temperature gradient between two bodies. In a particular embodiment, a thermoelectric harvesting system operates using a temperature gradient between two bodies. For example, consider the first plate 1001, as shown in FIG. 31, thermally isolated from the ground, while the second plate 1000 is grounded. Then, during the night, both plates are cooled by IR radiation, $$Q_R = \varepsilon \sigma (T_s^4 - T_{sky}^4) \quad (96)$$

where ε is surface emissivity, and we can assume $\varepsilon = \alpha_{sky} = 0.1$, while $T_s$ is the plate temperature ($T_1$, or $T_2$).

Additionally, the plates are also cooled by convection, $$Q_{CONV} = h(T_s - T_\infty) \quad (97)$$

where h is the heat-convection coefficient between the plate and the air, and $T_\infty$ is the air temperature[8].

Figure 34:
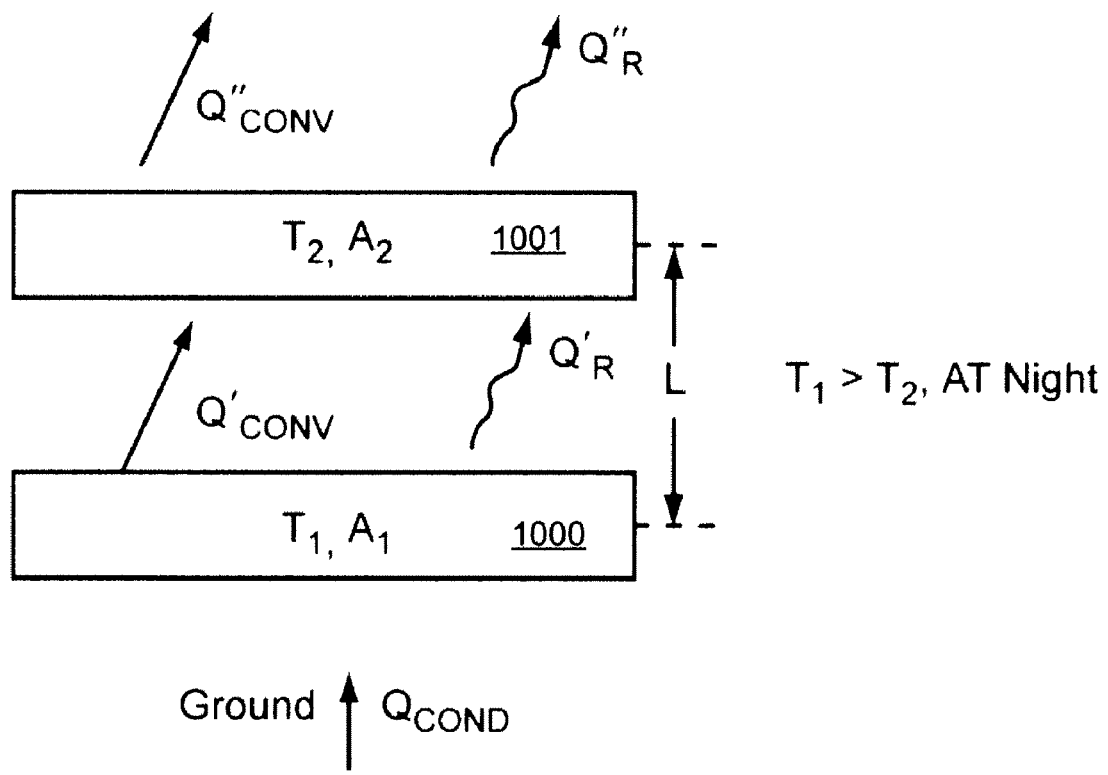
FIG. 34 illustrates thermal energy harvesting for use in energy harvesting implemented in accordance with an embodiment of the invention.

However, the grounded plate 1000 is also heated by the bottom ground layers, due to heat conduction. Therefore, we obtain $$T_1 > T_2 \quad (98)$$

and, we can apply Eq. (87), to calculate electrical energy obtained from the conversion of IR radiation heat into electricity due to thermoelectric device. FIG. 34 illustrates this situation. The upper plate 1001 is cooled by: $Q''_{CONV} + Q''_R$, while the grounded plate 100 is less cooled by: $Q'_{CONV} + Q'_R - Q_{COND}$, where $Q_{CONV}$ is heat conduction from the grounded bottom layer.

Figure 35:
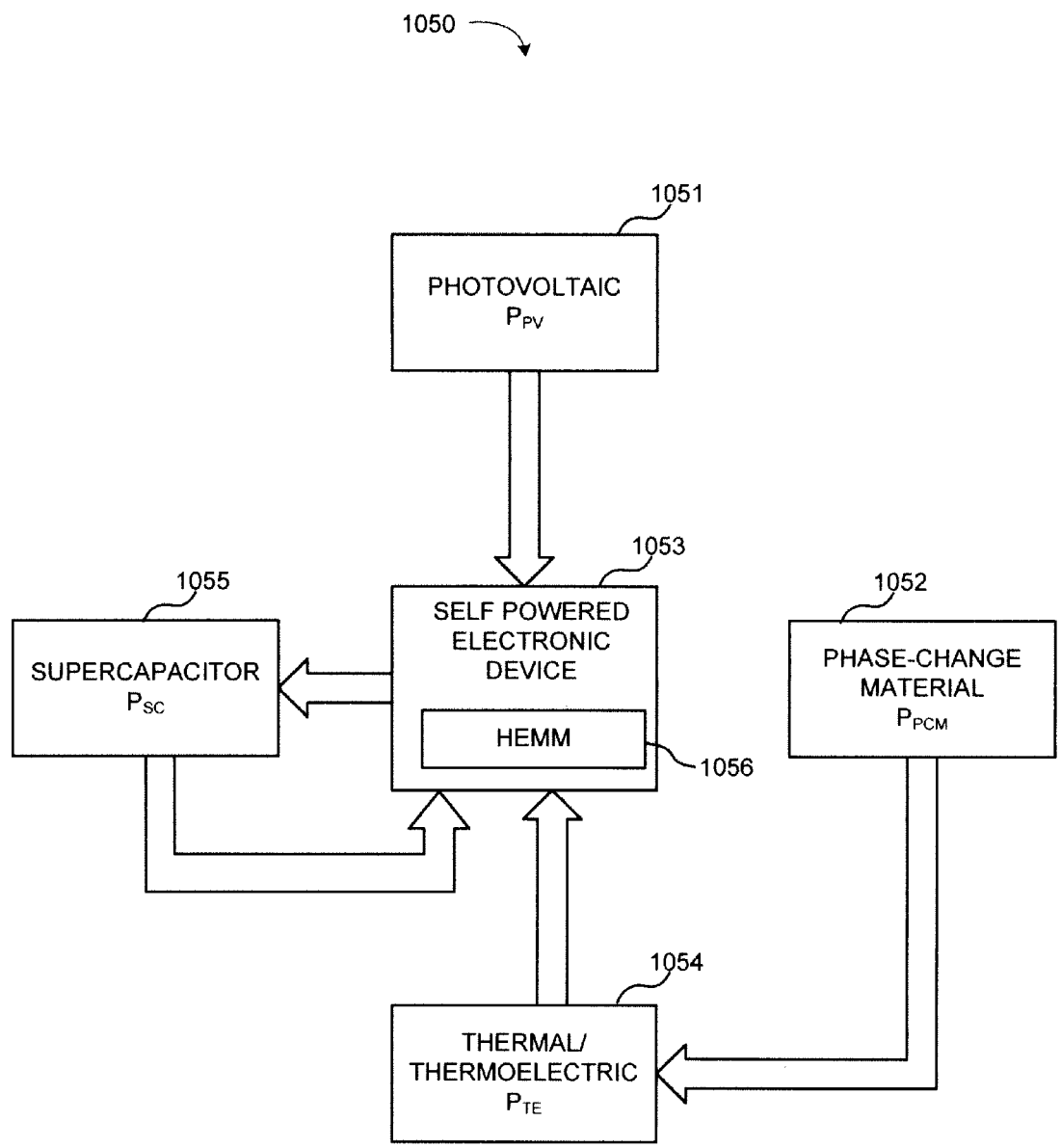
FIG. 35 illustrates a system for energy harvesting power management implemented in accordance with an embodiment of the invention.

FIG. 35 illustrates a battery-powered device augmented with energy harvesting systems according to an embodiment of the invention. The energy harvesting system 1050 comprises a self-powered electronic device 1053. In various embodiments, device 1053 may comprise an information carrier, authentication tag, PDA, wearable distributed computer system, local communications node, deployable sensor node, or other device described herein. In order to extend operational lifetime beyond what a battery could provide alone, the device 1053 is equipped with one or more energy-harvesting modules. A photovoltaic energy harvesting module 1051 provides power $P_{PV}$ to the device 1053 when illumination is present. In various embodiments, this may comprise power derived from direct sun, cloudy conditions, or indoor illumination. A phase-change material based energy harvesting module 1052 is configured to store thermal energy during times when sufficient thermal energy is present to cause a phase change in the material. For example, the phase change material may store thermal energy when in direct sunlight, when outdoors during the day, or when in proximity to another heat source. A thermal or thermoelectric energy harvesting module 1054 is configured to convert energy derived from a thermal gradient into electrical energy and provide it to the device 1053 as power $P_{TE}$. In some embodiments, the thermal energy harvesting module 1054 is coupled to the phase change material module 1052 and configured to convert thermal energy stored in the phase-change material into electricity. In further embodiments, the thermal module 1054 is in further contact with a source of heat to provide a heat gradient, such as infrared light from the sky, or through a convention/conduction based thermal gradient as described above. The thermal module 1054 may be configured to operate when other energy sources are unavailable, for example, when the photovoltaic module 1051 is unable to provide power during the night time. Alternatively, the thermal module 1054 may be configured to operate whenever a sufficiently large thermal gradient exists. As described above, these electric source 1051 and 1054 provide the device 1053 will typically provide the device with a heterogeneous amount of electricity that varies in time. In some embodiments, rather than allowing excess energy to go to waste, some of the energy is stored in a storage module 1055, such as a supercapacitor or secondary battery.

In the illustrated embodiment, a harvesting energy management module (HEMM) 1057 is embodied in the electronic device 1053 and configured to manage the energy transfer among the various modules. In devices employing primary or secondary batteries integrated into device 1053, the HEMM module 1057 can also manage the device's access to the batteries. In some embodiments, the HEMM module 1057 is configured to monitor the power requirements of the device 1503 and the power availability from harvesting modules 1051, 1054, and 1055, and to distribute the power as available. If the power required is less than the power available then the HEMM module can direct excess power to be stored in supercapacitor 1055, while if the power available from module 1054 and 1051 is less than the power required, the HEMM module can retrieve power from the supercapacitor 1055. In further embodiments, if the power available is still not sufficient, the HEMM module can use a provided battery as an emergency power source. In still further embodiments, the HEMM module may perform power management functions for the device 1053. For example, the HEMM module 1056 may be configured to perform the power management operations described with respect to FIG. 22. Accordingly, the HEMM module can be programmed for MTBR maximization, where power requirements for the device 1053 are lowered before access to the battery is attempted. In various applications, different embodiments may be equipped with various configurations of these described energy harvesting modules. For example, in a particular embodiment, a desired lifetime and operational characteristics for a particular device is chosen, and an MTBR calculation is performed for the desired device. According to the results of these calculations, a device may be equipped with sufficient energy harvesting modules, or with sufficient battery storage to meet these requirements. In the particular case when the device life time is only limited by primary battery life-time (e.g., 30 years, considering the fact that the primary battery shelf life is 76 years; see, Eq. (2)), we assume that the life-time of other components are longer than 30 years, for example.

In one embodiment, these MTBR calculation design considerations may be applied to an anti-tampering (AT) device. Many AT devices work based on the protection of physical access into the device due to either some destructive effect (such as breaking epoxy, for example), or by producing some kind of alarm, informing about the Tamper Attack (see; e.g. U.S. Pat. No. 7,556,532 B2, issued Jul. 7, 2009, about so-called SPIDER AT-device). In the case of self-powered devices, their weak point is in the necessity of battery recharging or replacement; thus, creating the successful tamper opportunity. This weak point is avoided, however, if we apply the VELOM devices or batteryless sustainable source, as in the previous section. This, is because, in such a case, any physical access into inside the device can be identified as the hostile AT attack; thus, avoiding any False Alarm cases (i.e., False Alarm Rate (FAR)=0).

In some embodiments, self-powered devices will be subject to generally repetitive, periodic motions. For example, the user of a wearable computer as described with respect to FIG. 23, will walk or run while wearing the computer. In these embodiments, energy harvesting modules that utilize the piezoelectric effect (PE) may be employed for battery life extension, or battery-less operation. When a crystal is subjected to a force that changes the shape of the crystals, a separation of charges takes place and a potential difference between parts of the crystal occurs, creating the piezoelectric effect (PE). In general, the conversion of ambient vibration energy into electrical energy is one of the most effective harvesting systems, with coupling efficiencies approaching 25%. However, high vibrating levels (2.5 to 10 ms$^{-2}$) at frequencies of 100 Hz to 1 kHz are required, as in the presence of a mechanical engine. In various embodiments, Piezoelectric Energy Harvesting (PEH) Devices may include commonly used monolithic piezoelectric material lead-zirconate-titanate (PZT), the biomorph Quick Pack (QP) actuator, and Macro-Fiber Composite materials (MFC), with the average efficiencies: 4%, 2%, and 6%, respectively.

As an example, of application of a PE harvesting module to an embodiment of the invention, consider the simple M&S (modeling and simulation) for the PE, in order to obtain the estimates of the harvesting energy obtained from the standard walking with 6 km/h-speed, assuming typical body weight of 170 lb, or 77 kg, with foot-step-correcting coefficient (correcting the each foot step gravitational force, mg, where g=9.81 ms$^{-2}$, with adding leg muscles force) equal to: $\epsilon$=1.5 (obtained experimentally).

In the approximate PE model, we assume the elastic force: $F_x$=$-$kx, where: k-coefficient and x-deviation from equilibrium, with $x_{max}$=A-amplitude of vibration, and with potential energy of: $E_p$=kx$^2$/2. Assuming the foot-step, with magnified force of m'g; m'=$\epsilon$·m, the vibration stops at: m'g=kA. Therefore, the maximum kinetic energy: $E_k$=m'v$^2$/2=kA$^2$/2, and the maximum mechanical PE harvesting energy, produced during 1 hour of harvesting, is $$E_{PE} = \frac{kA^2 \cdot \dot{N}}{2} = \frac{(kA)A\dot{N}}{2} = \left(\frac{\epsilon \; mg \cdot A}{2}\right)(\dot{N}) \tag{99}$$

where $\dot{N}$ is the number of foot steps per hour.

Assuming the length of each step, approximately equal to 1 m, we obtain $\dot{N}$=6·10$^3$ h$^{-1}$, and including Ohmic loss of 10%, the Ohmic efficiency: $\eta_{ohm}$=0.9. Thus, the general relation for the electrical harvesting energy, produced by PE during 1 hour, equivalent to electrical power, is $$P_{el}^{(PE)} = \eta_P \left(\frac{\epsilon \; mg \cdot A}{2}\right)(\dot{N}) \; \eta_{ohm} \tag{100}$$

and, assuming: $\eta_P$=4%, $\epsilon$=1.5, m=77 kg, A=1 mm, g=9.81 ms$^{-2}$, $\dot{N}$=6·10$^3$ h$^{-1}$, and $\eta_{ohm}$=90%, we obtain $$P_{el}^{(PE)} = (0.04)\left[\frac{(1.5)(77 \; kg)(9.81 \; ms^{-2})(10^{-3} \; m)}{2}\right](6 \cdot 10^3)(0.9) = \tag{101}$$
$$= (0.04)(0.5665 \; J)(6 \cdot 10^3)(0.9) = 122 \; J/h = 34 \; mW$$

This is because: 1 Wh=3600 J.

Since the electrical energy per hour is in mW-hours, the electrical power obtained from mechanical energy harvesting is 34 mW, assuming conversion efficiency of 4% to be averaged over three piezoelectric materials (4%, 2%, 6%), mentioned above. This result has been obtained under assumption of the linear harmonic oscillator, with a centric force of $-$kx, where k is a constant. Therefore, the return point is at: $\epsilon$mg=kA, and $\epsilon$=(kA)(mg)$^{-1}$ is proportional to amplitude, A. Thus, the mechanical energy, as in Eq. (99), is proportional to A$^2$. Here, we assumed that A=1 mm. However, for A=2 mm, the mechanical energy will be 4-times larger.

As an illustration of MTBR design implemented in accordance with one embodiment of the invention, compare electrical powers produced by four types of harvesting energies: solar, optical (illumination), thermal and mechanical. In the case of solar harvesting energy, the electrical intensities for direct solar component, and cloudy (diffuse) component are 30 mW/cm$^2$ and 7 mW/cm$^2$, respectively, according to Table 1, while $J_{el}$=0.3 mW/cm$^2$ for indoor illumination. Similarly, for thermal energy and $\Delta T$=10° C. temperature gradient, we have $J_{el}$=0.67 mW/cm$^2$, according to Eq. (91). Similarly, the electrical power from mechanical power, is 34 mW, according to Eq. (100).

For sake of comparison, compare this latter value with the remaining electrical powers, obtained for $A_H$=6 cm$^2$ of harvesting area, typical for watch-like packaging. FIG. 36 presents table 4, showing the results obtained for four types of harvesting energies. As illustrated, the solar and mechanical energies produce similar results, while thermal and optical (indoor illumination) have lower values.

Figure 37:
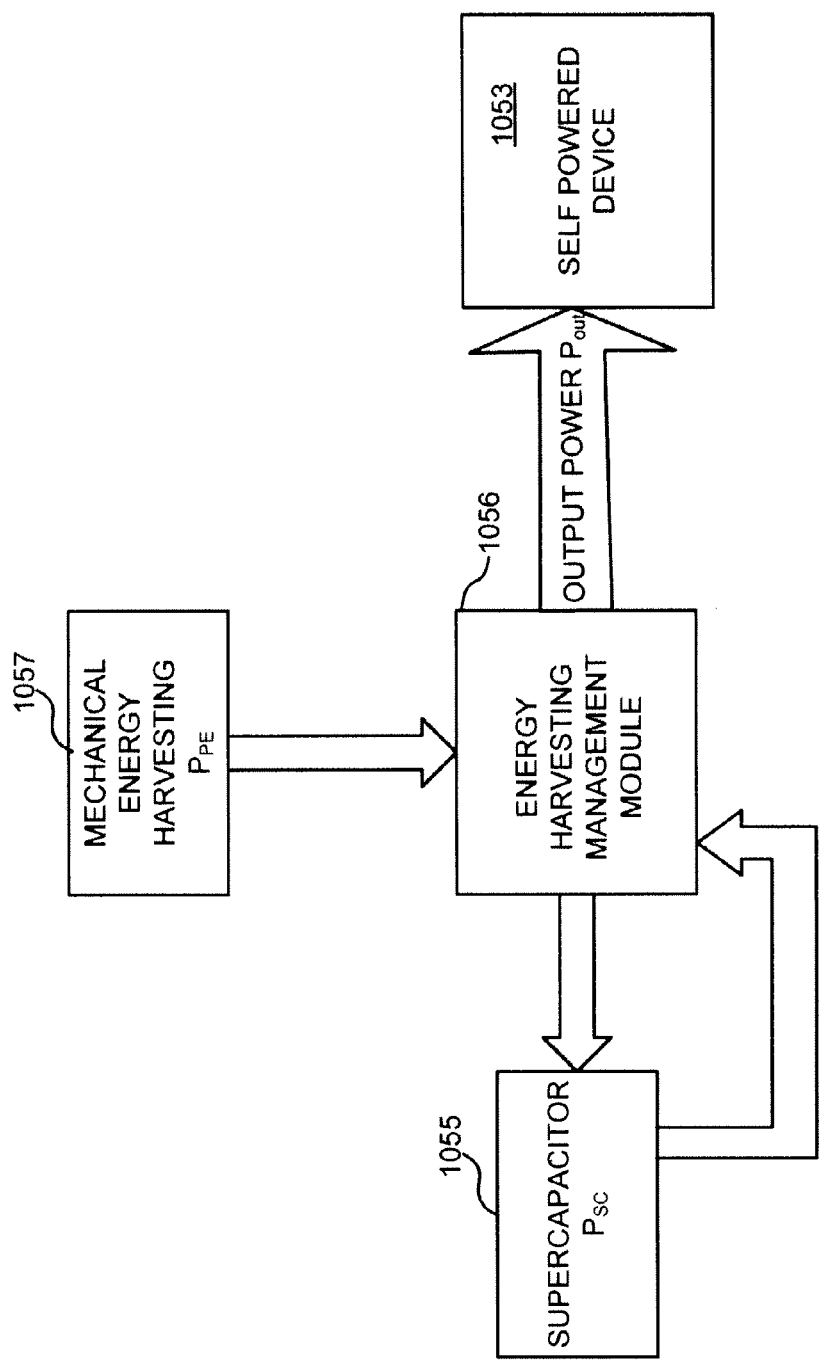
FIG. 37 illustrates a system for mechanical energy harvesting power management implemented in accordance with an embodiment of the invention.

FIG. 37 illustrates a HEMM module connected to a mechanical energy harvesting module according to an embodiment of the invention. In the illustrated embodiment, a HEMM module 1056, as described with respect to FIG. 36, is coupled to a mechanical energy harvesting module 1057. A mechanical energy harvesting module 1057 is configured to convert mechanical energy from the motion of self powered device 1053 into electrical energy as described above. A supercapacitor 1055 is provided to temporarily store excess energy provided by the mechanical energy harvesting module 1057. In further embodiments, a mechanical energy harvesting module 1057 may be incorporated into systems employing other harvesting modules as described with respect to FIG. 35. Additionally, as described above, energy harvesting management module 1056 may be configured to have power control systems for monitoring and controlling power use by the device 1053 and with systems to alert a user when available power is reduced below certain thresholds, for example, through the dual alarm system described above.

Some embodiments of the invention comprise methods for designing power systems for devices according to device operational requirements. In one embodiment, this is accomplished through evaluation of specific MTBR values that result from potential power sources. According to Eq. (41), the specific (MTBR), or (SMTBR), is $$(SMTBR) = \frac{(MTBR)}{M_B} = \frac{q}{\langle I_T \rangle} = \frac{(Q_O/M_B)}{\langle I_T \rangle} \qquad (102)$$

where q is specific latent charge, or latent charge per mass unit, in mA·h/g. In the case of a typical primary battery, with capacity: $C_o$=600 mA·h, and battery mass: $M_B$=6 g, q=600 mA·h/6 g=100 mA·h/g, while the average total current, $\langle I_T \rangle$, is $$\langle I_T \rangle = \langle I_o \rangle + \langle I_s \rangle + \langle I_D \rangle \qquad (103)$$

where $$\langle I_o \rangle = kI_o \qquad (104)$$

and k is the CONOPS coefficient. In the present example, k is assumed to be:

$$k = \frac{6 \text{ min}}{1 \text{ month}} = \frac{6 \text{ min}}{(730.5 \text{ h})(60 \text{ min})} = 1.37 \cdot 10^{-4} \qquad (105)$$

where 730.5 h is the number of hours per month, averaged over four (4) years. Also, $I_o$ is operation current, $\langle I_s \rangle$ is the averaged sleep current (for trigger radio), and $\langle I_D \rangle$ is average self-discharge current. In this example, for a primary battery, we assume: b=0.005, a=0.005/mo., and g=0.01. These parameters are typical for currently available primary batteries, and the modification of this method for specific parameters of potential battery sources is straightforward. Then, $$Q_1 = C_o(1-b) = 600(1-0.005) = (600)(0.995) = 597 \text{ mA·h} \qquad (106)$$

and $$Q_2 = C_{og} = (600)(0.01) = 60 \text{ mA·h} \qquad (107)$$

so, the average latent charge (excluding the 1$^{st}$ 24 hours), is $$\langle Q \rangle = \frac{Q_1 + Q_2}{2} = \frac{597 + 60}{2} = 328.5 \text{ mA·h} \qquad (108)$$

and the average self discharge current is $$\langle I_D \rangle = a \langle Q \rangle = \frac{(0.005)}{(730.5)}(328.5) = 2.2 \text{ μA} \qquad (109)$$

For some wireless devices, such as MIDs (Mobile Internet Devices), or palm computers, typical battery capacity can be larger than assumed in the example above. For example, some batteries for use in wireless devices may have capacities around 2700 mA·h. Assuming that this is capacity of the primary battery applied here, we have for 100 mA·h/g— specific latent charge, the battery mass: $M_B$=27 g. Then, we have:

$$Q_1 = (2700)(1-0.005) = (2700)(0.995) = 2686 \text{ mA·h} \qquad (110)$$

and $$Q_2 = C_{og} = (2700)(0.01) = 2.7 \text{ mA·h} \qquad (111)$$

and $$\langle Q \rangle = \frac{2686 + 2.7}{2} = 1344 \text{ mA·h} \qquad (112)$$

so, the average self-discharge current, is $$\langle I_D \rangle = a \langle Q \rangle = \frac{(0.005)}{(730.5)}(1344) = 9.2 \text{ μA} \qquad (113)$$

i.e., much larger than that of Eq. (109). This is the only non-linear term in Eq. (102), changing with $M_B$. To simplify the design method, it can be assumed that its average value of 5 μA is a constant. Under this assumption, Eq. (102) becomes fully linear, and the SMTBR value is further constant in a broad range of $M_B$ values, from few g, to 50 g, for example. Therefore, this linearized SMTBR formula can be applied to a large range of wireless devices including wireless phones, PDAs, iphones, smart phones, and MIDs. For example, this linearized SMTBR formula can be applied to all the various devices described herein.

Using the linearization of Eq. (102), in some embodiments, a table of (SMTBR) values for full range of wireless devices, working in the dual-radio regime, can be developed as shown in Table 5 of FIG. 38. This table presents a summary of (SMTBR)—values for various $I_o$ and $\langle I_s \rangle$—parameters, assuming: k=1.37·10$^{-4}$, and $\langle I_D \rangle$=5 μA is constant. Here, the primary battery is assumed to be with the specific latent charge of q=100 mA·h/g, b=0.005, a=0.005/mo., and g=0.01. The (SMTBR)—value are in days/gram. The range of $I_o$—value is very broad, from miniature wireless devices (tags), with $I_o$=50 mA, 100 mA, 150 mA, to PDAs, and even MIDs, with $I_o$=1 A, 1200 mA, 1400 mA. In this example embodiment of design parameters, it is assumed that all these devices, especially including tags and advanced PDAs, or APDAs, work in dual radio regime.

As an illustration of the calculations leading to Table 5, consider two examples, assuming the constant value of $\langle I_D \rangle$=5 μA.

In the first example, $\langle I_s \rangle$=50 μA, $I_o$=150 mA, then $$\langle I_o \rangle = kI_o = (150 \text{ mA})(1.37 \cdot 10^{-4}) = 20.55 \text{ μA}, \qquad (114)$$

and $$\langle I_T \rangle = \langle I_o \rangle + \langle I_s \rangle + \langle I_D \rangle = 20.55 \text{ μA} + 50 \text{ μA} + 5 \text{ μA} = 75.5 \text{ μA} \qquad (115)$$

In this example, the battery source is assumed to be a primary battery with $C_o$=600 mA·h, then, $$Q_O = C_O[1 - (b+g)] = 600[1 - (0.005 + 0.01)] = \qquad (116)$$
$$= (600)(1 - 0.015) = (600)(0.985) = 591 \text{ mA·h}$$

and, $$(MTBR) = \frac{Q_O}{\langle I_T \rangle} = \frac{591 \text{ mA·h}}{75.5 \text{ μA}} = 7828 \text{ hours} \qquad (117)$$

Now, since: $M_B$=6 g, we obtain $$(SMTBR) = \frac{(MTBR)}{M_B} = \frac{7828}{6} = 1304 \text{ h/g} = 54.2 \text{ days/g} \quad (118)$$

in accordance with Table 5. This value is constant within the range up to 50 g, assuming linearization of Eq. (101), and $<I_D>=5$ µA is constant. Therefore, for $M_B$=27 g, for example, we obtain: (MTBR)=(54.2)(27)=1464 days=48 months=4 years.

In the second example, it is assumed that $<I_s>$=200 µA, $I_o$=1 A. Then, $$<I_o> = kI_o = (1000 \text{ mA})(1.37 \cdot 10^{-4}) = 137 \text{ µA}, \quad (119)$$

and, $$<I_T> = <I_o> + <I_s> + <I_D> = 137 \text{ µA} + 200 \text{ µA} + 5 \text{ µA} = 342 \text{ µA} \quad (120)$$

and, $$(MTBR) = \frac{Q_O}{\langle I_T \rangle} = \frac{591 \text{ mA} \cdot \text{h}}{342 \text{ µA}} = 1728 \text{ h} \quad (121)$$

and, $$(SMTBR) = \frac{(MTBR)}{M_B} = \frac{1728 \text{ h}}{6 \text{ g}} = 12 \text{ days/g} \quad (122)$$

in accordance with Table 5. For $M_B$=27 g, we obtain: (MTBR)=(12) (27)=342 days=10.6 mo, which may be sufficient MTBR for devices such as deployable wireless sensor nodes. For smaller devices with $M_B$=6 g, (MTBR)=2.4 mo., according to Eq. (121). As these results indicate, these values are much lower than those in the first example. This is because the operation current value in the second example is $I_o$=1 A, which is much higher than the 150 mA assumed in the first example.

Figure 39:
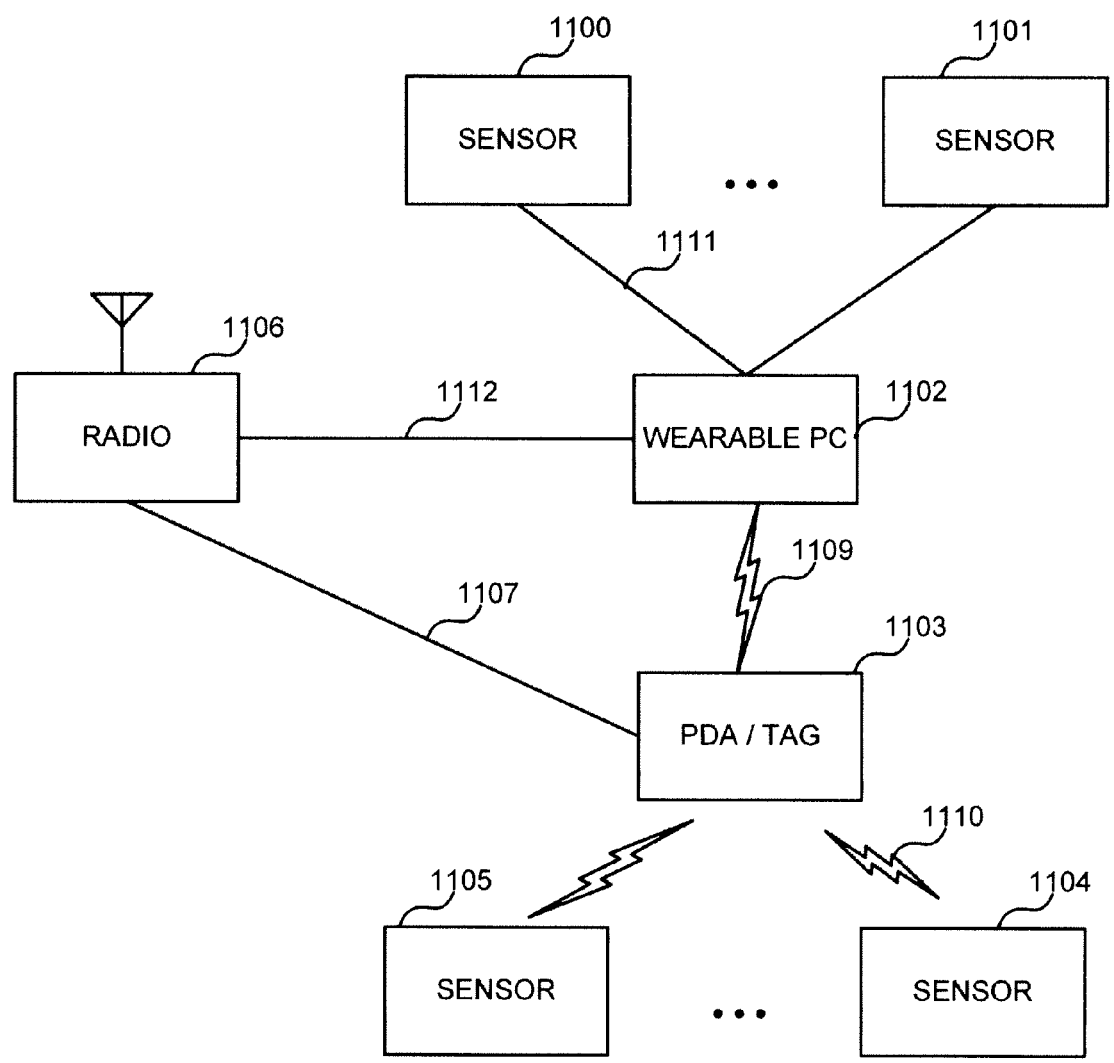
FIG. 39 illustrates a system for health monitoring and health status value transmission according to an embodiment of the invention.

FIG. 39 illustrates a system and method for health monitoring according to an embodiment of the invention. In some embodiments, field personnel may be injured while away from medics or other immediate medical caregivers. When emergency care is a scare resource, advanced triage techniques may be used to prioritize care based on a field operative's health condition. In the illustrated embodiments, a plurality of health monitoring sensors, 1100, 1101, 1105, 1104 are disposed on a field operative's body and configured to monitor various indications of medical status. For example, the health monitoring sensors might comprise heart monitors, blood pressure monitors, oximeters, EMG sensors, capnographer, or other health sensors that provide information relevant to deciding the priority of care an injured victim should receive.

In the illustrated embodiment, a field operative is equipped with a field radio 1106 and a wearable PC 1102 or a health-monitoring PDA or TAG 1103. The wearable PC 1102 may comprise a distributed wearable PC as described herein, or other field usable computer and the PDA 1103 may comprise a PDA or other device equipped with wireless communication and data exchange as described herein. In some embodiments, either the wearable PC 1102 or the PDA 1103 are optional, and the currently described functionality can be performed by only a single device. In the illustrated embodiment, the PDA 1103 wirelessly interfaces 1109 with the wearable PC 1102 and wirelessly interfaces 110 with some or all of the sensors 1104, 1105. The wearable PC 1102 is further configured to interface, through wired or wireless interfaces 111 with the remaining sensors, here 1100 and 1101. The PDA 1103 accumulates a health indication value from each of the sensors and uses this value to form a health status value. In a particular embodiment, each sensor conducts a reading of the wearer's health status and reports a value of −1, 0, or 1, to the PDA 1103, where −1 indicates that the sensor wearer is not likely to survive based on the sensor's reading, 1 indicates that the sensor wearer is likely to survive based on the reading, and 0 indicates that the reading is not conclusive as to the wearer's likelihood of survival. The sensor then conducts a weighted average to determine the health indication value as follows:

$$H \triangleq \frac{\sum_{i=1}^{N} \varepsilon_i w_i}{\sum_{i=1}^{N} w_i}, \quad (123)$$

where $w_i$ is the weight value assigned to sensor i, $\varepsilon_i$ is the health status value of sensor i, and i runs from 1 to the total number of sensors that reported readings N. In various embodiments, the weight value $w_i$ may be determined by the health care provider who is monitoring the field operative, or is otherwise determined based on application and sensors used to provide a priority value for health care based on available resources and health care access. The FDA 1103 is then configured to transmit this health indication value to a health care center or base of operations using field radio 1106. As Eq. (123) demonstrates, transmitting the value H is a significant data reduction compared to transmitting the actual readings of the sensors, and is also a reduction over transmitting the unweighted plurality of sensor health status values. In a further embodiment, this data reduction can be further improved by thresholding H at the PDA 1103 and simply transmitting the result of the thresholding step. For example, in a particular embodiment, if H<0, then the PDA 1103 transmits a signal indicating that the field operative is not likely to survive, and if H>0, then the PDA 1103 transmits a signal indicating that the field operative may survive and should be provided with emergency care.

In some embodiments, the field radio 1106 may be configured to receive a request for a health indication value from an offsite location. Radio 1106 can use link 1107, for example, a rs232, USB, or wireless link, to relay this request to PDA 1103. In further embodiments, PDA 1103 can transmit the health indication value on a regular or otherwise scheduled basis, or can transmit the health indication value when it falls below a predetermined threshold. In other embodiments, a personal information tag as described herein may be equipped with the ability to perform the above calculations and communications, and may be used instead of a PDA. In still further embodiments, PDA 1103 may be configured to transmit sensor records to a personal information tag situated on the field operative, thereby providing a health record for use by emergency health care workers when they arrive at the operative's location. In some embodiments, the formation of the calculation of and reporting of the health indication value H may be performed in a transparent manner to the field operative, such that the operative is not provided access to this information. This may be used to avoid creating stress based on a low H value.

Figure 40:
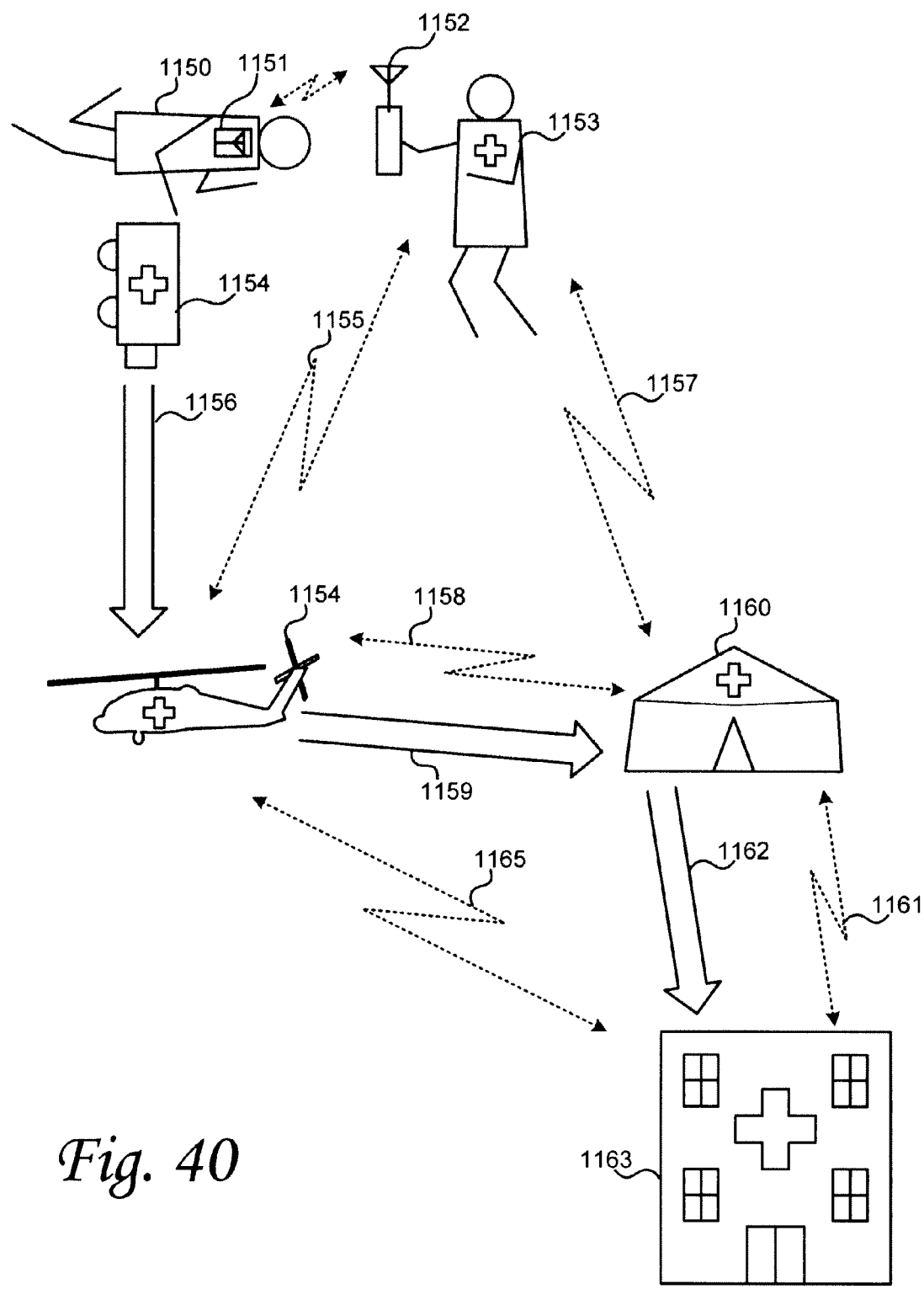
FIG. 40 health information transmission according to an embodiment of the invention.

FIG. 40 illustrates a method of continuous emergency health care information management according to an embodiment of the invention. In the illustrated embodiment, a field operative 1150 has been injured and required emergency care. The field operative 1150 is wearing a health information storage device 1151, such a personal information tag or health monitoring PDA as described herein. An emergency health care worker 1153 can use an interface device 152, such as a PDA configured to operate as a gateway 850 as described with respect to FIG. 26, or other interface device to retrieve health information from storage device 1151. In some embodiments, the health information can comprise medical histories, medical records, identification information, and other information pertinent to emergency treatment. In further embodiments, the field operative 1150 may be equipped with a plurality of health monitoring sensors, as described with respect to FIG. 39, and the storage device 1151 can store information retrieved from those sensors, or can act as a relay device to give worker 1153 access to the sensors.

In the illustrated embodiment, while the field operative 1150 is being physically transported 1156 to a ambulatory vehicle 1154, device 1152 can be used to wireless transmit 1155 the information retrieved from device 1151 along with any other information health care worker 1153 wishes to send. Accordingly, personnel in the vehicle 1154 can prepare necessary treatments to receive the operative 1150. Additionally, the retrieved information can be wirelessly transmitted to a field hospital 1157, hospital 1163, or other health care facility.

In some embodiments, as the operative 1150 is transported to field hospital 1160, device 1151 can continue to collect health care data. For example, health care personnel in vehicle 1164 or 1154 can modify or add data to device 1151 that describes updated status for the operative 1150. For example, device 1151 can be configured to store and wirelessly report a triage priority status value, this value can be retrieved and updated at each physical transport stage, 1164 and 1154, and at hospitals 1160 and 1163. This can allow personnel at the various stages to effectively screen and prioritize treatments. Similarly to the advance information transmitted 1155 and 1157 by the initial field worker 1153, updated information or status information may be transmitted to the next stage in treatment. For example, ambulatory vehicle 1154 can transmit an updated health information 1158 to a field hospital 1160 before it physically transports 1159 the operative 1150 to the field hospital 1160. Likewise, the vehicle 1154 may transmit the updated information 1165 to hospital 1163, thereby allowing preparation at both locations. Similarly, updated information from field hospital 1160 may be transmitted 1161 to hospital 1163 before or while the operative 1150 is physically transported 1162 to hospital 1163.

Figure 41:
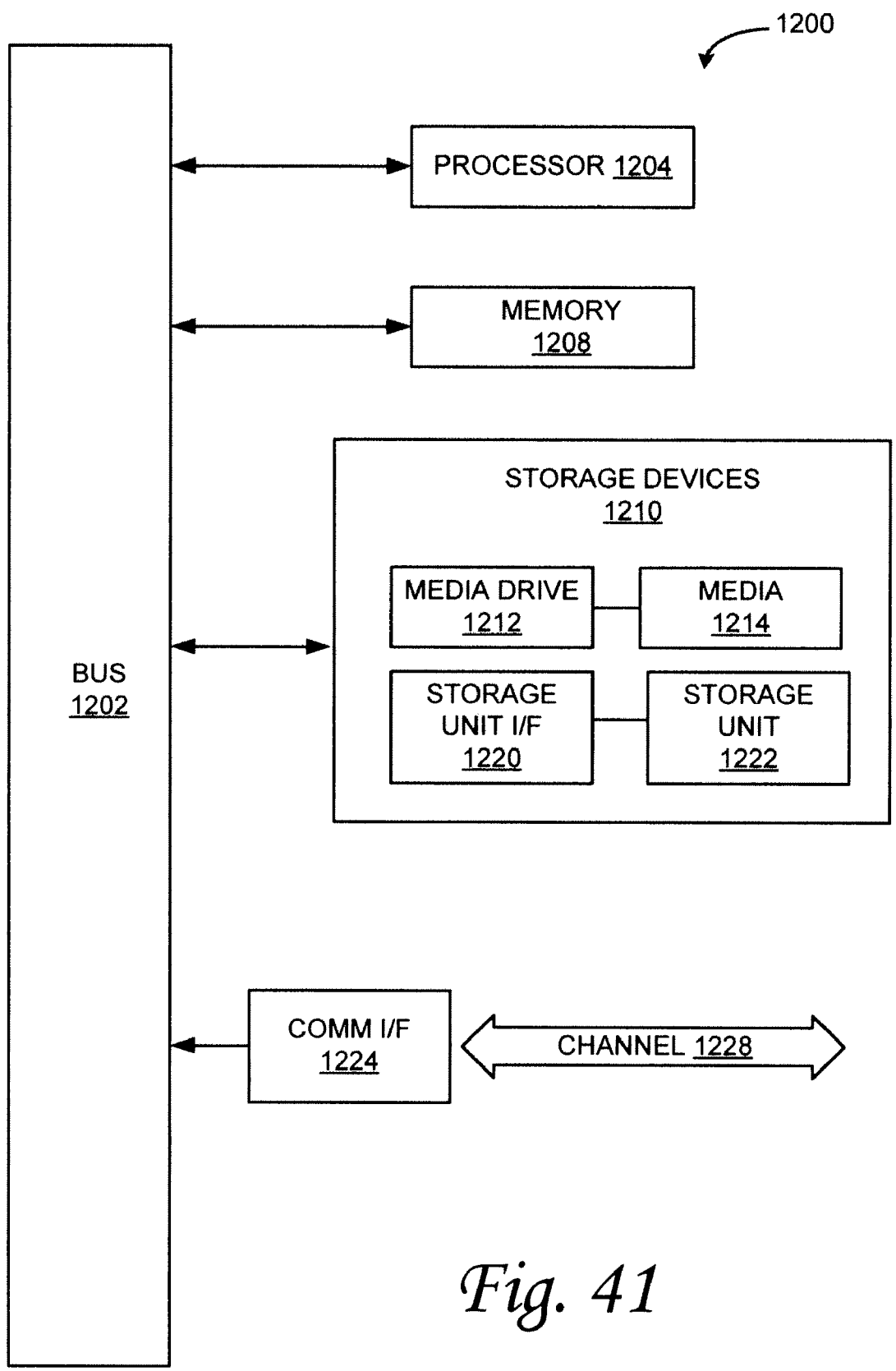
FIG. 41 illustrates an example computing module that may be used in implementing various features of embodiments of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example computing module is shown in FIG. 41. Various embodiments are described in terms of this example-computing module 1200. After reading this description, it will become apparent to a person skilled in the relevant art how to implement the invention using other computing modules or architectures.

Referring now to FIG. 41, computing module 1200 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 1200 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 1200 might include, for example, one or more processors, controllers, control modules, or other processing devices, such as a processor 1204. Processor 1204 might be implemented using a general-purpose or special-purpose processing engine such as, for example, a microprocessor, controller, or other control logic. In the illustrated example, processor 1204 is connected to a bus 1202, although any communication medium can be used to facilitate interaction with other components of computing module 1200 or to communicate externally.

Computing module 1200 might also include one or more memory modules, simply referred to herein as main memory 1208. For example, preferably random access memory (RAM) or other dynamic memory, might be used for storing information and instructions to be executed by processor 1204. Main memory 1208 might also be used for storing temporary variables or other intermediate information during execution of instructions to be executed by processor 1204. Computing module 1200 might likewise include a read only memory ("ROM") or other static storage device coupled to bus 1202 for storing static information and instructions for processor 1204.

The computing module 1200 might also include one or more various forms of information storage mechanism 1210, which might include, for example, a media drive 1212 and a storage unit interface 1220. The media drive 1212 might include a drive or other mechanism to support fixed or removable storage media 1214. For example, a hard disk drive, a floppy disk drive, a magnetic tape drive, an optical disk drive, a CD or DVD drive (R or RW), or other removable or fixed media drive might be provided. Accordingly, storage media 1214 might include, for example, a hard disk, a floppy disk, magnetic tape, cartridge, optical disk, a CD or DVD, or other fixed or removable medium that is read by, written to or accessed by media drive 1212. As these examples illustrate, the storage media 1214 can include a computer usable storage medium having stored therein computer software or data.

In alternative embodiments, information storage mechanism 1210 might include other similar instrumentalities for allowing computer programs or other instructions or data to be loaded into computing module 1200. Such instrumentalities might include, for example, a fixed or removable storage unit 1222 and an interface 1220. Examples of such storage units 1222 and interfaces 1220 can include a program cartridge and cartridge interface, a removable memory (for example, a flash memory or other removable memory module) and memory slot, a PCMCIA slot and card, and other fixed or removable storage units 1222 and interfaces 1220 that allow software and data to be transferred from the storage unit 1222 to computing module 1200.

Computing module 1200 might also include a communications interface 1224. Communications interface 1224 might be used to allow software and data to be transferred between computing module 1200 and external devices. Examples of communications interface 1224 might include a modem or so modem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 1224 might typically be carried on signals, which can be electronic, electromagnetic (which includes optical) or other signals capable of being exchanged by a given communications interface 1224. These signals might be provided to communications interface 1224 via a channel 1228. This channel 1228 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1208, storage unit 1220, media 1214, and channel 1228. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1200 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method of monitoring battery capacity, comprising:
   determining a starting capacity of a battery;
   determining an activity coefficient for a device connected to the battery;
   determining a voltage and current profile for the battery using the starting capacity;
   determining a voltage and current operating point for the device using the activity value for the device; and
   determining an updated capacity of the battery using the voltage and current profile for the battery and the voltage and current operating point for the device.

2. The method of claim 1, where the steps of determining the starting capacity of the battery, determining the activity coefficient, determining the voltage and current profile, and determining the updated capacity of the battery are repeated for a plurality of operating periods, and wherein the updated capacity determined during a given operating period is the starting capacity for a next operating period after the given operating period.

3. The method of claim 2, wherein the starting capacity for a first operating period of the plurality of operating periods is an initial capacity of the battery determined after an initial battery self-discharge period.

4. The method of claim 2, wherein the step of determining the updated capacity of the battery further comprises subtracting a battery self-discharge value during a current operating period.

5. The method of claim 2, wherein the device connected to the battery is one of a plurality of devices connected to the battery, and the step of determining the activity value for the device comprises determining a set of activity coefficients for the plurality of the devices.

6. The method of claim 5, wherein the updated capacity for a given operating period of the plurality of operating periods has the following form:

$$C_i = C_{i-1} - C_{i-1} a_{i-1} \Delta t - \sum_{j=1}^{N} \varepsilon_{i-1}^j I_{i-1}^j \Delta t,$$

where i indexes the given operating period and where, during the given operating period i, $C_i$ is the updated capacity, $C_{i-1}$ is the starting capacity, $a_{i-1}$ is the battery self-discharge rate, $\Delta t$ is the duration of the operating period, j indexes the plurality of devices, $\varepsilon_{i-1}^j$ is the activity coefficient of the j-th device, $I_{i-1}^j$ is the operating current of the j-th device, and N is the number of devices of the plurality of devices.

7. The method of claim 6, wherein the battery self-discharge rate reflects battery drain caused by the battery charging a capacitor during an operating period, or wherein a device of the N devices comprises a capacitor.

8. The method of claim 2, wherein an operating period of the plurality of operating periods has a duration determined according to a predetermined mean time between replacement of the battery.

9. The method of claim 2, further comprising reporting an alarm if the starting capacity is below a predetermined threshold for a given operating period.

10. The method of claim 2, further comprising reporting a first alarm if the starting capacity is below a first predetermined threshold for a given operating period and reporting a second alarm if the starting capacity is below a second predetermined threshold for a given operating period.

11. The method of claim 1, further comprising:
    receiving a battery operating temperature from temperature sensor disposed on the battery;
    determining a battery self-discharge rate using the battery operating temperature; and
    wherein the step of determining an updated capacity further comprises using the battery self-discharge rate.

12. A method for evaluating battery characteristics for a battery to power a system, comprising:
    determining a predetermined mean operating time for the system;
    determining a duration of an operating period of the system using the predetermined mean operating time;
    determining an activity coefficient for a device to be connected to the battery;
    determining an active current value for the device;
    determining an average active current value for the device using the activity coefficient and the active current value;
    determining an average self discharge rate for the battery;
    determining an average inactive current value for the system using the average sell discharge rate;
    determining an initial capacity for the battery;
    determining a mass of the battery; and
    determining a specific mean operating time for the system using the average active current value, the average inactive current value, the initial capacity, and the mass.

13. The method of claim 12, wherein the device is one of a plurality of devices and the system comprises the plurality of devices.

14. The method of claim 13, wherein a first device of the plurality of devices is a component of a second device of the plurality of components.

15. The method of claim 13, wherein the specific mean operating time for the system is $$\frac{q}{\langle I_D \rangle + \sum_{i=1}^{M} k^{(i)} I^{(i)}},$$

where q is the latent charge density of the battery, $\langle I_D \rangle$ is the average inactive current value for the system, i indexes the plurality of devices, $k^{(i)}$ is the activity coefficient of the i-th device, $I^{(i)}$ is the active current value of the i-th device, and M is number of devices in the plurality of devices.

* * * * *

UNITED STATES PATENT AND TRADEMARK OFFICE
CERTIFICATE OF CORRECTION

PATENT NO. : 8,400,162 B1
APPLICATION NO. : 12/757883
DATED : March 19, 2013
INVENTOR(S) : Tomasz Jannson et al.

Page 1 of 1

It is certified that error appears in the above-identified patent and that said Letters Patent is hereby corrected as shown below:

In the Claims:

Claim 12, Column 50, line 30, the word "sell" should read --self--

Signed and Sealed this
Fourteenth Day of May, 2013

Teresa Stanek Rea
*Acting Director of the United States Patent and Trademark Office*